(12) United States Patent
Hozoji et al.

(10) Patent No.: US 7,002,250 B2
(45) Date of Patent: Feb. 21, 2006

(54) SEMICONDUCTOR MODULE

(75) Inventors: Hiroshi Hozoji, Yokohama (JP);
Yoshihide Yamaguchi, Fujisawa (JP);
Naoya Kanda, Fujisawa (JP);
Shigeharu Tunoda, Fujisawa (JP);
Hiroyuki Tenmei, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/930,133

(22) Filed: Aug. 16, 2001

(65) Prior Publication Data

US 2002/0079575 A1 Jun. 27, 2002

(30) Foreign Application Priority Data

Dec. 25, 2000 (JP) .................................. 2000-396904
May 10, 2001 (JP) .................................. 2001-140120

(51) Int. Cl.
*H01L 23/04* (2006.01)

(52) U.S. Cl. .................... 257/730; 257/738; 257/780

(58) Field of Classification Search ............ 257/730, 257/678, 700, 701, 723, 724, 734, 737, 738, 257/758, 759, 778, 779, 780, 787; 228/180.22; 360/748, 749, 761, 773, 774, 783, 795; 438/106, 438/108, 125, 126, 127, 613, 622
See application file for complete search history.

(56) References Cited

U.S. PATENT DOCUMENTS 5,650,918 A  *  7/1997  Suzuki .................... 361/760
5,710,695 A  *  1/1998  Manteghi ................. 361/813
5,986,334 A  * 11/1999  Lee ........................ 257/667
6,054,171 A  *  4/2000  Shoji ...................... 427/96
6,239,497 B1 *  5/2001  Maruhashi ............... 257/778
6,242,932 B1 *  6/2001  Hembree ................. 324/755
6,320,753 B1 * 11/2001  Launay ................... 361/760
6,324,067 B1 * 11/2001  Nishiyama .............. 361/761
6,436,733 B1 *  8/2002  Yukawa ................... 438/18
2003/0127737 A1 *  7/2003  Takahashi ............... 257/738

FOREIGN PATENT DOCUMENTS

JP    2000-31207    *  1/2000
JP    2001-339097   * 12/2001
KR    1998-025624       7/1998

* cited by examiner

*Primary Examiner*—Alonzo Chambliss
*Assistant Examiner*—M. Brunson
(74) *Attorney, Agent, or Firm*—Antonelli, Terry, Stout & Kraus, LLP

(57) ABSTRACT

A semiconductor module, comprising a wiring substrate on which wiring is formed, a semiconductor device electrically connected to the wiring formed on the wiring substrate, and an external connection terminal arranged on the semiconductor device mounted side of the wiring substrate so as to be a connected portion between the wiring and the outside electrically connected thereto, wherein there is formed an insulating resin layer thicker than the semiconductor device between the wiring substrate and the external connection terminal.

28 Claims, 34 Drawing Sheets

A MAGNIFIED VIEW OF
A-A CROSS SECTION

FIG.40A
THE STRESS COMPLIANT LAYER FORMED SILICON SUBSTRATE
FIG.40B
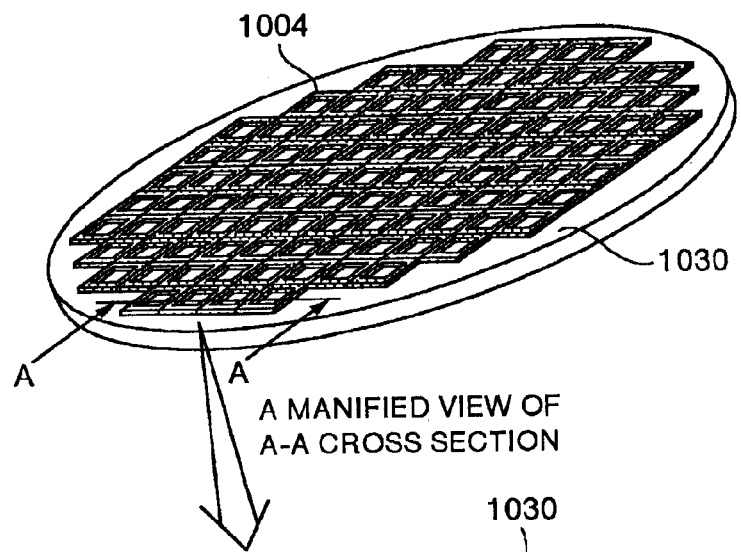
A MANIFIED VIEW OF A-A CROSS SECTION
FIG.40C
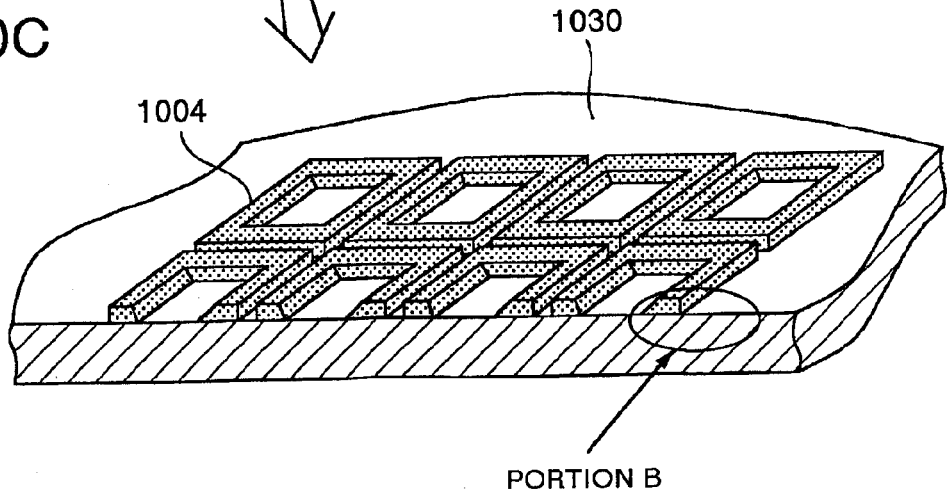
PORTION B FIG.42A
- FORMING METAL LAYER C
- FORMING METAL LAYER D
- REMOVED RESIST
- ETCHED METAL LAYER A,B
FIG.42B
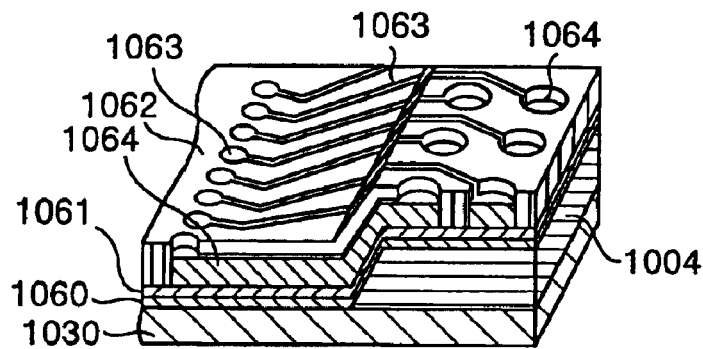
FIG.42C
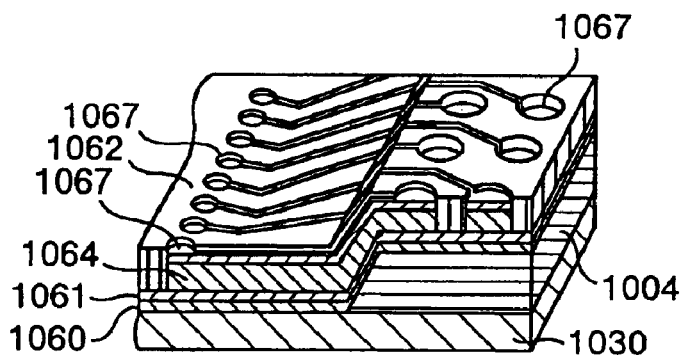
FIG.42D
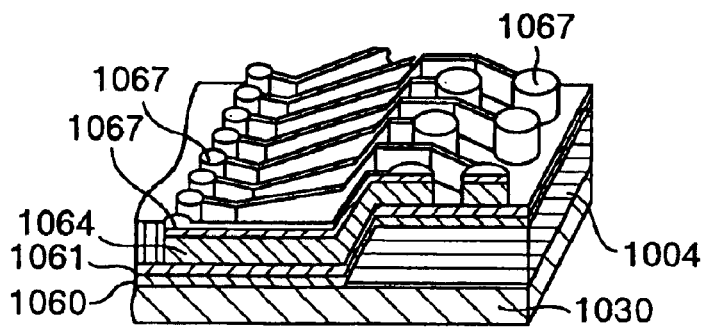
FIG.42E
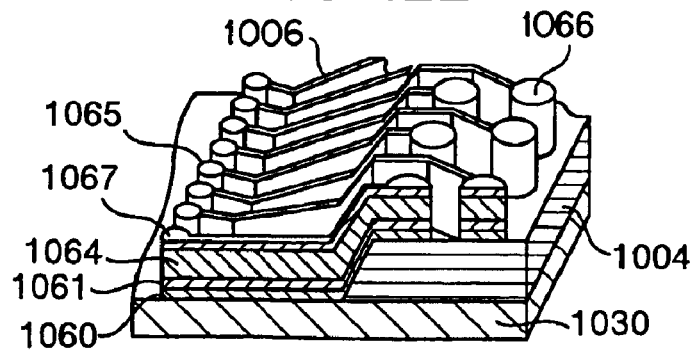

CROSS SECTIONAL VIEW TAKEN ON LINE A-A

SEMICONDUCTOR MODULE

BACKGROUND OF THE INVENTION

The present invention relates to a structure of a semiconductor module mounted with one or more semiconductor devices and its manufacturing method.

As a semiconductor module mounted with semiconductor devices on a high-density substrate or the like, there is, for example, a chip-on-chip module as disclosed in Japanese Unexamined Patent Publication (Kokai) No. 12-156461. It has, as shown in FIG. 2, a structure in which a second chip is connected to a first chip and an external connection terminal is formed on a surface to which the second chip is connected. For example, assuming that the first chip is a logical chip and the second chip is a memory chip, these chips constitute a semiconductor module capable of realizing a desired function. As a method of connecting the external connection terminal, there are suggested methods of connection by means of solder columns, solder balls each having a large diameter, and solder balls through an appropriate intermediate substrate. Besides, there are exemplified a polymer metal compound connection, a copper plating column, and a micro-Velcro connection.

SUMMARY OF THE INVENTION

While the above structure is an effective module structure capable of electrically connecting a semiconductor device to an external connection terminal without forming any through-hole on a substrate on which the semiconductor device is mounted, an identical surface of the substrate is used for a semiconductor device mounted surface and an external connection terminal mounted surface to realize the structure, thereby causing a serious problem of how to form the external connection terminal with sufficient height to meet the condition of the mounting height of the semiconductor device.

While there are disclosed the methods for a connection by means of the solder columns, the solder balls each having a large diameter, and the solder balls through an appropriate intermediate substrate as set forth in the above in the prior art, there are such problems that the method is unsuitable for high-density mounting or that a production efficiency is decreased in all of the methods. For example, when using the solder columns, the plating or exposing technology is supposed as a method of forming the columns, but it takes a long time to form something high in the plating technology and the exposing technology is unsuitable for forming something having a high aspect ratio.

In addition, when using a silicon, ceramic, glass, or other member having a small thermal expansion coefficient for a substrate of the semiconductor module and mounting the semiconductor module on an organic resin substrate having a high thermal expansion coefficient, a stress is focused on a connected portion due to a difference of thermal expansion between them, thereby reducing a connection life of the connected portion. Therefore, it is required to consider stress relaxation at mounting as well as securing a height of the external connection terminal.

It is an object of the present invention to provide a semiconductor module having a high production efficiency superior in a reliability of a connection to an external substrate. In this specification, a substrate used for a semiconductor module is referred to as a module substrate and a substrate on which the semiconductor module is mounted is referred to as an external module.

We are doing research and development about this kind of module in which semiconductor chips or semiconductor devices are mounted on a silicon, ceramic, glass, or other module substrate and external connection terminals are formed on its mounting surface side. While there is a problem of how to form the external connection terminals as set forth in the above, it is a serious problem in improving a productivity to secure the connection reliability without any use of an underfill in order to realize this structure.

Therefore, it is a second object of the present invention to provide a semiconductor module having an improved connection reliability when a semiconductor device is mounted without any use of an underfill. On the other hand, while a use of the underfill is still effective to improve the connection reliability, a pressure needs to be applied to the semiconductor device at the mounting to secure a connection between electrodes in the method of mounting and connecting the semiconductor device after coating of the resin to be the underfill. If the module substrate is formed by a glass or silicon material and it is pressed at a time in a multicavity condition (wafer condition), the module substrate (glass or silicon) is required to have an even greater strength, thereby increasing e cost. In addition, it is required to wait for a time period until the underfill is hardened to some extent while applying a pressure, which is not preferable in an aspect of a manufacturing tact. Therefore, it is preferable to use a method of filling the underfill into a gap between the semiconductor device and the module substrate after mounting the semiconductor device on the module substrate instead of effecting the coating of the underfill beforehand, while there is a serious problem of how to fill the underfill in the multicavity condition (wafer condition). In addition, if a narrower pitch is applied to the electrodes of the semiconductor device to be mounted, the filling itself of the underfill is hard to be performed.

Therefore, it is a third object of the present invention to provide a semiconductor module for which the filling of the underfill is considered.

In addition, the semiconductor device is mounted on the module substrate and the external connection terminal is formed on the mounting surface side in this structure, and therefore it is important to structurally consider heat dissipation from the semiconductor device.

Therefore, it is a fourth object of the present invention to provide a semiconductor module for which heat dissipation is considered.

In accordance with a first aspect of the present invention, there is provided a semiconductor module, comprising a wiring substrate on which wiring is formed, a semiconductor device electrically connected to the wiring formed on the wiring substrate, and an external connection terminal arranged on the semiconductor device mounted side of the wiring substrate so as to be a connected portion between the wiring and the-outside electrically connected thereto, wherein there is formed an insulating resin layer thicker than the semiconductor device between the wiring substrate and the external connection terminal.

The arrangement may be such that the semiconductor module comprises a wiring substrate on which wiring is formed, a semiconductor device electrically connected to the wiring formed on the wiring substrate, and an insulating resin layer formed on the semiconductor device mounted side of the wiring substrate and having an inclined portion at a given inclination to the mounting surface and a flat portion which is almost flat and provided for an arrangement of the external connection terminal to be an externally connected portion, wherein a part of the wiring is formed on the inclined portion of the insulating resin layer for an electrical connection between the wiring and the external connection terminal.

With these features, the insulating resin layer is formed by mask printing.

The arrangement may be such that the semiconductor module comprises a wiring substrate on which wiring is formed, a semiconductor device electrically connected to the wiring formed on the wiring substrate, an insulating resin layer formed by mask printing on the semiconductor device mounted side of the wiring substrate, and an external connection terminal to be a connected portion between the wiring and the outside electrically connected thereto on the insulating resin layer.

Preferably, the insulating resin layer has a shape of almost enclosing the semiconductor device.

The insulating resin layer may have a frame shape.

The semiconductor module may be such that an inclination of an inner circumferential side is gentler than that of an outer circumferential side of the insulating resin layer.

Preferably, a plurality of insulating resin layers are used as the above insulating resin layer and arranged as if they enclose the semiconductor device.

The wiring substrate may be a silicon substrate or a glass substrate.

The insulating resin layer may be made of an insulating material having an elastic modulus of approx. 0.1 Gpa to approx. 10 Gpa.

A film thickness of the insulating resin layer may be approx. 10 $\mu$m to approx. 350 $\mu$m.

The semiconductor device may be one of a semiconductor chip, a chip scale package (CSP), a ball grid array (BGA), and an wafer-level CSP.

Preferably, a sum of a thickness of the insulating resin layer and a height of the external connection terminal is greater than a distance from the mounted surface of said semiconductor device to a rear surface thereof.

Preferably, a sum of a thickness of the insulating resin layer and a height of the external connection terminal is almost equal to a distance from the mounted surface of the semiconductor device to the rear surface thereof.

The arrangement may be such that the semiconductor module comprises a wiring substrate on which wiring is formed, a semiconductor device electrically connected to the wiring formed on the wiring substrate, an insulating material covering the semiconductor device, and an external connection electrode to be a connected portion between the wiring formed on the insulating material and the outside.

An intermediate plate may be arranged in the insulating material between the semiconductor device and the external connection terminal.

In accordance with a second aspect of the present invention, there is provided a semiconductor module, comprising a wiring substrate on which wiring is formed, a semiconductor device electrically connected to the wiring formed on the wiring substrate through bumps, and an external connection terminal to be a connected portion between the wiring and the outside electrically connected thereto, the semiconductor device being mounted on the wiring substrate without using an underfill, wherein the semiconductor device comprises a semiconductor chip and the wiring substrate comprises a silicon substrate.

The arrangement may be such that the semiconductor module comprises a wiring substrate on which wiring is formed, a semiconductor device electrically connected to the wiring formed on the wiring substrate through bumps, and an external connection terminal to be a connected portion between the wiring and the outside electrically connected thereto, the semiconductor device being mounted on the wiring substrate without using an underfill, wherein an insulating resin layer is formed between the semiconductor chip of the semiconductor device and the bumps.

The arrangement may be such that the semiconductor module comprises a wiring substrate on which wiring is formed, a semiconductor device electrically connected to the wiring formed on the wiring substrate through bumps, and an external connection terminal to be a connected portion between the wiring and the outside electrically connected thereto, the semiconductor device being mounted on the wiring substrate without using an underfill, wherein an insulating resin layer is formed between the wiring connected to the bumps of the semiconductor device and the wiring substrate.

The insulating resin layer may be made of an insulating material having an elastic modulus of approx. 0.1 Gpa to approx. 10 Gpa.

A film thickness of the insulating resin layer may be approx. 10 $\mu$m to approx. 350 $\mu$m.

Preferably, the insulating resin layer is formed by mask printing.

The external connection terminal may be formed on a second insulating resin layer, which is formed on the semiconductor device mounted side of said wiring substrate, having an inclined portion at a given inclination to the mounting surface and an almost plane flat portion on which the external connection terminal is arranged.

Furthermore, according to a third aspect of the present invention, there is provided a structure, comprising a wiring substrate on which wiring is formed, a semiconductor device electrically connected to the wiring formed on the wiring substrate through bumps, and encapsulant for filling a gap between the wiring substrate and the semiconductor device, wherein the encapsulant comprises a material not including a filler.

According to a fourth aspect of the present invention, there is provided a structure, wherein a heat conductive material layer is formed on an external substrate on which the semiconductor module is mounted and a semiconductor device of the semiconductor module is connected to the heat conductive material layer.

Preferably, the structure comprises a metal member connecting the semiconductor device to the circuit board.

The arrangement may be such that the semiconductor device is connected to the wiring substrate by die-attaching and the semiconductor device is electrically connected to the wiring formed on the wiring substrate by wire bonding.

In the semiconductor device in which a stress compliant layer made of a low elastic modulus resin is formed in a peripheral portion of the wiring substrate on which a semiconductor element is mounted and there is arranged an external connection terminal connected to the electrical wiring from the semiconductor element on the stress compliant layer, the low elastic modulus resin layer may be arranged in an area in which there is mounted at least the semiconductor element on the wiring substrate and there is arranged a connection terminal to the semiconductor element on the low elastic modulus resin layer.

The arrangement may be such that there are formed a plurality of stress compliant layers made of low elastic modulus resins in a peripheral portion of the wiring substrate on which a semiconductor element is mounted and that there is arranged an external connection terminal connected to the electrical wiring from the semiconductor element on the stress compliant layers.

Furthermore, a low elastic modulus resin layer may be arranged in an area in which there is mounted at least the semiconductor element on the wiring substrate and a connection terminal to the semiconductor element is arranged on the low elastic modulus resin layer.

A thickness of the stress compliant layer may be 0.1 mm to 0.8 mm.

The present invention provides, according to another aspect thereof, a method of manufacturing a semiconductor device or a semiconductor module which comprises forming a stress compliant layer made of a low elastic modulus resin in a peripheral portion of the wiring substrate on which a semiconductor element is mounted and manufacturing a semiconductor device or a semiconductor module having an external connection terminal connected to electrical wiring from the semiconductor element on the stress compliant layer, wherein one or more stress compliant layers are formed at a time.

The method of manufacturing a semiconductor device or a semiconductor module may comprise forming the stress compliant layer made of the low elastic modulus resin in the peripheral portion of the wiring substrate on which the semiconductor element is mounted and manufacturing the semiconductor device having the external connection terminal connected to the electrical wiring from the semiconductor element on the stress compliant layer, wherein the stress compliant layer is formed using a mold and pasted on a substrate.

Furthermore, the mold may have a cavity for forming the stress compliant layer, by which the low elastic modulus resin is filled into the cavity and then the substrate is placed on the mold to be pressed and heated, thereby hardening the low elastic modulus resin in the cavity and pasting it on the substrate.

In the method of manufacturing a semiconductor device or a semiconductor module, the mold may have a cavity for forming the stress compliant layer and the cavity forms a depressed resin layer forming portion in a region enclosed by the cavity, by which the low elastic modulus resin is filled into the cavity and the resin layer forming portion and then the substrate is placed on the mold to be pressed and heated, thereby hardening the low elastic modulus resin in the cavity and the resin layer forming portion and pasting it on the substrate.

Furthermore, in the method of manufacturing a semiconductor device or a semiconductor module, a plurality of cavities are arranged in closed paths.

The semiconductor module may comprises a substrate, a first insulating layer formed in a first area of the substrate, a semiconductor chip mounted in a second area of the substrate, an external connection terminal formed on the first insulating layer, and a wire for electrically connecting electrodes of the semiconductor chip to the external connection terminal, wherein the first insulating layer relaxes a stress generated between the semiconductor module and another substrate on which the semiconductor module is mounted and the layer is formed by using a mold.

The semiconductor module in the above further comprises a second insulating layer for relaxing a stress between the substrate and the semiconductor chip or between the semiconductor chip and the substrate.

In the above semiconductor module, the first insulating layer may have a thickness of 0.1 mm to 0.8 mm.

In the above semiconductor module, the first insulating layer may be formed in a circumferential portion of the substrate and further have a gap portion.

BRIEF DESCRIPTION OF THE DRAWINGS

FIGS. 40A, 40B, 40C are perspective views showing a silicon wiring substrate with a stress compliant layer according to the first embodiment;

FIGS. 42A, 42B, 42C, 42D, 42E are process drawings showing a second process following the first process shown in FIG. 41;

DETAILED DESCRIPTION OF THE PREFERRED EMBODIMENTS

Figure 1:
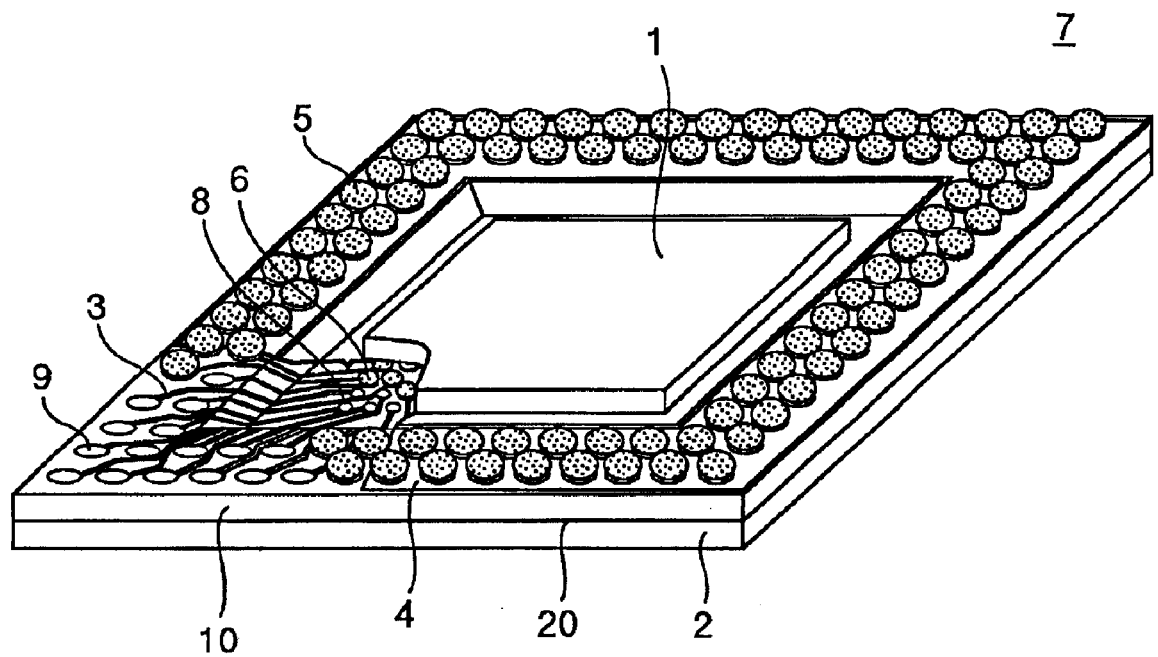
FIG. 1 is a diagram showing an example of a semiconductor module of the present invention.
Figure 2:
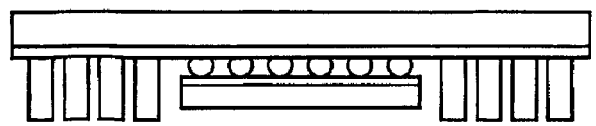
FIG. 2 is a diagram showing a conventional example.

Preferred embodiments of the present invention will now be described in detail hereinafter with reference to the accompanying drawings. The identical reference numerals designate the identical elements in all diagrams for describing the present invention and therefore some overlapped descriptions are omitted. For further simplification of the description, a part of a structure may be omitted or dimensional ratios of respective portions may be different from actual ones.

Referring to FIG. 1, there is shown a partially sectional view of assistance in explaining a structure of a semiconductor module 7 according to the present invention. If a module substrate used for this semiconductor module is made of silicon, it can be manufactured in a wafer configuration like one used for a normal manufacturing process of a semiconductor device. If a glass or ceramic material is used, the module substrate can be manufactured in the same wafer configuration as silicon and it is also possible to manufacture the substrate in a rectangular thin plate.

In this diagram, the semiconductor device 1 is a semiconductor chip passed through a semiconductor circuit forming process referred to as pre-process in the semiconductor manufacturing process or a semiconductor connected through bumps such as BGA, CSP, or wafer-level CSP, and the semiconductor device 1 is connected to electrodes arranged on a module substrate 2 on which the semiconductor device is mounted through bumps 6. In an area where the semiconductor device 1 is not mounted on the semiconductor device mounting surface of the module substrate 2, there is formed a frame-shaped stress compliant layer made of a low elastic modulus material (hereinafter, sometimes referred to as low elastic modulus layer) 10 through a protective film 20 and there are formed wires 3 on the stress compliant layer 10 and leading to the electrodes 8 electrically connected to the semiconductor device 1. The wires 3 formed on this stress compliant layer 10 further lead to electrodes 9 connected to an external connection terminal 5 for a connection with an external substrate. The wires 3 are coated by an insulating layer 4 except portions of the electrodes 8 for the connection with the semiconductor device 1 and the electrodes 8 for the connection with the external connection terminal 5.

For the bumps 6, it is possible to use projecting bumps made from gold or other wires and formed by an ultrasonic bonding apparatus or bumps made of a single metal or an alloy of mixed two or more metals selected out of tin, lead, copper, silver, bismuth, zinc, indium, or other metals. Furthermore, a resin including a silver, gold, or other conductive material can be used for bumps 6. In addition, these solder bumps 6 can be formed by mixing the solder fine particles into a material made of rosin or the like, making a print on electrodes of the semiconductor device by using an appropriate mask, and then heating the solder to a fusion temperature or higher to fuse the solder. When using a resin into which the conductive particles are mixed, the bumps can be formed in the same manner as for the above by using the paste resin material for printing on the electrodes of the semiconductor device using an appropriate mask and hardening or partial hardening by heating. Furthermore, it is also possible to form the bumps by coating the electrodes with flux having appropriate adherence after removing the oxide film on the surfaces of the electrodes, aligning solder balls having an appropriate particle diameter on the electrodes by using a mask or the like, and heating the solder up to the fusion temperature or higher by using a reflow furnace or the like. Naturally, they are applicable to a formation of the external connection terminal 5.

The electrodes (not shown) arranged in the semiconductor device 1 connected to the bumps 6 can be aluminum or copper electrodes formed in a process referred to as pre-process or electrodes formed after rewiring with copper or other wires on the surfaces of the semiconductor device from electrodes such as wafer-level CSP after the pre-process. Surface treatment on the surfaces of the electrodes with nickel, gold, etc. improves of a wetting property of the surfaces of the bumps and electrodes and prevents a strength of the joint portions between the bumps and the electrode portions from being lowered by a diffusion of the bump material in the electrodes in a heating process when the semiconductor module is mounted on an external substrate described later.

The external connection terminal 5 may comprise a resin into which conductive particles are mixed besides the solder balls in the same manner as for the bumps 6. According to a method of a connection with the external substrate, the balls or terminal formation can be omitted.

For the semiconductor device 1, a lead-type semiconductor device such as QFP or TSOP can also be used in addition to a semiconductor chip, BGA, CSP, and wafer-level CSP.

Subsequently, the stress compliant layer 10 in this arrangement is described below. As for the stress compliant layer 10, as a result of various experiments and investigations, it is preferable to form external connection terminals (for example, solder balls) through a material layer having low elasticity, thereby enabling the securing of both a given height and stress relaxation. Material having the low elasticity means material having an elastic modulus within a range of 0.1 GPa to 10 GPa at a room temperature. A stress compliant layer having an elastic modulus within the range can provide a reliable semiconductor module. If the stress compliant layer has an elastic modulus lower than 0.1 GPa, it becomes hard to support a weight of the semiconductor module itself, thereby easily causing a problem that the characteristics are not stable when it is used as a semiconductor module. If the stress compliant layer has an elastic modulus higher than 10 GPa, the module substrate 2 is warped due to an internal stress of the stress compliant layer 10, thereby easily causing out-of-focusing in an exposure process or defective handling in a wiring forming process and further even a risk of an occurrence of such a defect that the module substrate 2 is cracked.

Figure 3:
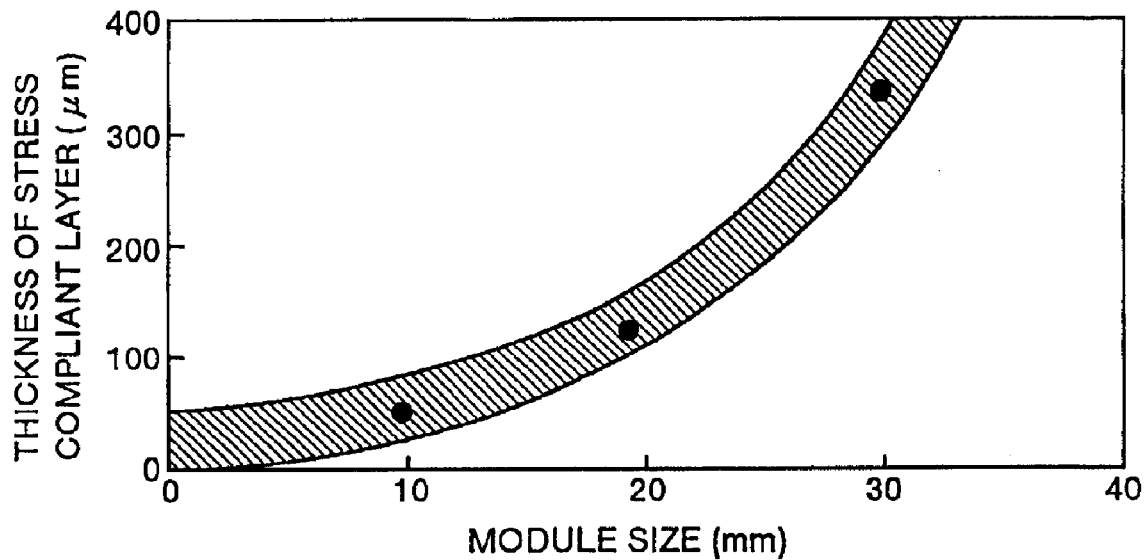
FIG. 3 is a diagram showing a relationship between a stress compliant layer and a module size of the present invention.

Referring to FIG. 3, there is shown a relationship between external dimensions of the semiconductor module and a thickness of a stress compliant layer required for securing a lifelong connected portion when the semiconductor module is mounted on a resin substrate. If the elastic modulus of the stress compliant layer is low in spite of the same size of the semiconductor modules, the connection life can be secured by decreasing the thickness of the stress compliant layer and therefore an allowable range of the stress compliant layer is shown in the graph taking into consideration the elastic modulus.

As apparent from the graph, a larger semiconductor module requires a thicker stress compliant layer for securing the connection life. For example, if the semiconductor module size is approx. 30 mm, the stress compliant layer requires a thickness of approx. 350 $\mu$m. If the thickness is lower than this, the stress cannot be relaxed, and if it exceeds the value, the module substrate is undesirably warped.

Increasing a thickness of a resin layer such as a stress compliant layer may damage a base or cause a crack of a resin layer, peeling, etc. due to the thick resin layer. If a diagonal dimension is short, for example, 2 mm to 3 mm, a thermal stress generated between the semiconductor module and the external substrate on which it is mounted can be logically relaxed by using an insulating layer 20 of the semiconductor module even if the stress compliant layer is omitted. Naturally, if the semiconductor module is mounted on the external substrate, there is another need for means of securing a height preventing the semiconductor device 1 mounted on the module substrate 2 from being put in contact with the external substrate. Therefore, for a semiconductor module having a general module size of 30 mm on a side, the stress compliant layer 10 requires a thickness of approx. 350 $\mu$m at maximum from a viewpoint of the stress relaxation. On the other hand, from a viewpoint of securing a height at mounting on the external substrate, it is required to prevent a rear surface of the semiconductor device 1 of the semiconductor module from being in contact with the external substrate and therefore there is a need for forming a gap between the module substrate and the external substrate by an amount equivalent to the distance between the module substrate and the rear surface of the semiconductor device 1.

In general, if the external connection terminals 5 are solder balls, the solder fuses at connection with the external substrate and then the wet solder spreads over the electrodes on the external substrate side and the semiconductor device is attracted to the external substrate by a surface tension of the solder, by which the height of the external connection terminal becomes lower in comparison with the height before the mounting. Therefore, taking into consideration an effect of a contact with the external substrate after the mounting upon the rear surface of the semiconductor device (particularly, a semiconductor chip), preferably the distance between the module substrate 2 and the tip of the external connection terminal (the sum of the thickness of the stress compliant layer of the semiconductor module and the height of the external connection terminal) is longer than a distance between the module substrate and the rear surface of the semiconductor device 1 in the formation.

Figure 28:
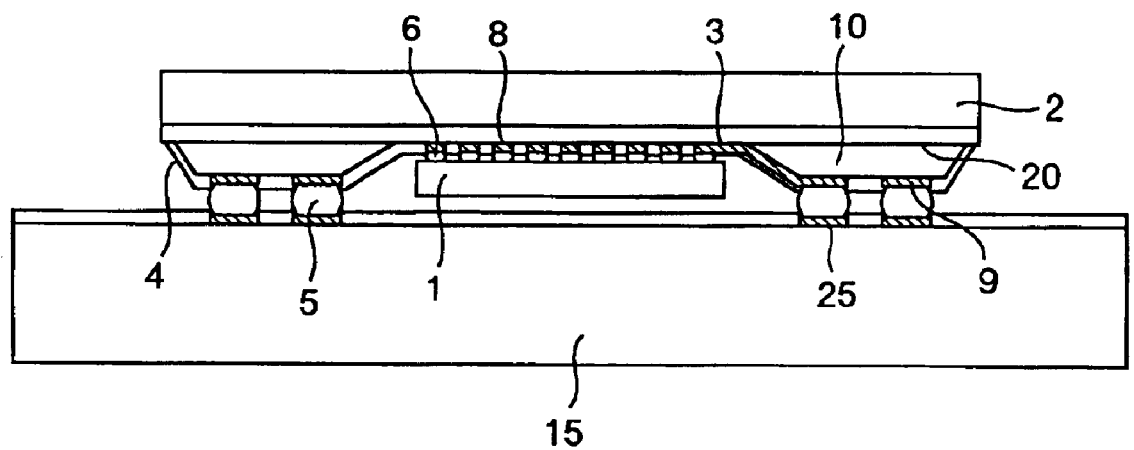
FIG. 28 is a diagram showing an example of a semiconductor module of the present invention.

Referring to FIG. 28, there is shown a condition in which the semiconductor module of the present invention is mounted on an external substrate 15. The semiconductor device 1 is mounted with an appropriate gap against the external substrate 15. Generally, a surface of the external substrate 15 is not completely flat since wiring and the like are formed on it. Therefore, even though there is an appropriate distance between the rear surface of the semiconductor device 1 and the external substrate 15 but, however, the external substrate 15 is deformed in the reflow process or other processes for mounting the semiconductor module, the rear surface of the semiconductor device 1 may be put in contact with the external substrate 15, thereby damaging the semiconductor device 1 and deteriorating the function.

Taking into consideration the evenness of the external substrate 15 and the deformation of the external substrate 15 in the reflow process, there is a need for securing a distance of 0.05 mm or longer between the rear surface of the semiconductor device 1 and the external substrate 15. On the other hand, if an attempt is made to increase the distance between the rear surface of the semiconductor device 1 and the external substrate 15, the stress compliant layer 10 needs to be thicker or the semiconductor device 1 needs to be very thin. The thin-type semiconductor device 1 decreases a mechanical strength of the element and, therefore, it is hard to make the semiconductor device extremely thin. On the other hand, the material of the stress compliant layer is heated and floats in the forming process of the stress compliant layer 10 and, therefore, there is a limitation in increasing a thickness of the stress compliant layer 10. Accordingly, taking into consideration a range enabling a formation of the stress compliant layer 10 without decreasing a mechanical strength of the semiconductor device 1, it is preferable to keep the gap of 0.7 mm or smaller between the rear surface of the semiconductor device 1 and the external substrate 15.

Figures 4A, 4B, 4C:
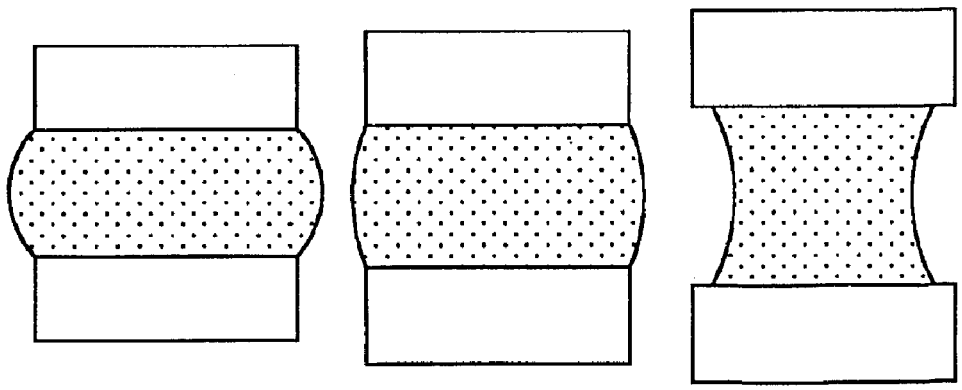
FIGS. 4A, 4B, 4C are diagrams showing a solder joint portion of the present invention.

Conversely, if there is no problem on the effect of the contact with the external substrate after the mounting upon the rear surface of the semiconductor device (particularly, a semiconductor chip), the distance between the module substrate 2 and the tip of the external connection terminal (the sum of the thickness of the stress compliant layer of the semiconductor module and the height of the external connection terminal) can be almost equal to a distance between the module substrate and the rear surface of the semiconductor device 1 (Note that, however, the distance between the module substrate and the rear surface of the semiconductor device 1 must not be longer than the other). In this case, if the semiconductor module is mounted on the external substrate, a certain gap is maintained by a contact of the rear surface of the semiconductor device 1 with the external substrate, thereby enabling a formation of a cylindrical solder joint portion as shown in FIGS. 4A and 4B and of a tabor-like solder joint portion as shown in FIG. 4C. Among them, the shape of the tabor-like solder joint portion shown in FIG. 4C is known to increase a fatigue life of the joint portion in comparison with the ball-like solder joints.

Figure 27:
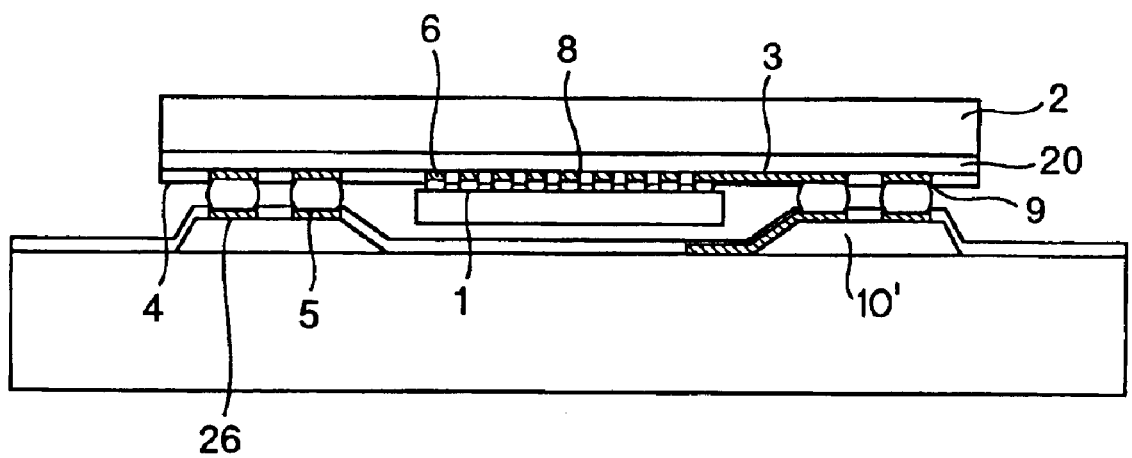
FIG. 27 is a diagram showing an example of a semiconductor module of the present invention.

Therefore, from this viewpoint of securing the height in addition to the viewpoint of the above stress relaxation, the thickness of the stress compliant layer 10 varies depending upon a size of the semiconductor module, a thickness of the mounted semiconductor device, and a connection pitch between the semiconductor module and the external substrate. For example, when the semiconductor module has a size of 30 mm on a side, it is preferable to use the stress compliant layer 10 having a thickness within a range therefor which prevents the semiconductor device mounted on the semiconductor module from being in contact with the external substrate, the range having a maximum value 350 $\mu$m. FIG. 27 also illustrates a mounting scheme of a semiconductor module on an external substrate but, however, with a stress compliant layer 10' on the side of the external substrate. Reference numeral 26 in FIG. 27 and, likewise, reference numeral 25 in FIG. 28 represent solder ball contact electrodes.

Subsequently, a shape of the stress compliant layer 10 is described below.

The shape of the stress compliant layer 10 is preferably frame-shaped enclosing the semiconductor device 1 as shown in FIG. 1. The frame shape enables an arrangement area for the external connection terminals 5 to be sufficiently secured. In addition, it has such effects that an enough mounting area is secured to arrange the semiconductor device 1 in almost the central portion of the module substrate 2 and that there are less limitations on its mounting position. In general, a bump pitch of the semiconductor device has a tendency to be narrower, thereby increasing a burden on the side of a circuit board which receives the semiconductor device and making it hard to arrange wiring in a desired position from the bump on the circuit board. It is because organic materials having a low heat resistance are used for almost all of the normal circuit boards (printed-circuit boards), thus disabling a use of a formation technology by sputtering preferable for forming fine wiring. Under these circumstances, it is required to increase an external connection terminal pitch of the semiconductor module relative to the bump pitch of the semiconductor device. If the stress compliant layer 10 is formed into a frame, all wires can be formed to extend radially and almost regularly from the vicinity of the central portion outwardly, thereby easily enabling wires 3 to be suspended so as to increase the pitch from the bump 6 to the external connection terminal 5. Also taking into consideration mounting the semiconductor module on the external substrate (suspending wiring), it is preferable that the external connection terminal 6 is arranged in the vicinity of an outer periphery of the module substrate 2. It is because the closer the terminal is to the outer periphery of the module substrate a side of the frame-shaped stress compliant layer 10 becomes longer, thereby expanding an area for mounting the bumps and enabling the pitch between the external connection terminals 5 to be increased. A silicon substrate, a glass substrate, or a ceramic substrate having a high heat resistance is used for the module substrate 2, thus enabling a formation of fine wiring by the sputtering.

The stress compliant layer 10 has a trapezoidal shape with a portion inclined to the module substrate 2. With optimizing this angle of inclination, the wires 3 can be prevented from being broken. An average gradient is preferably 5 to 45%. If the angle of inclination is lower than 5%, a desired film thickness cannot be obtained due to the too long inclination. For example, to obtain a thickness of 100 $\mu$m with an angle of inclination of a 3% average gradient, a horizontal distance of more than 3 mm is required and therefore a desired film thickness can be obtained only after realizing almost 7 mm for both sides of the edge portions. On the other hand, if the angle of inclination is more than 45%, there is no problem in a respect of the horizontal distance, while there is a large risk of missing sufficient step coverage at wiring formation on the contrary. Particularly, there is no process margin in a formation of the plating resist or exposure and development processes, thereby requiring special skills or technologies. Furthermore, for a greater angle of inclination, what is called a stress concentration effect works and a stress is concentrated on the edge portion, thereby causing a tendency for the wires 3 to be broken in the edge portion and thus requiring a special design for the wiring structure in some cases.

Figure 5:
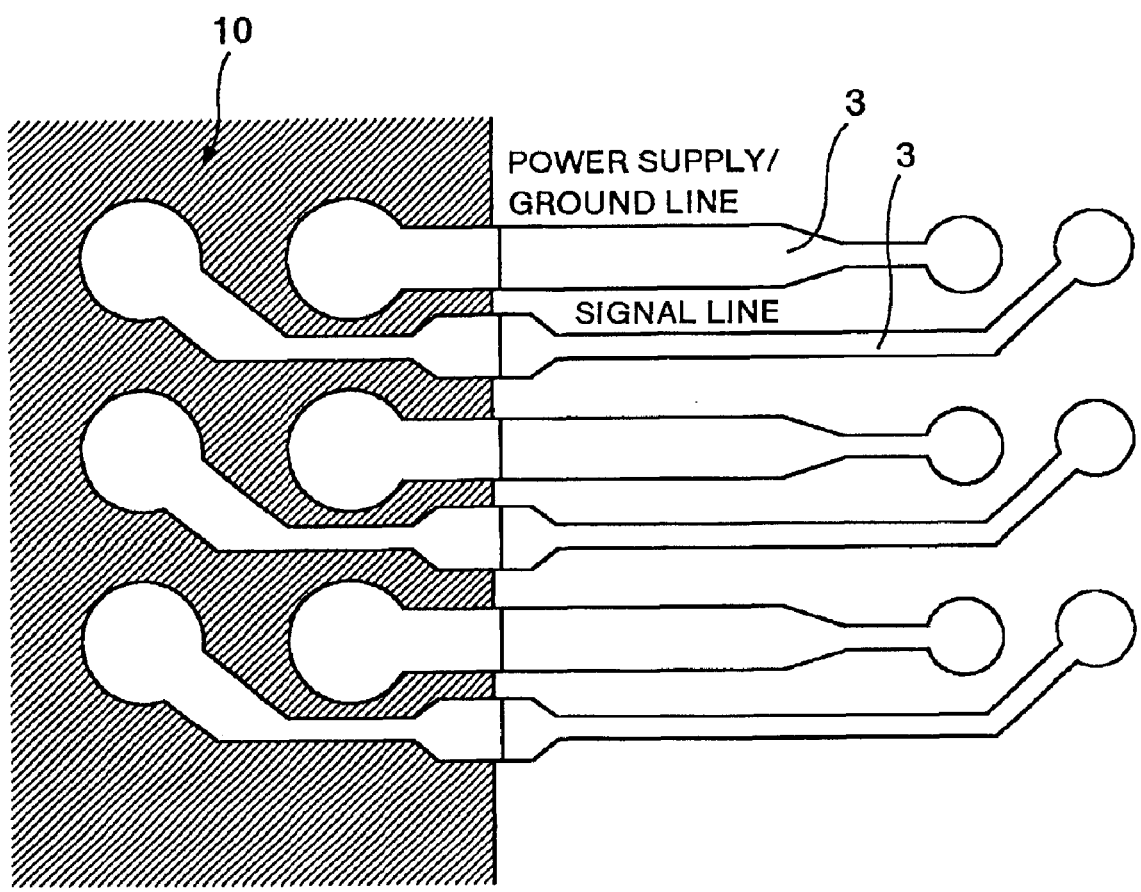
FIG. 5 is a diagram showing a wiring structure of the present invention.

To prevent the wires 3 from being broken effectively, for example, it is preferable to increase the thickness of the wires 3 in the inclined portion of the stress compliant layer 10. In this case, all the wires 3 need not have the same thickness necessarily; for example, as shown in FIG. 5, the thickness of the wires 3 can vary as a thickness of a power supply/ground line is different from that of a signal line. In this diagram, the meshed region indicates the stress compliant layer 10. In this case, taking into consideration electrical characteristics, generally the power supply/ground line is preferably thicker than the signal line. If the signal line is thicker, it causes an increase of a capacitance component of the wire, thereby affecting the high-speed operation. Conversely, if the power supply/ground line is thicker, it is expected to achieve an effect of a stable power supply voltage and therefore it is rather preferable. Therefore, as shown, preferably the signal line is formed in a pattern having a thick portion around the edge so as to at least relax only the portion on which the stress is concentrated and the power supply/ground line is formed in a pattern having a uniformly thick portion in the inclined portion. On the other hand, in the region where the stress compliant layer is not formed (plain portion), the signal line is thin taking into consideration an effect of the capacitance component of the wire. Such, however, needs to be considered every time according to a type of the semiconductor device or its wiring pattern to be formed. For example, although it depends upon the semiconductor device or its wiring pattern, an increase of a thickness of a protective film 20 is very effective for decreasing a capacitance of the wire, and therefore if a thick signal line must be used in a region where the stress compliant layer is not formed, it is preferable to form a thick protective film 20. Concretely, if a width of the wire is increased by 10%, preferably a film thickness of the protective film 20 is increased by approx. 10%.

If a copper wire on which a nickel layer is formed is used as the wire 3 though it is not shown, the wire 3 is deformed by a heat stress acting between the semiconductor module and the external substrate, and afterward when the stress is released the wire 3 resumes the shape before the deformation due to a spring property of the nickel layer. For example, with an action of a heat stress caused by an operation of the semiconductor module, the stress compliant layer and the wires 3 formed thereon are deformed closely adhering to each other. For the deformation of the wires, is used a deflection of the redundant portion of the wire existing in a rising portion of the stress compliant layer (the rising portion is described later). Afterward when the stress compliant layer resumes the original shape after being released from the heat stress, the wire 3 made of only a copper wire is hard to resume the original shape by using its own spring property. On the other hand, if a nickel layer is formed on the copper wire, the wire (copper wire) can resume the original shape easily by the spring property of the nickel layer. The layer formed on the copper wire need not always be a nickel layer, but it can be a layer having the same spring property as for the nickel layer on the copper wire.

Figure 6:
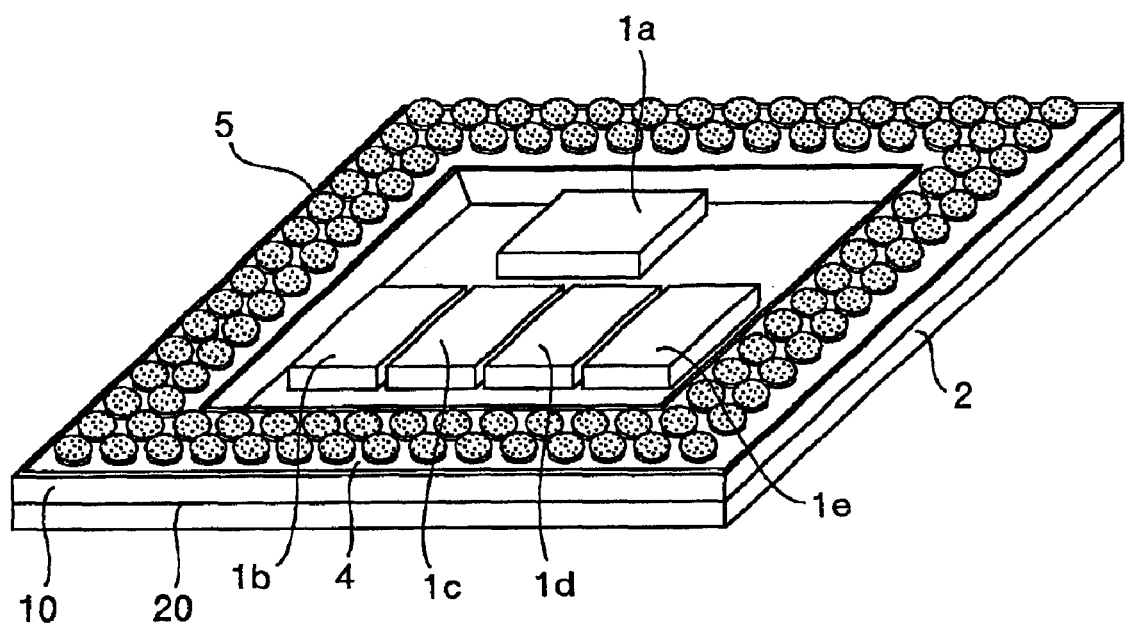
FIG. 6 is a diagram showing an example of a semiconductor module of the present invention.

Referring to FIG. 6, there is shown an embodiment of a structure of a semiconductor module including a plurality of semiconductor devices mounted on a substrate. Semiconductor devices 1a to 1e comprise semiconductor devices having a plurality of the same or different functions. The semiconductor devices can be connected to the substrate for mounting those by using the above methods singly or in combination of plurality of the methods. Furthermore, if necessary, chip components such as resistors, capacitors, and coils can be mounted at a time before use. Considering that the mounting connection to the module substrate is performed by a reflow process also in this case, preferably the bumps 6 of the semiconductor device 1 are solder balls. For example, if a microcomputer for realizing a desired function and a memory are mounted, a semiconductor module having a certain function can be configured. For example, in a portable information terminal, it is applicable to a semiconductor module for high-speed processing of information such as a still image, a dynamic image, and voices previously stored in an electronic device, obtained by phototaking using a camera function, or obtained by communication means or to a semiconductor module having a role of high-speed processing of information such as a large amount of images or voices on a high definition television, a set-top box, a game machine, and the like. Conventionally, a set maker to be a user individually purchases a memory, a microcomputer, or other semiconductor, performs wiring or other layout design, and mounts the semiconductor on an external substrate (circuit board) on the basis of the design. If, however, a semiconductor module realizing given functions can be provided as set forth in the above, the user can treat this semiconductor module as a single component, thereby largely decreasing a burden on the design. Particularly, it is more effective in a field in which a new function is added every several months or a version of a function is updated, for example, in a portable telephone or a portable information terminal.

Figure 7:
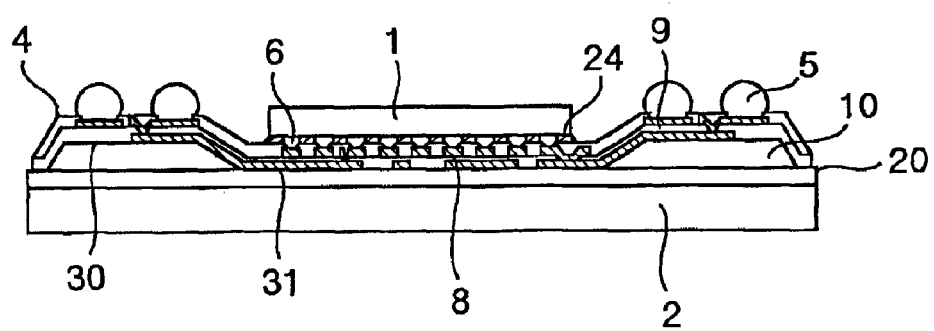
FIG. 7 is a diagram showing an example of a semiconductor module of the present invention.

The wires 3 in the semiconductor module described above can be used in two or more layers formed according to the number of pins, a pin pitch, and an arrangement condition of the mounted semiconductor devices 1. In FIG. 7, the stress compliant layer consists of two layers (10, 30), in which, besides wiring (not shown) formed on the stress compliant layer 30, electrodes 8 connected to bumps 6 of the semiconductor device 6 are connected to a wire 31 formed on a protective film 20 (this wire is also one on the stress compliant layer 10) via the stress compliant layer 30 and is connected to an electrode 9 connected to an external connection terminal 5 via the stress compliant layer 10. The stress compliant layer 30 is used for securing an insulation between the upper and lower wires and is formed including a mounting surface of the semiconductor devices 1 so as to cover the stress compliant layer 10. In this diagram, semiconductor chips are used for the semiconductor devices 1 and therefore a portion between the semiconductor devices 1 and the module substrate 2 is filled with an underfill 24.

Referring to FIGS. 8A, 8B, 8C, 8D, 8E, 8F and 9A, 9B, 9C, there are shown manufacturing processes of the semiconductor module. Regarding the module substrate used for the semiconductor module of the present invention, a plurality of substrates can be manufactured at a time in a single process when they are manufactured in a wafer configuration. To simplify an explanation of the present invention, however, a single semiconductor module is described on the basis of the embodiment shown in FIG. 1.

Figure 8A:
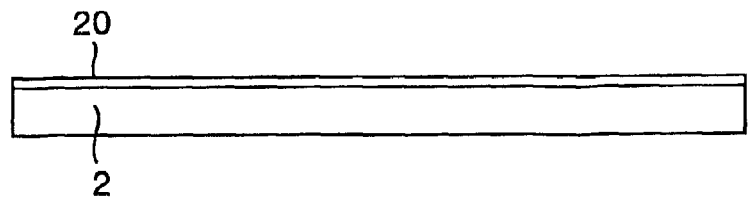
FIGS. 8A, 8B, 8C, 8D, 8E, 8F are diagrams showing an example of a stage in a manufacturing process of the present invention.

Referring to FIG. 8A, there is shown an insulating film 20 on a base 2 on which the semiconductor devices are mounted. The base 2 used for the semiconductor mounting substrate can be one not having a function of a semiconductor device, one having a function of a passive element such as a resistance, capacitance, and a coil, or one having a function of an active element such as a normal memory and a micro-computer. If the base has the above functions, the insulating film 20 is provided with an opening portion (not shown) for connection with wiring formed on the base, if necessary. This insulating film 20 is provided for suppressing a reaction of a stress compliant layer 10 formed later to the base 2 and for improving adhesion and therefore it is not always necessary unless they need be considered.

Figure 8B:
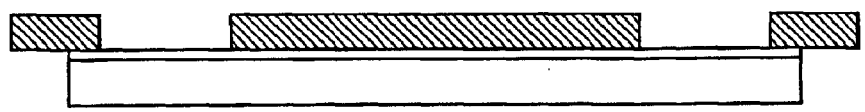

Referring to FIGS. 8B to 8E, there are shown processes for forming the stress compliant layer 10 on the insulating film 20. First, in the process sown in FIG. 8B, a mask for forming the stress compliant layer is set on the insulating film 20 formed on the base 2. This mask can be put in contact with the insulating film 20 as shown in FIG. 8B or be set separately from the insulating film 20 with an appropriate gap. Next, in the process shown in FIG. 8C, a stress compliant material 12 is put on the mask and a squeegee 13 is translated on this mask to wipe the stress compliant material 12 into the opening portions 14. If the mask is set separately from the insulating film with an appropriate gap, an appropriate pressure is applied to the squeegee so that the stress compliant material is put in contact with the insulating film 20 in the process of wiping the stress compliant material 12 with the squeegee for wiping the stress compliant material 12 so that the mask deflects toward the base side. Conditions such as the translation speed and the pressure on the base side of the squeegee can be changed to various ones according to a viscosity, thixotropic properties, a shape of the opening of the mask, and a thickness of the mask. In this embodiment, the opening of the mask is frame-shaped. If a plurality of masks are formed at a time with a formation in a wafer state, the opening portion 14 is associated with a single semiconductor module.

Figure 8C:
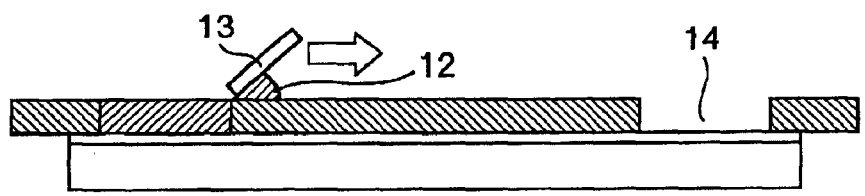
Figure 8D:
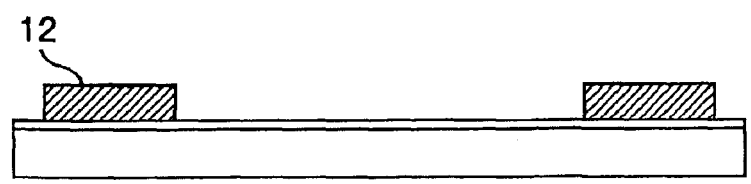
Figure 8E:
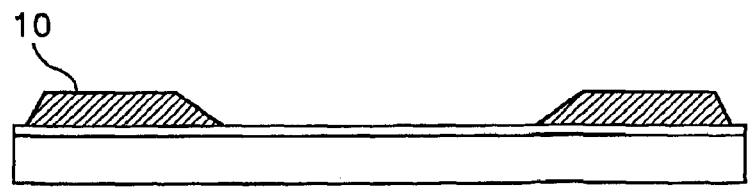
Figure 10A:
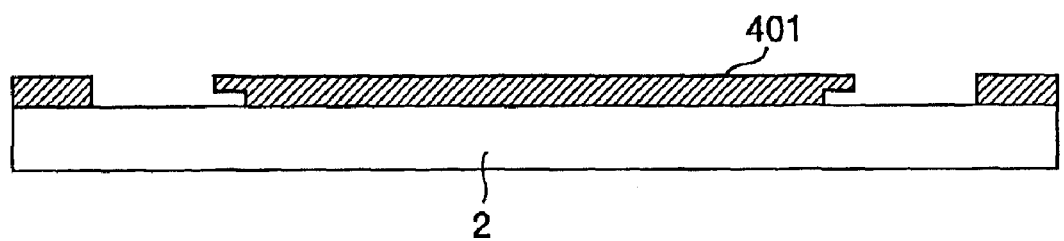
FIGS. 10A, 10B are diagrams showing an example of a mask opening portion of the present invention.
Figure 10B:
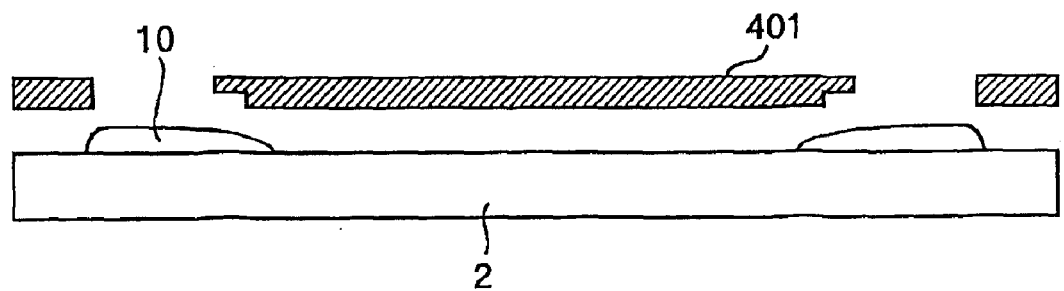

After wiping the stress compliant material 12 into the opening portion 14 of the mask, the mask is removed from the insulating film portion as shown in FIG. 8D and then the stress compliant material is hardened for an appropriate period of time by using a heating furnace, by which the stress compliant layer 10 as shown in FIG. 8E is formed. When the stress compliant material 12 spreads over a peripheral portion in a process of removing the mask from the insulating film 20 or when the stress compliant material 12 spreads over a peripheral portion due to a decrease of the viscosity of the stress compliant material in a process of increasing a temperature of a material for hardening the stress compliant material 12, there is formed a slant portion which prevents a difference in level from the insulating film portion at an end portion of the stress compliant layer 10. In this diagram, the outer inclined portion of the stress compliant layer 10 has a higher gradient than the inner inclined portion. It is because the mounting density is considered and the steeper portion exists in the side where there is no wiring on the stress compliant layer 10, which causes no problem. Naturally, it is possible to form the outer and inner portions having almost the same gradient. If the inclined angles of the outside and the inside are positively differentiated from each other, it is preferable to form printing by using a mask 401 as shown in FIGS. 10A, 10B. In other words, it is preferable to use a mask having a stepped thickness in the mask portion forming the inner inclination with thickness decreased toward the central portion.

Furthermore, in this diagram, an outer peripheral edge of the stress compliant layer 10 is controlled in its configuration so as to be inside the module substrate 2 to be finally a single semiconductor module. It is because this configuration facilitates dicing in cutting the wafer into individual semiconductor modules and also because reliability is improved by covering the entire (other than the electrically connected portions) stress compliant layer 10 with the protective film 4. In FIG. 1, for simplification, there is shown an example of a semiconductor module in which the insulating layer 4 does not cover the stress compliant layer 10. When using this configuration, physical properties of the stress compliant layer 10 are different from those of the module substrate 2 and therefore it is preferable to classify dicing into two steps of-dicing of the stress compliant layer 10 and that of the module substrate 2.

Figure 8F:
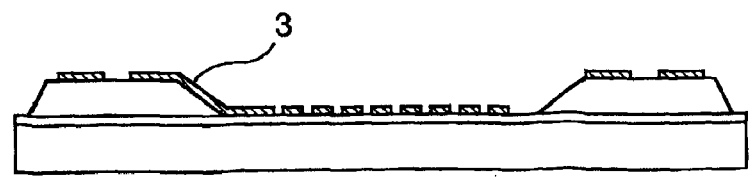

In FIG. 8F, electrodes for mounting the semiconductor device, electrode for connecting the semiconductor device on this substrate to an external substrate, and wires 3 for connecting these two types of electrodes with each other are formed on the stress compliant layer 10 and the insulating film 20. First, a power supply film for forming these electrodes and wires in an electroplating method is formed in a sputtering or other method. This method is preferable to form fine wiring. Subsequently, the power supply film is coated with a photo resist capable of forming a pattern by an exposure and then developing is performed for removing a photo resist portion of the pattern portion by using an exposure mask forming the electrode and wire pattern. Electroplating is performed by using the pattern made by removing the photo resist, by which the electrode portion and the wire portion are formed. After forming the electrodes and wires each having a required thickness by plating, the photo resist and power supply film getting unnecessary are removed by using an appropriate etching agent, by which the configuration shown in FIG. 8C is obtained. Although an approx. 400° C. high-temperature processing is added in the sputtering process, a heat-resistant substrate such as silicon, glass, or ceramic substrate is used in this embodiment, thus preventing a defective wiring formation caused by an expansion of the substrate.

In addition, when a plurality of semiconductor devices 1 are mounted on the module substrate 2 as shown in FIG. 7, if wiring between respective semiconductor devices 1 is required or if the base of the module substrate 2 has a resistance, they need be connected to each other and wiring formed on the insulating film 20 or the stress compliant layer 10 may be insufficient in a single layer. If so, the above wiring process should be repeated twice or more times to form electrodes and wires.

Figure 9A:
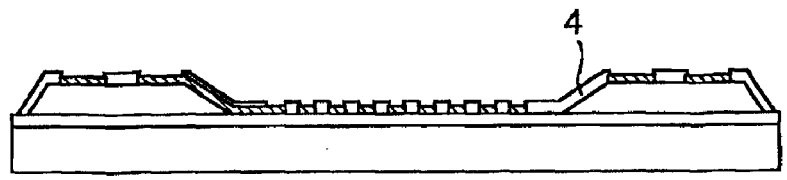
FIGS. 9A, 9B, 9C are diagrams showing an example of another stage in a manufacturing process of the present invention.

Referring to FIG. 9A, there is shown an insulating layer 4 for protecting wires arranged on the stress compliant layer 10 and the insulating layer 20 and for preventing runoff of the solder on the electrodes. The insulating layer 4 is coated with an insulating layer material made of an epoxy resin, a silicone resin, or a polyimide resin, submitted to exposure and development processes by using an appropriate photo mask or the like, and then apertured for solder or other joint portions in each electrode portion. The material coating of the insulating layer 4 can also be performed by using a spin coat method applied in a general semiconductor manufacturing process, a method of pasting an insulating layer formation material sheet on the insulating layer formation surface, or a printing method such as a curtain coating method or a roll coating method.

Figure 9B:
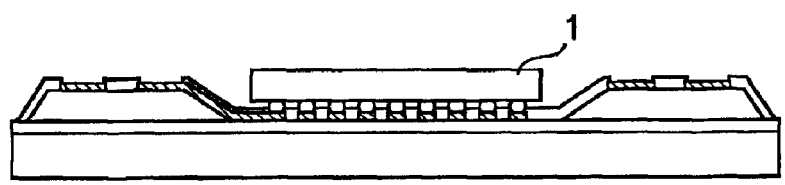

In FIG. 9B, there is shown a process of mounting the semiconductor device 1 on the substrate generated in the processes up to FIG. 9A. In this process, first the electrode on the substrate corresponding to each bump of the semiconductor device is coated with flux or solder paste. In case of a small difference in level between the semiconductor device mounting portion and the stress compliant layer arranged around it, a printing method using a mask is applicable to the coating of the electrode portion on the substrate with flux. If the difference in level is large, it becomes hard to coat the semiconductor device mounting portion with flux. In this case, the electrodes can be coated with flux by a method of transferring the flux to the bumps of the semiconductor device before connection with the electrode portion on the substrate or a method of transferring the flux to pins arranged correspondingly to the electrode positions on the substrate and further transferring it to the electrodes on the substrate. After coating the electrodes on the substrate with the flux by using one of the above methods, the semiconductor devices are mounted on the substrate and heated to the fusion temperature or higher of the bumps, thereby enabling a joint between the semiconductor devices and the substrate.

Figure 9C:
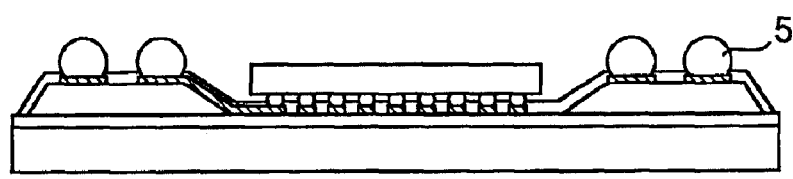

Referring to FIG. 9C, there is shown a process of mounting the solder balls 5 to be external connection terminals for a connection between the module substrate 2 on which the semiconductor device 1 is mounted and the external substrate. The solder balls 5 are mounted by using the same method as for mounting the semiconductor device 1, that is, coating the external substrate connection electrode portion with flux and arranging the solder balls in the corresponding electrode positions using an appropriate mask. Subsequently, the solder balls are heated to the fusion temperature or higher, thereby fixing the solder balls to the electrodes on the stress compliant layer 10. If the solder balls 5 are arranged in two or more strings, the mounted area is required to have evenness. If so, smoothing processing of the stress compliant layer 10 is effective after the processing shown in FIG. 8E, though it is not shown.

After mounting a semiconductor device on the substrate or mounting solder balls on the substrate, a cleaning process is added, if necessary, in manufacturing the semiconductor device to remove the flux used in the process of manufacturing the semiconductor device.

Figure 11:
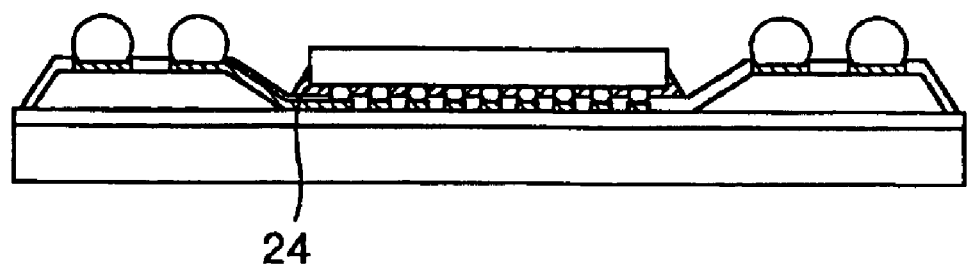
FIG. 11 is a diagram showing an example of a manufacturing process of the present invention.

Furthermore, as shown in FIG. 11, a gap between the semiconductor device and the substrate can be filled with a resin 24. As the resin for filling the gap between the semiconductor device and the substrate, an epoxy resin, a phenolic resin, or a silicone resin can be singly used or a mixture of two or more of these resins can be used with a silicon dioxide, aluminum oxide, or other encapsulant, a coupling agent, a colorant, or a flame-retardant, if necessary.

The semiconductor device of the present invention can be manufactured in the processes as set forth in the above. Particularly, if the stress compliant layer 10 is formed with a low elastic modulus liquid resin material having a high viscosity by a printing method using an appropriate mask, the low elastic modulus resin flows in the resin hardening process, thereby enabling a formation of a configuration having a smooth portion between a printed portion and a non-printed portion. If the smooth configuration is achieved, the wire 3 can be collectively arranged on the top of the printed portion and the non-printed portion. In other words, though the wire 3 up to the external connection terminal 5 need be formed on the stress compliant layer 10 in this structure, the mask printing enables the control of the shape including the inclined portions and the formation of a desired inclination preventing a broken wire, thereby improving reliability of the semiconductor module. In addition, the low elastic modulus material layer is formed by using the mask printing, thereby realizing a semiconductor module having a very high production efficiency. Furthermore, a superior control is achieved in its shape.

The material of the formation of the stress compliant layer 10 is preferably polyimide paste and it can be hardened by heating after it is printed and applied to the protective film 20. The polyimide paste is made of polyimide precursor and solvent and a lot of polyimide fine particles are dispersed in these. The fine particles used here concretely have a particle size distribution of an average particle diameter of 1 to 2 $\mu$m and the maximum particle diameter of approx. 10 $\mu$m. The polyimide precursor after hardening gets the same material as polyimide fine particles, and therefore when the polyimide paste is hardened, an even stress compliant layer 10 made of a single type of material is formed. Although polyimide is used here as the stress compliant layer forming material, it is possible to use an amide-imide resin, an ester-imide resin, an ether-imide resin, a silicone resin, an acrylic resin, a polyester resin, a phenolic resin, an epoxy resin, a urea resin, a polyether sulfone resin, and a modified resin from one of these. When using a resin other than the polyimide resin, it is preferable to perform a process of adding compatibility to surfaces of the polyimide fine particles or to modify the resin composition so as to improve the affinity with the polyimide fine particles.

Among the above described resins, resins having imide binding, for example, polyimide, amide-imide, ester-imide, and ether-imide resins are superior in thermomechanical characteristics, for example, in the strength at a high temperature due to a strong skeleton with the imide binding, which results in a wider range of choices for a method of forming a plating power supply film for wiring. For example, it enables selecting a method of forming a plating power supply film including a high-temperature process such as sputtering. For a resin having a condensed portion in binding other than imide binding such as a silicone resin, an acrylic resin, a polyester resin, an amide-imide resin, an ester-imide resin, and an ether-imide resin, they are advantageous in respects of processing characteristics or resin prices in some cases, though they are slightly inferior in thermomechanical characteristics. For example, the polyester-imide resin is generally easy to treat since its hardening temperature is lower than a polyimide resin.

Viscoelastic characteristics of the material can be adjusted by dispersing polyimide fine particles in the polyimide paste as described above, thus enabling a use of the paste superior in printability. The thixotropic properties of the paste can be controlled by adjusting the mixture of fine particles, thereby enabling an improvement of printability by a combination with the adjustment of the viscosity. In addition, an inclined angle of the stress compliant layer 10 can be controlled. To obtain preferable thixotropic properties of the paste, what is called a thixotropy index is preferably within a range of 2.0 to 3.0 which has been calculated from a ratio of a viscosity at a velocity 1 rpm measured by using a rotaviscometer to a velocity 10 rpm. If a temperature dependence appears in the thixotropy index in the paste, preferably printing is performed in a temperature region in which the thixotropy index is within a range of 2.0 to 3.0.

Figure 12:
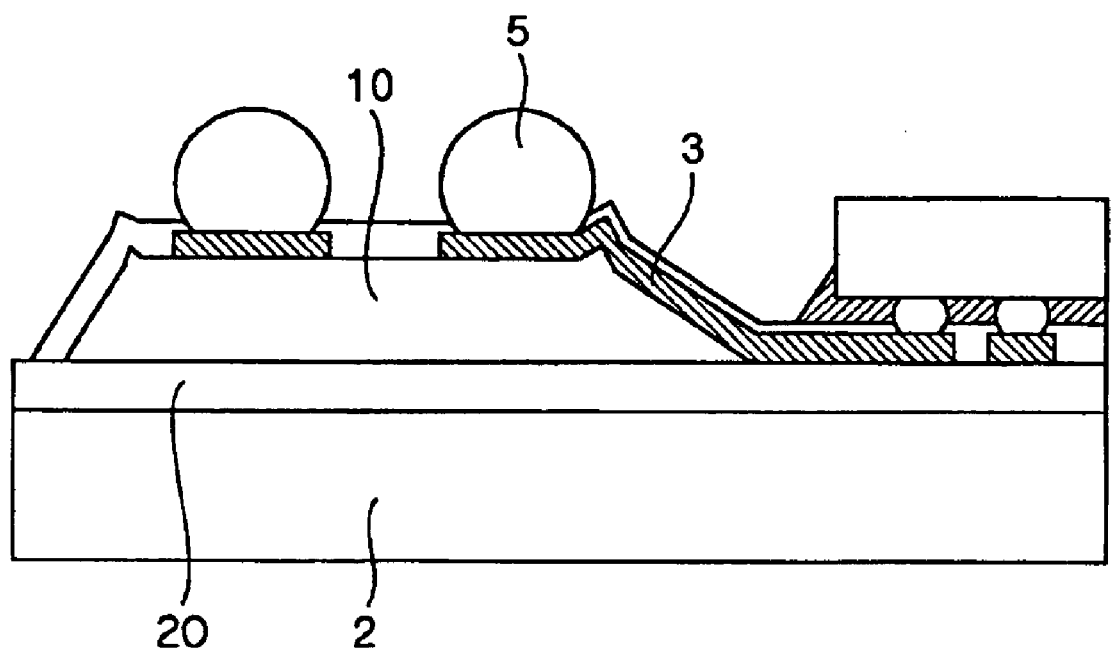
FIG. 12 is a diagram showing an example of a semiconductor module of the present invention.

If the stress compliant layer 10 is formed by printing in this manner, there is a rising portion in the vicinity of the position corresponding to an edge of the mask opening portion as shown in FIG. 12. The position of the rising portion and its presence or absence are controllable to some extent by adjusting a composition of the polyimide paste or by changing various conditions of printing. As the various conditions of printing, there are a thickness of a metal mask, a velocity of the squeegee, a material of the squeegee, an angle of the squeegee, a pressure of the squeegee (printing pressure), a plate separation speed, a temperature of a wafer at printing, and a humidity of a printing environment.

As shown, if the rising portion is positively formed in the stress compliant layer 10, a deflected portion of the wire 3 can be formed, thereby generating a structure enabling an easy absorption of a stress caused by a thermal expansion and preventing a broken wire more effectively. Concretely, it is preferable to form a rising portion having preferably a height of approx. 7 to 12 $\mu$m and the maximum height of approx. 25 $\mu$m to an average thickness of the stress compliant layer 10. This level of a peak can be sufficiently formed by mask printing. For example, assuming that the rising portion has a half-cylindrical shape of radius 10 $\mu$m, a length of a half arc of the rising portion is $(2 \times 3.14 \times 10 \mu m)/2 = 31.4$ $\mu$m and a redundant length of the wire is $31.4 - 10 = 21.4$ $\mu$m per rising portion. The redundant portion can be arranged in the wire 34 like this, thus relaxing the heat stress applied to the wiring structure and the solder joint portion and therefore providing a very reliable wiring structure.

Furthermore, preferably the material of the stress compliant layer 10 has a hardening temperature of 100° C. to 250° C. If the hardening temperature is lower than this range, it is hard to manage the temperature in processes of manufacturing a semiconductor module. If the hardening temperature is higher than this, there is a fear of an increase of a stress to a module substrate due to a thermal shrinkage at cooling for hardening.

In addition, the stress compliant layer 10 after the hardening is submitted to various processes such as sputtering, plating, and etching and therefore they are required to have heat resistance, chemical resistance, and solvent resistance characteristics. Concretely, preferably a glass transition point temperature (Tg) is over 150° C. and lower than or equal to 400° C. as the heat resistance, and more preferably Tg is higher than or equal to 180° C. and most preferably higher than or equal to 200° C.

Figure 13:
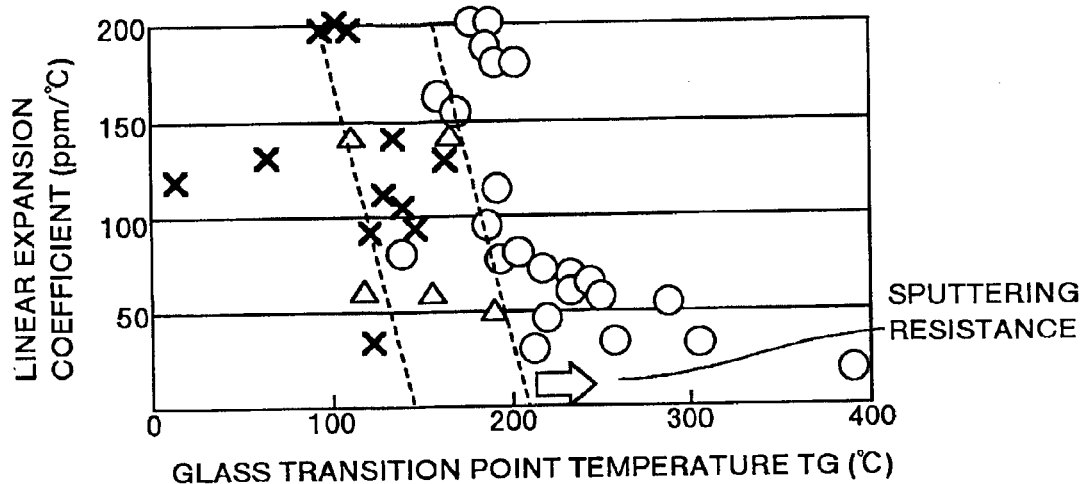
FIG. 13 is a diagram showing a relationship of a sputtering resistance of the present invention.

Referring to FIG. 13, there is shown an example of an experiment showing a relation between the glass transition point temperature and a linear expansion coefficient. It is apparent that no crack occurs if the glass transition point temperature (Tg) is higher than or equal to 200° C. from this graph. From a viewpoint of suppressing deformation amounts in various temperature treatments in processes, the smaller the linear expansion coefficient ($\alpha 1$) is in regions lower than Tg the better. Concretely, the closer to 3 ppm the coefficient is the better. While most of low elasticity materials have large linear expansion coefficients in general, the linear expansion coefficient is preferably within a range of 3 ppm to 300 ppm. More preferably it is within a range of 3 ppm to 200 ppm and the most preferably within a range of 3 ppm to 150 ppm.

On the other hand, a heat decomposition temperature (Td) is preferably equal to or higher than approx. 300° C. If Tg and Td are lower than these values, there is a risk of a deformation, a change in quality, or decomposition of the resin in a heat treatment, for example, sputtering or sputtering etching in the processes.

In addition, from a viewpoint of a chemical resistance, it is desirable that any change of the resin in quality does not occur after dipping in 30% sulfuric acid solution or 10% aqueous sodium hydroxide for 24 hours or longer. As solvent resistance, a solubility parameter (SP value) is preferably within a range of 8 to 20 (cal/cm3)½. If the material of the stress compliant layer comprises some components in a base resin, most of the composition is preferably within a range of the above solubility parameter. More specifically, it is preferable that a component having a solubility parameter (SP value) smaller than 8 or exceeding 20 is not included by 50 wt % or more. If the chemical resistance or solvent resistance is insufficient, applicable manufacturing processes may be limited, by which it may be undesirable from a viewpoint of lowering a manufacturing cost.

The fine particles included in the above stress compliant layer 10 are made of the same material as for the stress compliant layer 10 and have the same physical properties. The fine particles are dispersed in the stress compliant layer, thereby providing viscoelasticity required for printing. However, as described above, this structure causes a rapid change of the physical property value on a boundary between the module substrate 2 and the stress compliant layer 10, by which a heat stress or the like focuses on the boundary potion and it may break wires. Therefore, the characteristics of the stress compliant layer 10 formed on the module substrate 2 are varied in the thickness direction, so that the characteristics of the stress compliant layer on the side of the module substrate are close to those of the module substrate. It decreases a difference of characteristics on the boundary portion between the module substrate and the stress compliant layer so as to prevent a discontinuous force from being applied on wires on them or to prevent tensile, compression, or bending stress caused by an expansion or a shrinkage of the stress compliant layer from being applied to the wiring portion, thereby enabling a prevention of broken wires in the wiring portion.

Furthermore, with making the characteristics of the stress compliant layer 10 on the side of the module substrate close to those of the module substrate and with making the characteristics on the side of the circuit board on which the semiconductor module is mounted close to those of the circuit board, a connection life of the connected portion between the semiconductor module and the circuit board is effectively improved as well as wiring on the stress compliant layer.

Figure 25:
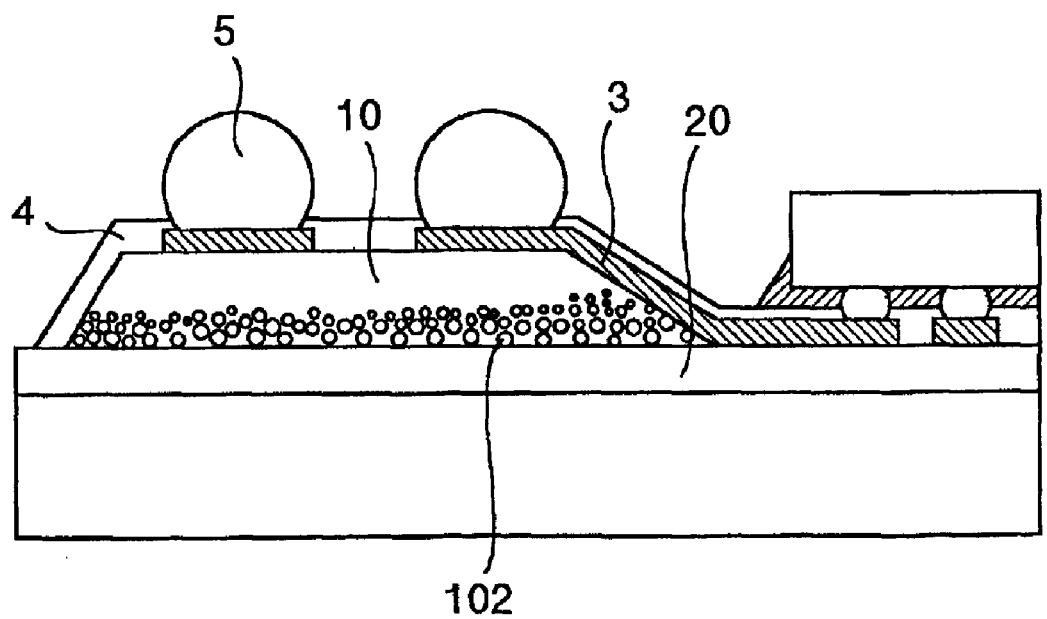
FIG. 25 is a diagram showing an example of a semiconductor module of the present invention.

As characteristics gradually changing in the thickness direction on the stress compliant layer 10, there are thermal expansion coefficient, elastic modulus, etc. As concrete means for changing the characteristics of the stress compliant layer, as shown in FIG. 25, silica particles 102 which are insulating particles are mixed to make a distribution in loadings of the silica particles 102 in the thickness direction of the stress compliant layer 10 to cause a gradual change of the thermal expansion coefficient or an elastic modulus. In the portion where a lot of silica particles 102 are distributed, the thermal expansion coefficient of the stress compliant layer 10 is low and the elastic modulus is high. On the other hand, when the loadings of the silica particles 102 gets low, the thermal expansion coefficient goes up and the elastic modulus goes down.

Therefore, the stress compliant layer 10 can include a single type or two or more types of particles made of inorganic materials such as silica, alumina, or boron nitride which are insulating particles for adjusting the elastic modulus or the thermal expansion, or if necessary, appropriate particles made of organic materials such as polyimide or silicone.

Furthermore, it is also possible to blend a coupling agent made of alkoxysilane or titanate for improving adhesion with various interfaces composing the silica particles or the insulating resin layer, a modifier such as a thermoplastic resin for improving a breaking extension or breaking strength of the resin, dye or pigment for coloring the insulating resin layer for preventing a malfunction caused by a ultraviolet light of a circuit portion formed on the wafer, and hardening accelerator for accelerating a hardening reaction of the resin layer.

As a method of forming the stress compliant layer 10 whose characteristics changes in the thickness direction, for example, there is a method of coating the liquid stress compliant layer 10 comprising the materials described above on the module substrate and gradually settling the insulating particles made of the blended silica and others on the side of the wafer in a process of heating and hardening the stress compliant layer 10. If there is a distribution in the particle diameter of the silica particles, the larger particle diameter the particle has the earlier they settle, while the smaller particle diameter it has the later they settle. If the stress compliant layer is heated and hardened with the module substrate facing down, a distribution of the characteristics is formed in the thickness direction of the stress compliant layer.

As a method of controlling a density distribution in the film thickness direction of the silica particles blended in the stress compliant layer 10, there is a method of appropriately adjusting a hardening temperature of the insulating resin or a hardening temperature profile, a method of appropriately blending hardening accelerator for accelerating the progress of the hardening with appropriate loadings or types or appropriately blending reaction retarder for retarding the hardening, or a method of changing a particle diameter distribution of the insulating particles such as the silica particles.

Applicable silica particles are those made by shattering a lump of silica having been fused to be an silica ingot, by shattering the silica ingot, heating and fusing the silica particles again, and then making them into spheres, and by synthesizing. The particle diameter distribution and loadings of the silica particles can be modified in various way according to products. If the stress compliant layer 5 is formed by a printing method, a distribution of the particle diameters need be changed according to a size of the applied mask depending upon the printing method in some cases.

Figure 26:
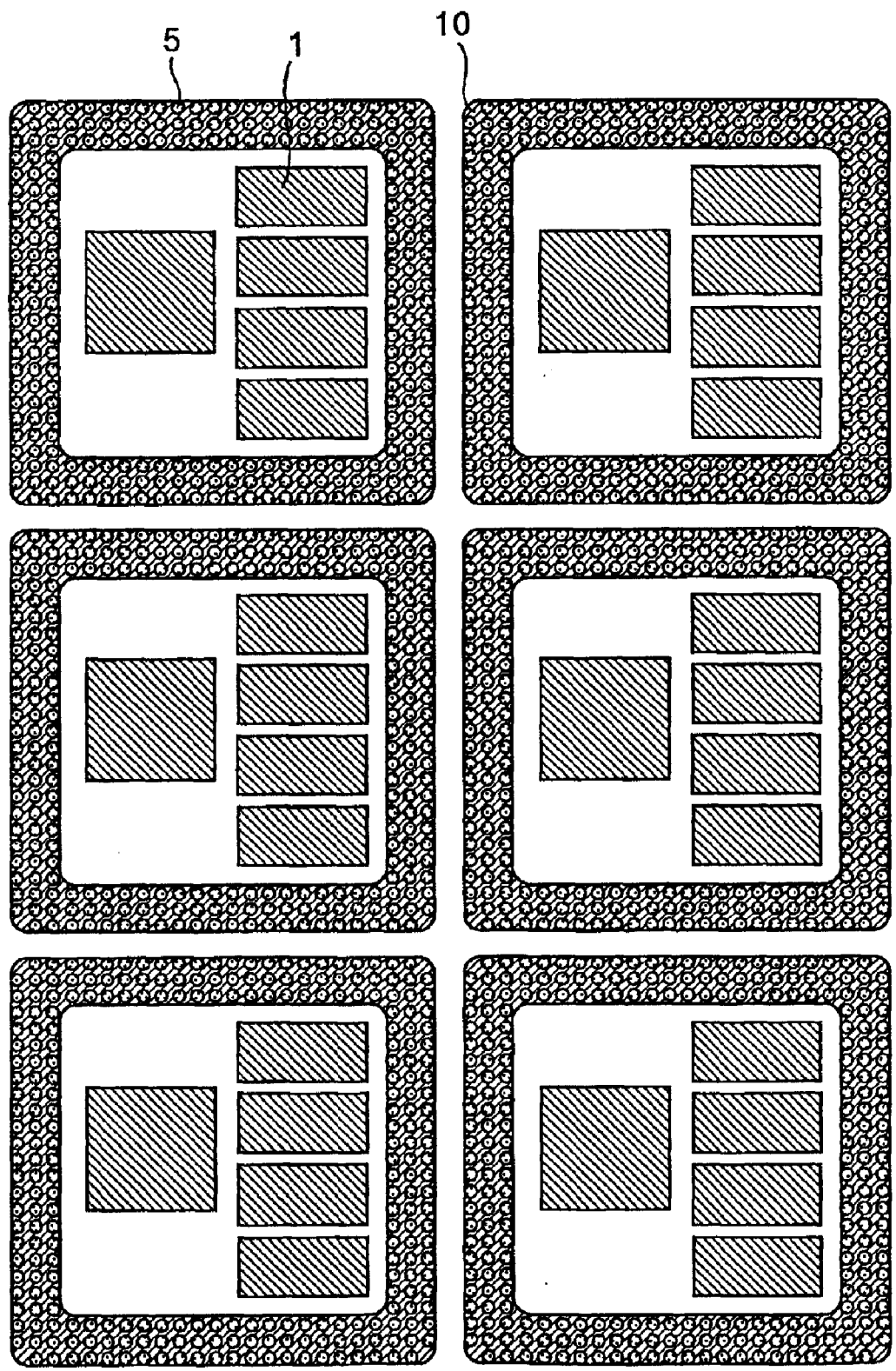
FIG. 26 is a diagram showing an example of a semiconductor module of the present invention.

Additionally in each embodiment, for example, angular portions of the stress compliant layer 10 should be rounded as shown in FIG. 26. Otherwise, a failure of including bubbles is sometimes observed when the stress compliant layer 10 is printed by using the paste polyimide material. In addition, the stress compliant layer 10 is easily peeled off the angular portions. If bubbles remain on the stress compliant layer 10, there occurs a defect such as a broken wire 3 caused by a burst of the bubbles when a semiconductor module is heated. Therefore, it is preferable to round the corners of the pattern opening portions of the printing metal mask used for forming the stress compliant layer 10.

The stress compliant layer in each embodiment can be formed with printing and coating by using a printing metal mask or a dispenser.

Subsequently, a heat dissipation structure of the semiconductor module is described below.

Figure 16:
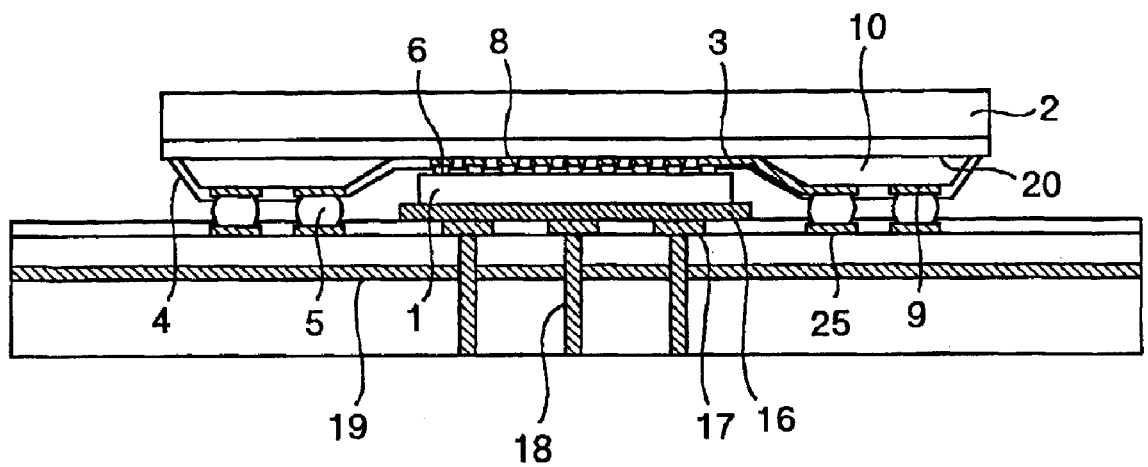
FIG. 16 is a diagram showing an example of a semiconductor module of the present invention.

Referring to FIG. 16, there is shown a mounting structure of the semiconductor module and the external substrate 15, for which heat dissipation properties are considered. There is provided a thermal-conductive material 16 having a rubber elasticity between the rear surface of the semiconductor device 1 and the external substrate 15, with the thermal-conductive material 16 in contact with the electrode 17 on the external substrate 15. This electrode 17 is further connected to a metal layer 19, for example, a ground layer, in the external substrate 15 via a through-hole 18. In this mounting structure, a heat generated in the semiconductor device 1 propagates to the electrode on the external substrate 15 via the thermal-conductive material 16, propagates to the metal layer 19 via the through-hole 18 provided in the external substrate 15, and is diffused to the entire external substrate. The reason why the thermal-conductive material 16 with a rubber elasticity is used is to prevent the semiconductor device 1 from being damaged even if the semiconductor device 1 is put into contact with the thermal-conductive material 16 to improve the heat dissipation properties. Therefore, it is possible to use a paste or gel thermal-conductive material instead of the rubber material only if it satisfies this purpose. Electrodes 25 are arranged for bonding the semiconductor module to the external substrate 15 via bump electrodes 5. Taking into consideration the heat dissipation properties, preferably a plurality of through-holes 18 are arranged as shown in FIG. 16.

Figure 17:
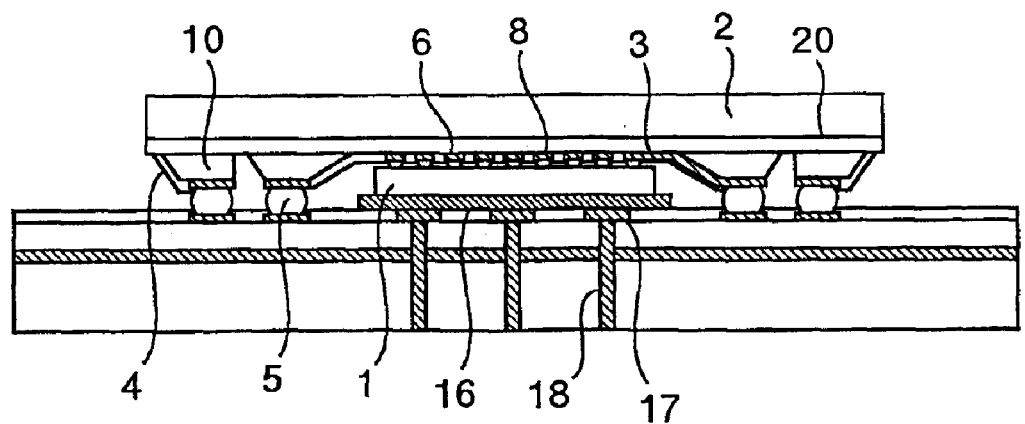
FIG. 17 is a diagram showing an example of a semiconductor module of the present invention.

As shown in FIG. 17, in the structure of the frame-shaped stress compliant layer 10, there can be formed ventilating portions as separating the stress compliant layer 10 into some portions. It may be separated into either bumps or strings from the inside toward the outside; it is only required to have a structure in which a heat generated in the semiconductor device 1 is relieved to the outside via the ventilating portions. It is preferable to use it in combination with an air-cooling system.

Figure 18:
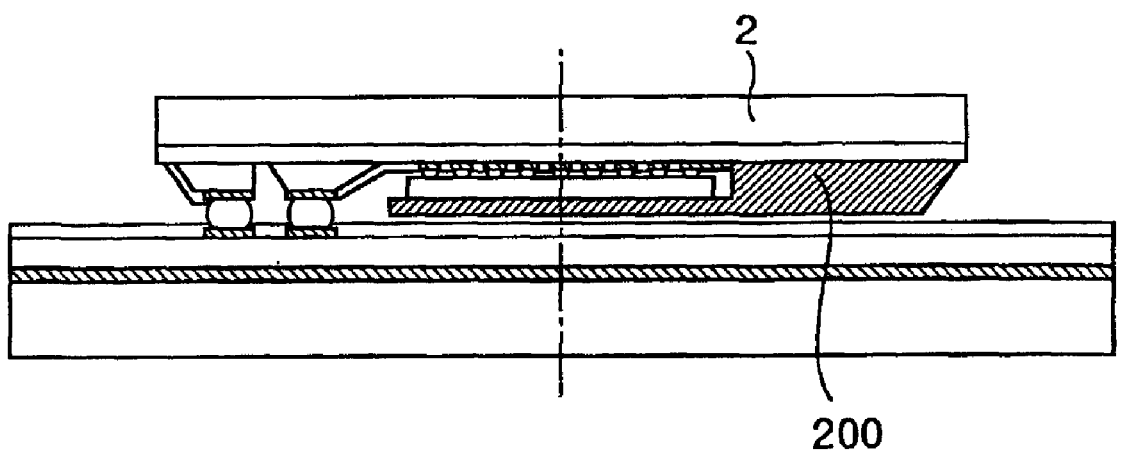
FIG. 18 is a diagram showing an example of a semiconductor module of the present invention.

Furthermore, as shown in FIG. 18, a cooling plate 200 connected to the module substrate 2 can be mounted on the rear surface of the semiconductor device 1 to release the heat via the module substrate 2.

Figure 19:
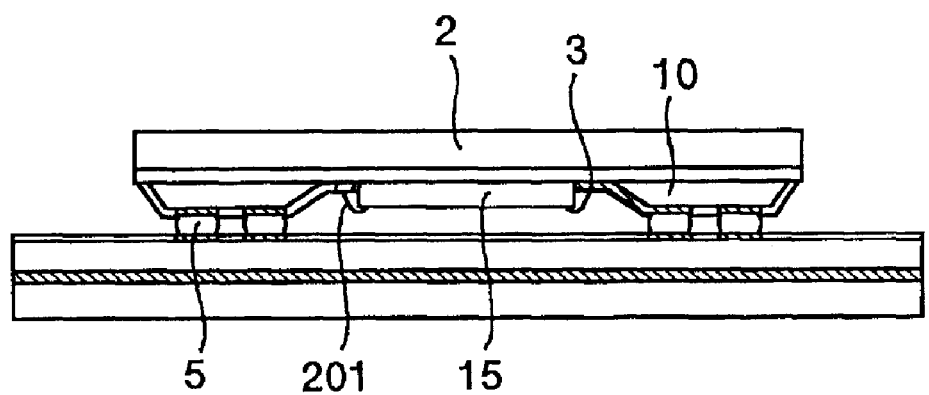
FIG. 19 is a diagram showing an example of a semiconductor module of the present invention.

In addition, as shown in FIG. 19, the semiconductor device 1 can be mounted on the module substrate 2 with a connection by means of wire bonding 201 instead of a flip-chip connection. Heat is mainly generated from the rear surface of the semiconductor device 1 and therefore the semiconductor device 1 is die-attached to the module substrate 2, thereby enabling the heat dissipation via the module substrate 2. The electrode of the semiconductor device 1 is connected to that of the module substrate 2 with wire bonding 201. The reliability is improved by covering required portions with a resin to protect the wire bonding portion, though it is not shown. The stress compliant layer 10 is frame-shaped and therefore the inner area formed by the stress compliant layer 10 can be filled with a resin.

Figure 20:
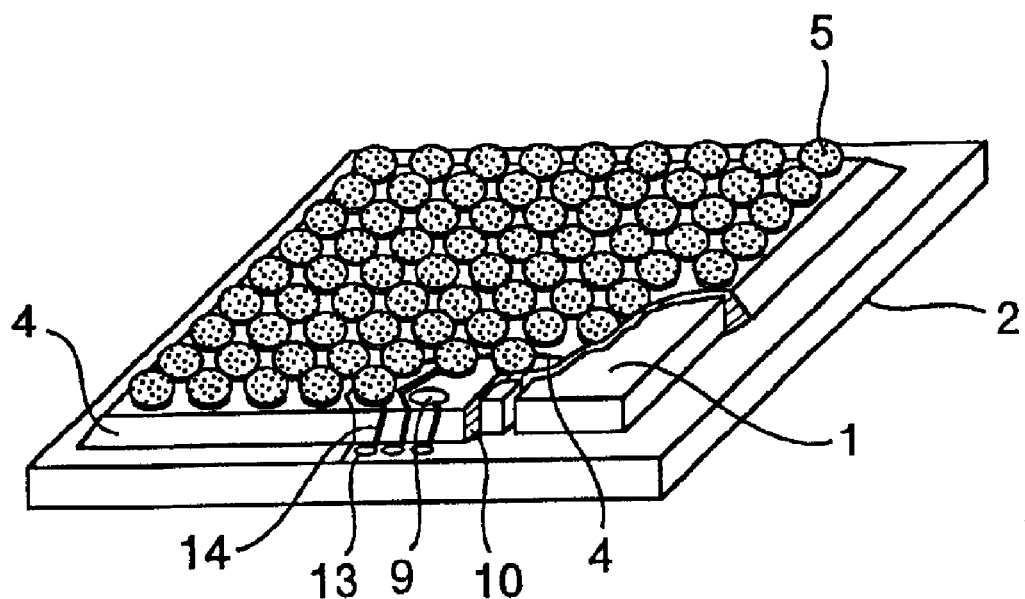
FIG. 20 is a diagram showing an example of a semiconductor module of the present invention.
Figure 21:
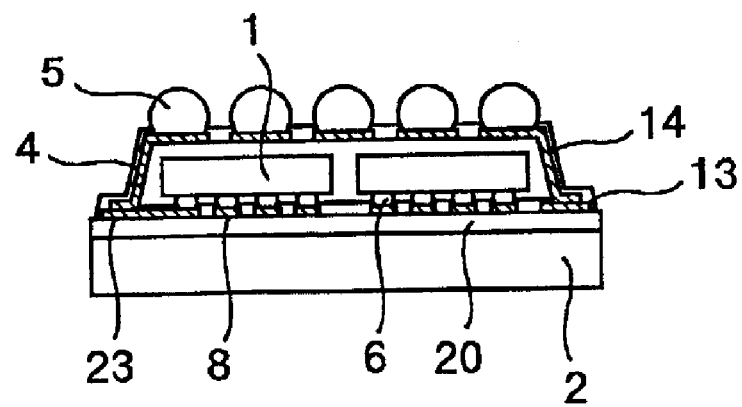
FIG. 21 is a diagram showing an example of a semiconductor module of the present invention.

Referring to FIG. 20, there is shown a perspective view of assistance in explaining a semiconductor module according to another embodiment of the present invention. A semiconductor device 1 is connected to an electrode 9 on a module substrate 2 via a bump 5 on the module substrate 2 on which it is mounted. A stress compliant layer 10 is formed on the semiconductor device 1, a wire 14 extending from an electrode 13 on the module substrate 2 to an electrode 9 for mounting a solder ball are further formed on the stress compliant layer 10, an insulating layer 4 is formed on the stress compliant layer and on wires, electrodes such as 23 which electrically connects a terminal of the semiconductor device to a wire connected to external terminal (solder ball) 5 of the module, or other appropriate portions, and a solder ball 5 is mounted on the electrode 9. In this structure, as shown in the cross section in FIG. 21, the solder ball 5 is mounted on the rear surface of the semiconductor device 1 via the stress compliant layer 10, thereby enabling a reduction of an area in a peripheral portion of the semiconductor device mounting portion, and therefore the semiconductor module can be down-sized.

Figure 22:
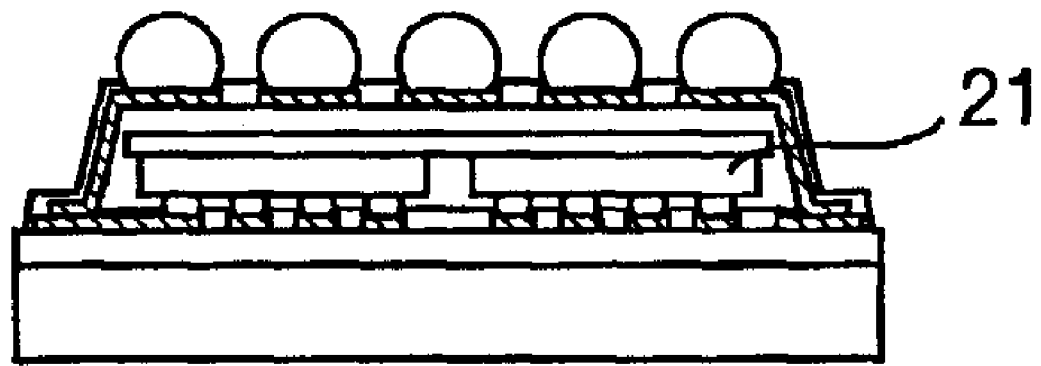
FIG. 22 is a diagram showing an example of a semiconductor module of the present invention.

Referring to FIG. 22, there is shown a sectional schematic view of the semiconductor module having a structure in which an intermediate plate 15 is arranged on the rear surface of the semiconductor device 1 in the semiconductor module in FIG. 20. When semiconductor devices 1 or 21 in FIG. 22, having different heights are mounted on the module substrate 2, the intermediate plate 15 has effects of flattening the solder ball and electrode mounted surface, dispersing heat generated from the semiconductor devices 1 to the side of the solder ball 5 mounted surface of the semiconductor modules, and transmitting it efficiently to an external substrate on which the semiconductor modules are mounted (not shown) via the solder balls 5.

Referring to FIGS. 23A to 23G, there is shown a processes of manufacturing the semiconductor module shown in FIG. 20.

Figure 23A:
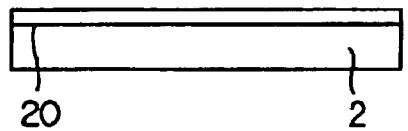
FIGS. 23A, 23B, 23C, 23D, 23E, 23F, 23G are diagrams showing an example of a manufacturing process of the present invention.

Referring to FIG. 23A, there is shown an insulating film 20 on the surface of a base used for the module substrate 2 in the same manner as for the description of the semiconductor module manufacturing process in FIG. 8A. The base used for this module substrate is allowed to have various functions in the same manner as the description of FIG. 8A. In this type of the base, the insulating film 20 is provided with opening portions for connections with wires formed on the substrate, if necessary.

Figure 23B:
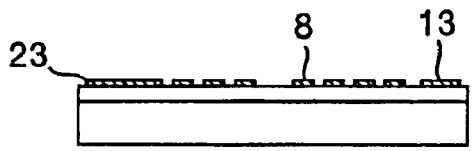
Figure 23C:
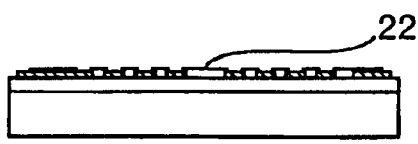

Referring to FIG. 23B, there is shown a process of forming electrodes 8 and wires for mounting the semiconductor devices 1 on the insulating film 20 and electrodes 13, 23 for connections with wires 14 formed on the stress compliant layer 10. This process is also applied to wiring between a plurality of semiconductor devices 1 mounted on the module substrate 2 and to wiring with functioning portions formed on the module substrate 2. Referring to FIG. 23C, an insulating layer is formed so as not to cover the electrodes and wires. If the number of wires is insufficient in a single layer, an insulating layer is formed on the first wiring layer to perform the second layer wiring process. Furthermore, it is possible to form wiring on the third layer by repeating the same process, if necessary.

Figure 23D:
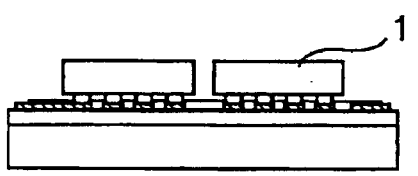

Referring to FIG. 23D, there is shown a process of mounting the semiconductor devices 1 on the electrodes 8 formed on the module substrate 2. The semiconductor devices 1 can be mounted in the same manner as for the semiconductor module manufacturing process in FIG. 8.

Figure 23E:
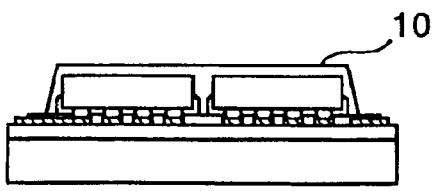
Figure 23F:
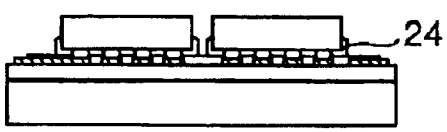

Referring to FIG. 23E, there is shown a process of forming the stress compliant layer 10 over the semiconductor devices 1. A printing mask apertured in the stress compliant layer forming portion is bonded to the module substrate 2 and then the stress compliant layer 10 is formed in the peripheral portion of the semiconductor devices 1 and over the semiconductor devices 1 by using a squeegee. To fill a gap between the semiconductor devices 1 and the module substrate 2 with the stress compliant material, the substrate portion is made vacuous with the printing mask kept to be bonded, by which an air remaining in the gap between the semiconductor devices 1 and the module substrate 2 is removed and the gap is filled with the stress compliant material in a step of resuming the normal pressure. Otherwise, as shown in FIG. 23F, it is also possible to previously fill the gap between the semiconductor devices 1 and the module substrate 2 by using another resin before forming the stress compliant layer.

Figure 23G:
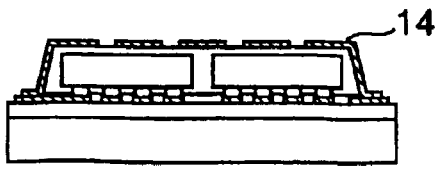

Referring to FIG. 23G, there is shown a formation of wires 14 for connections to the electrodes 13 on the module substrate 2 on the stress compliant layer 10 and electrodes 9 for mounting the solder balls 5.

Figure 24A:
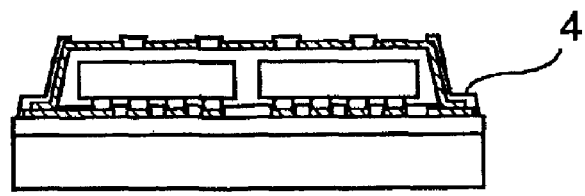
FIGS. 24A, 24B are diagrams showing an example of a manufacturing process of the present invention.
Figure 24B:
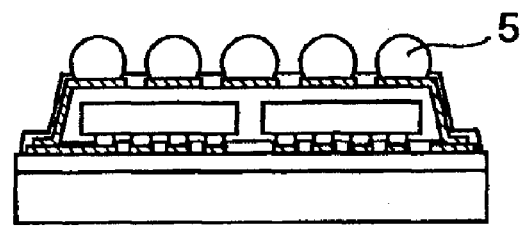

Referring to FIG. 24A, an insulating layer 4 is formed on required portions such as joint portions between the wires 14 formed on the stress compliant layer 10 and the module substrate 2 to protect the wires 14 and the stress compliant layer 10. Subsequently, in FIG. 24B, the solders 5 are mounted on the electrodes 9 formed on the stress compliant layer 10.

A method of forming wires on the stress compliant layer 10 and a method of mounting the solder balls 5 have already been described in the items of the previous embodiment, and therefore they are omitted here.

As shown in the cross section in FIG. 22, if the intermediate plate 15 is provided on the rear surface of the semiconductor devices 1, copper or aluminum, ceramic, stainless or other intermediate plate 15 is bonded via a conductive adhesive or the like made of an epoxy resin, a silicone resin, etc. mixed with thermal conductive particles such as silver or aluminum before the stress compliant layer formation and then the stress compliant layer 10 may be formed in the process shown in FIGS. 23D and 23E.

With the above manufacturing process, the semiconductor module is achieved as shown in FIG. 20 and other diagrams.

Figure 14:
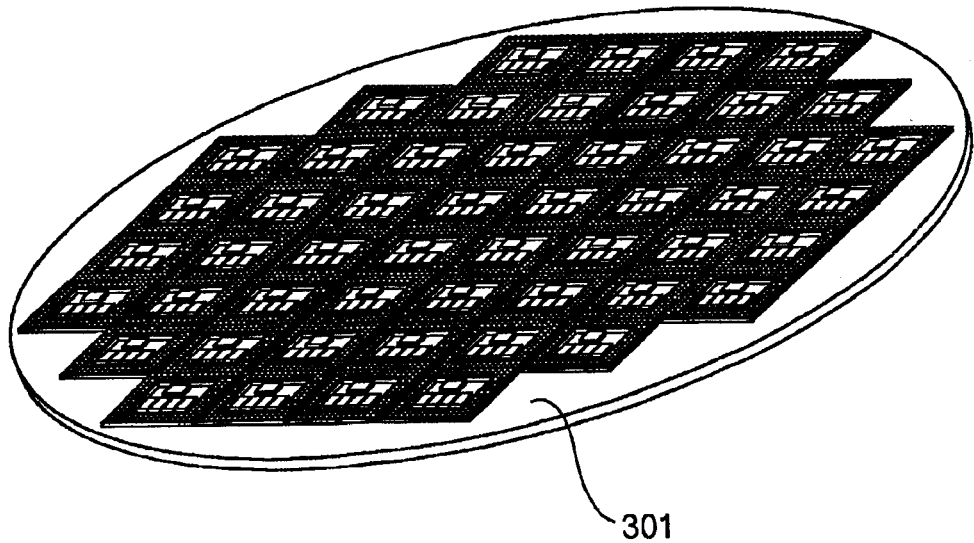
FIG. 14 is a diagram showing an example of a manufacturing process of the present invention.
Figure 15:
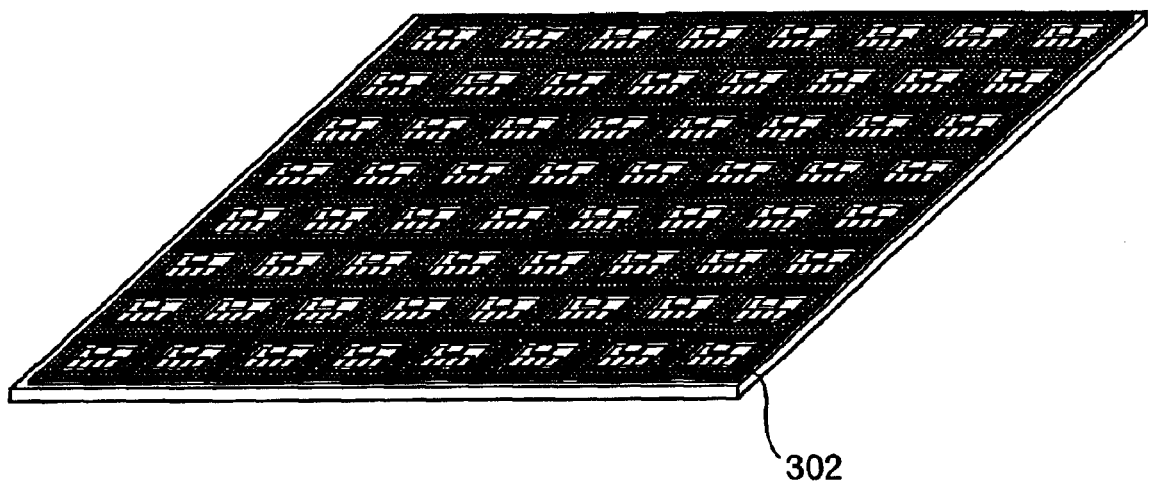
FIG. 15 is a diagram showing an example of a manufacturing process of the present invention.

Next, multicavity conditions for the semiconductor modules are shown in FIGS. 14 and 15.

Referring to FIG. 14, there is shown a multicavity condition with a silicon wafer 301. A plurality of module circuits and a stress compliant layer are formed on the silicon wafer, given semiconductor devices, resistors, and capacitors are mounted, solder balls to be external connection terminals are mounted on the stress compliant layer, and gaps between the semiconductor devices and the substrate are filled with a resin, if necessary. After that, each module part is individually cut out to obtain a desired semiconductor module using the same method as for dicing of a silicone wafer.

Referring to FIG. 15, there is shown a multicavity condition with a glass substrate or a ceramic substrate 302. Also in this case, in the same manner as with the silicon wafer, a plurality of module circuits and a stress compliant layer are formed on the glass substrate or the ceramic substrate, given semiconductor devices, resistors, and capacitors are mounted, solder balls to be external connection terminals are mounted on the stress compliant layer, and gaps between the semiconductor devices and the substrate are filled with a resin, if necessary. After that, each module part is individually cut out to obtain a desired semiconductor module by using the same method as for dicing of a silicone wafer.

In general, gaps between the semiconductor devices 1 and the module substrate 2 are filled with underfill to improve the connection reliability because of a difference of a thermal expansion coefficient. In such a method that a resin to be underfill is previously applied and then the semiconductor devices are mounted for connections, however, there is a need for applying a pressure to the semiconductor devices at mounting to secure connections between electrodes. The module substrate is made of glass or silicon and a pressure is applied to each in the multicavity condition (wafer condition), thereby requiring too much strength of the module substrate (glass, silicon) and causing an increase of the cost. Furthermore, it is necessary to wait for the underfill to be hardened to some extent while the pressure is applied and therefore it is undesirable from a viewpoint of a manufacturing tact. Therefore, it is preferable to use a method in which gaps with the module substrate are filled with underfill after mounting the semiconductor devices instead of previously applying the underfill. It is not easy, however, to fill the gaps of a plurality of semiconductor modules with the underfill in the multicavity condition (wafer condition) and further the filling with the underfill is difficult when a narrower pitch is applied to the electrodes of the mounted semiconductor devices. Accordingly, there are shown semiconductor module structures securing the connection reliability without a need for the underfill in FIGS. 29 to 31.

Figure 29:
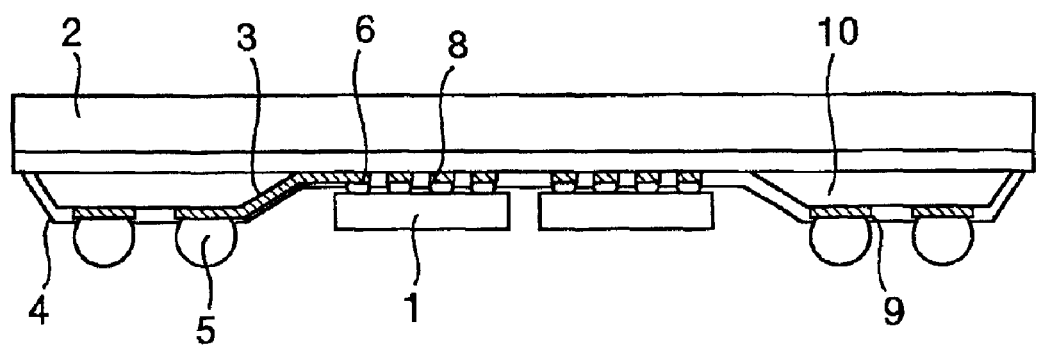
FIG. 29 is a diagram showing an example of a semiconductor module of the present invention.

Referring to FIG. 29, there is shown a structure in which semiconductor chips are used for the semiconductor devices 1 and a silicon substrate is used for the module substrate 2. Other components are the same as for those in FIG. 1. Both of the silicon substrate and the semiconductor chips have a circuit on the silicon and their thermal expansion coefficients are equal to each other, and therefore there is no need for filling the gaps between the semiconductor devices 1 and the module substrate 2 with the resin 12 for a stress relaxation.

Figure 30:
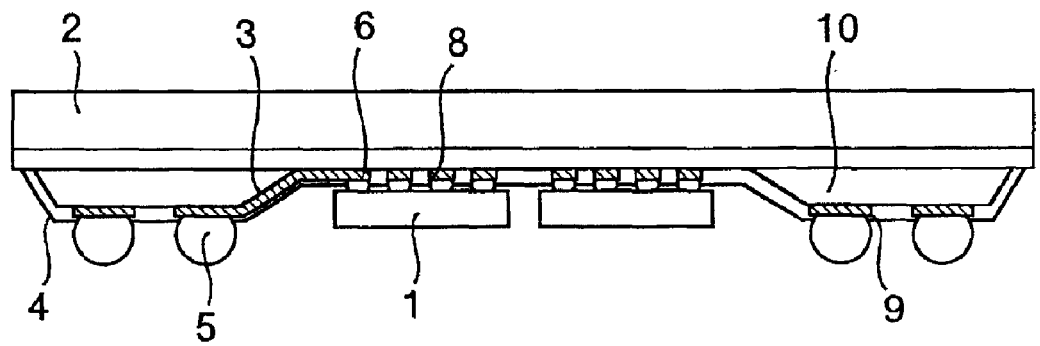
FIG. 30 is a diagram showing an example of a semiconductor module of the present invention.

Referring to FIG. 30, there is shown a structure in which a glass substrate is used for the module substrate 2; semiconductor devices 1 with the stress compliant layer are mounted on the substrate to absorb a difference of the thermal expansion coefficient. Other components are the same as those in FIG. 1.

Figure 31:
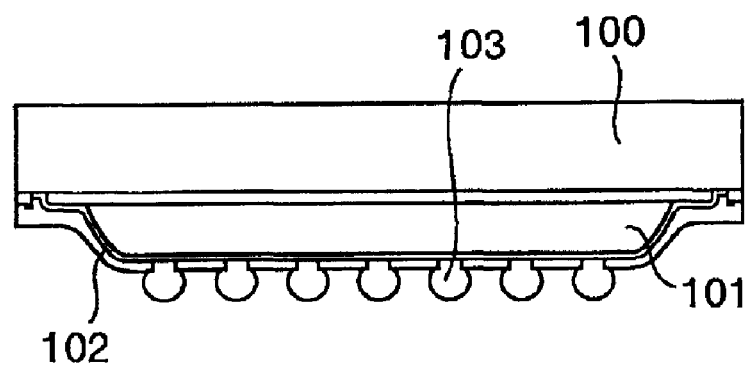
FIG. 31 is a diagram showing an example of a semiconductor device for use in a semiconductor module of the present invention.

Referring to FIG. 31, there is shown an example of a semiconductor device with the stress compliant layer. The stress compliant layer 101 is formed on the semiconductor chip 100 and there is formed a wire 102 on it to electrically connect a terminal of the semiconductor chip 100 to solder bumps 103 to be external connection terminals. The stress compliant layer formed on this semiconductor device absorbs dimensional change so as to improve the connection reliability.

Figure 32:
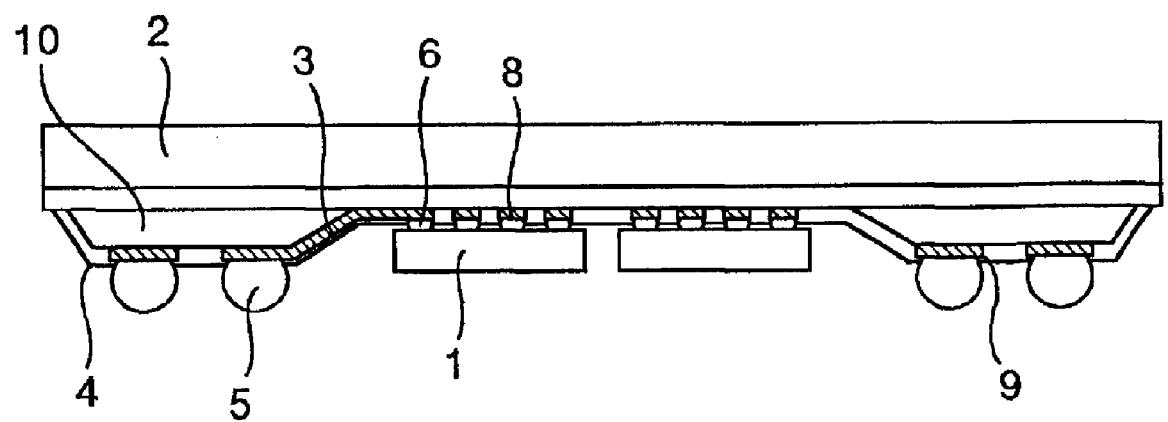
FIG. 32 is a diagram showing an example of a semiconductor module of the present invention.

Referring to FIG. 32, there is shown a structure in which a glass substrate is used for the module substrate 2 and a stress compliant layer is further formed on each mounting area of the semiconductor devices to absorb a difference of the thermal expansion coefficient. Other components are the same as those in FIG. 1. In this diagram, a first stress compliant layer is formed on an insulating film layer 20 formed on the glass substrate 2 and then a frame-shaped second stress compliant layer 10 as shown in FIG. 1 is formed on it. A wire 3 and electrodes 8 are formed on the first stress compliant layer.

If the semiconductor devices 1 are mounted on the module substrate 2 using the silicon substrate or if a stress compliant layer is formed on the semiconductor device 1 or a stress compliant layer is formed on each semiconductor device mounting area of the module substrate 2 in this manner, there is no need for filling gaps between the semiconductor devices 1 and the module substrate 2 with the resin 12 because of almost equal thermal expansion coefficients in the former and of a presence of the stress compliant layer in the latter.

The gaps, however, need be filled with the resin 12 to improve a humidity resistance or a shock resistance. A conventional resin used for stress relaxation is not capable of sufficiently filling the gaps between the semiconductor devices 1 and the module substrate 2 when the bumps on the semiconductor devices are arranged at a narrow pitch. It is because filler is mixed in the resin to relax the stress generated in the joint portions. Therefore, it is resolved by using a material having a low elastic modulus which does not include any filler. For example, a gel resin or stress compliant material is used. It increases a flowability of the resin 12, thereby sufficiently filling the gaps between the semiconductor devices 1 and the module substrate 2. Even if the increased flowability causes the resin to spread over areas other than the semiconductor device mounting area, the frame-shaped stress compliant layer can act as a role of a dam and therefore there is no problem on it.

As set forth hereinabove, external connection terminals are formed via an elastic material layer having a given or more thickness, by which the stress can be relaxed with securing a height of the external connection terminals, thereby realizing a semiconductor module superior in the connection reliability with the external substrate. In addition, the semiconductor devices 1 are electrically connected to the external connection terminals 5 only by forming wires 3 formed on the module substrate 2, by which there is no need for through-holes for a vertical connection required for a module in which semiconductor devices are mounted on the upper surface of the module substrate and external connection terminals are formed on the lower surface of the module substrate. Considering a possibility that a narrower pitch is applied to the wire pitch in future, the electrical connection with through-holes is unsuitable. For example, decreasing a diameter of the through-holes for fine through-holes generates a high-aspect structure. In this structure, however, it is hard to plate the inside of the through-holes like the conventional one. It is apparently not easy even if consideration is given only to the microfabrication (coring). Therefore, this structure is very effective for a future tendency of adopting a narrow wire pitch since the electrical connection is achieved only a formation of the wires 3 in this structure.

To improve a mounting density, however, it is also possible to apply such a structure that in the structure set forth in the above semiconductor devices are further mounted on a surface having no external connection terminals of the module substrate and through-holes are formed on the module substrate to secure the electrical connection with the external connection terminal. In other words, the semiconductor devices are mounted on both sides of the module substrate and a stress compliant layer is put between them on the side where the external connection terminals are arranged. In this structure, it is preferable to use a circuit board such as a build-up substrate or a metal core substrate including a metal as a module substrate.

The present invention is not limited to the above embodiments, but applicable to various alternatives within the spirit and scope thereof. For example, while there has been described an example that the low elastic modulus stress compliant layer 10 is previously formed on the semiconductor module in the above embodiments, the stress compliant layer 10 can be formed on the external substrate 15 as shown in FIG. 27, besides the semiconductor module. In addition, it can be arranged on both of the semiconductor module and the external substrate 15.

Subsequently, as an embodiment of a method of manufacturing a semiconductor device and a semiconductor module, the present invention is described below by giving an example of using a-mold by using FIG. 33 to FIG. 44.

Figure 33:
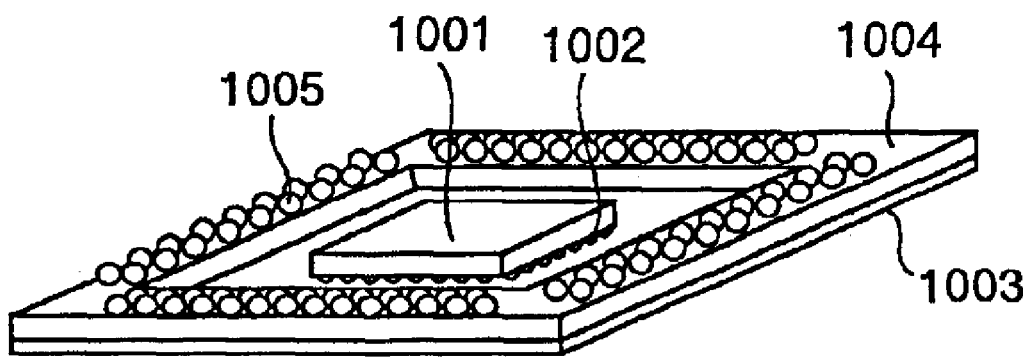
FIG. 33 is a schematic perspective view showing a first embodiment of a semiconductor device or a semiconductor module.
Figure 34:
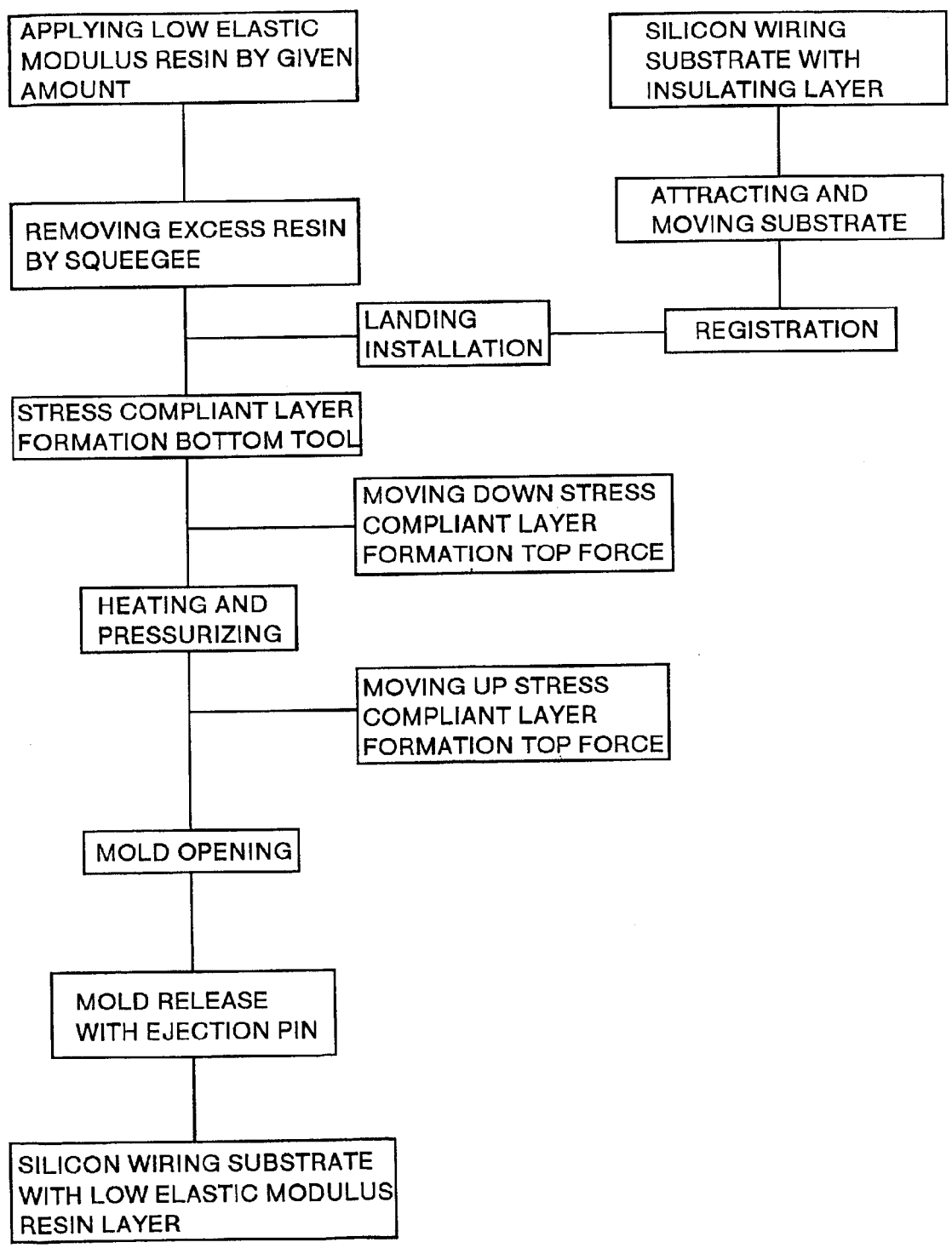
FIG. 34 is a flowchart showing a first embodiment of a manufacturing method of a semiconductor device or a semiconductor module.

Referring to FIG. 34, there is shown a flowchart illustrating an embodiment of a method of manufacturing a semiconductor device and a semiconductor module according to the present invention, summarizing a manufacturing process of a silicon wiring substrate with a stress compliant layer 4 1004 shown in FIG. 33. Hereinafter, respective steps in FIG. 33 will be described by using FIG. 34 to FIG. 44 and a description is given first about a method of forming the stress compliant layer 4 1004 by using FIG. 34 to FIG. 40.

In this embodiment of the manufacturing method, a plurality of semiconductor chips are formed into a circuit at a time. Although semiconductor devices and semiconductor modules are completed by mounting the semiconductor chips 1001 and the silicon wiring substrate 1003, the semiconductor chips 1001 are general ones here and therefore a description of the manufacturing process is omitted here. For a formation of a projecting electrode 1002 and an external connection terminal 1005, any of a printing method, a ball transfer method, a bonding wire method, etc. can be used and the method is not particularly limited. In addition, for an arrangement of the projecting electrode 1002, any of a peripheral arrangement, a lattice pattern arrangement, a zigzag arrangement, etc. can be used and the arrangement method is not particularly limited. Furthermore, a material of the projecting electrode 1002 is not limited.

As a method of forming a stress compliant layer 1004 on the silicon wiring substrate 1003, there are a printing method, a casting method, a direct drawing method, and a method of forming a stress compliant layer on another substrate and transferring or pasting it. In this embodiment, a low elastic modulus resin is cast in a cavity portion of the mold.

Figure 35A:
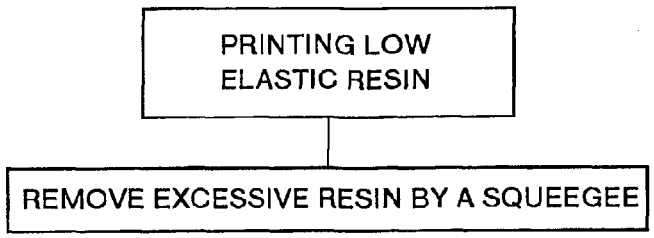
FIGS. 35A, 35B, 35C are diagrams showing a concrete example of a bottom tool for a stress compliant layer formation used when manufacturing a semiconductor or a semiconductor device module and a part of a manufacturing process of the semiconductor device or the semiconductor module using it.
Figure 35B:
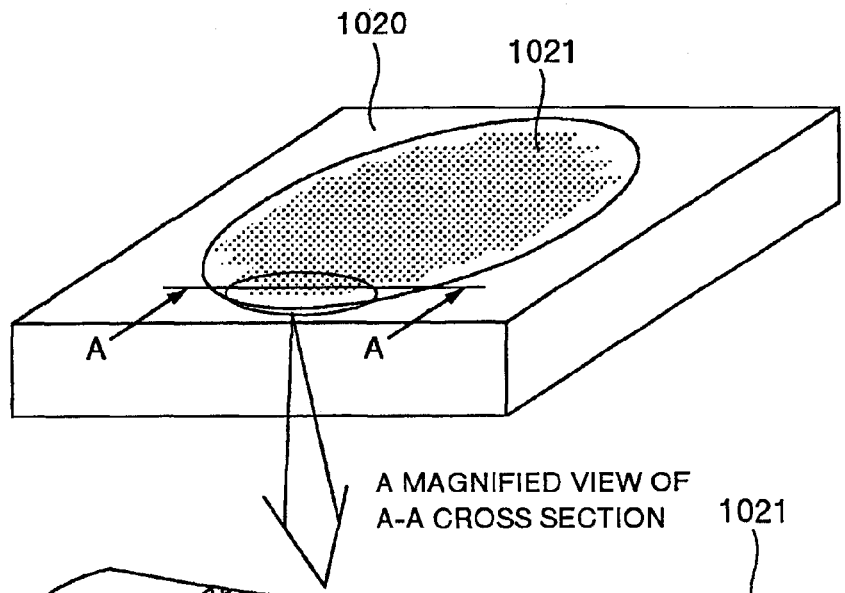
Figure 35C:
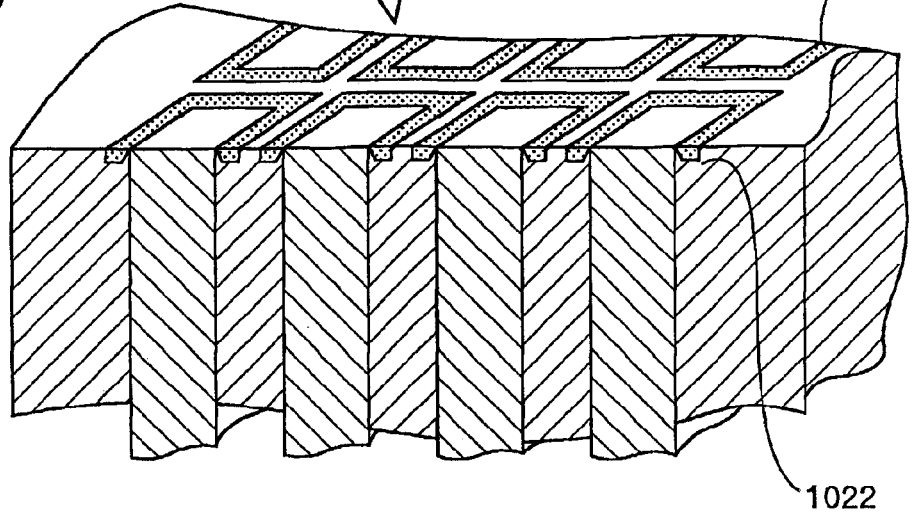

Referring to FIGS. 35A, 35B, 35C, there are shown an explanatory diagram of a portion of the manufacturing process in FIG. 34, showing a perspective view of a stress compliant layer formation bottom tool; FIG. 35B is an entire diagram and FIG. 35C is a partially sectional view taken on division line A—A of FIG. 35B. Reference numerals 1020, 1021, and 1022 designate a stress compliant layer formation bottom tool, a low elastic modulus resin, and a stress compliant layer formation cavity.

In these diagrams, there are provided a plurality of stress compliant formation cavities 1022 having shapes of rectangle frames as shown in FIG. 35C on the surface of the stress compliant formation bottom tool 1020, the low elastic modulus resin 1021 is injected into the stress compliant layer formation cavities 1022 by applying the low elastic modulus resin 1021 to the surface of the stress compliant layer formation bottom tool 1020 by a given method as shown in FIG. 35A. Afterward, excess low elastic modulus resin 1021 is removed by using a squeegee (now shown).

Figure 36A:
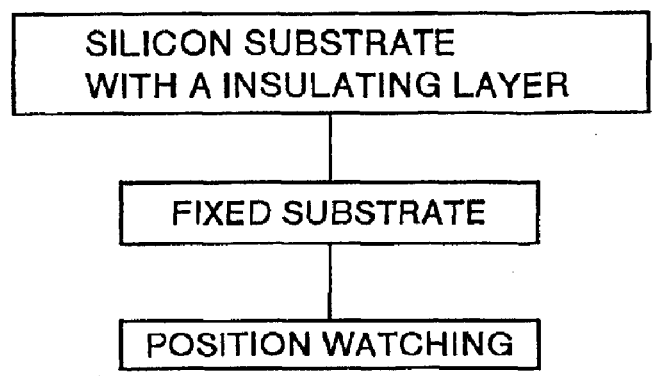
FIGS. 36A, 36B are diagrams showing a part of a manufacturing process of a semiconductor device or a semiconductor module.
Figure 36B:
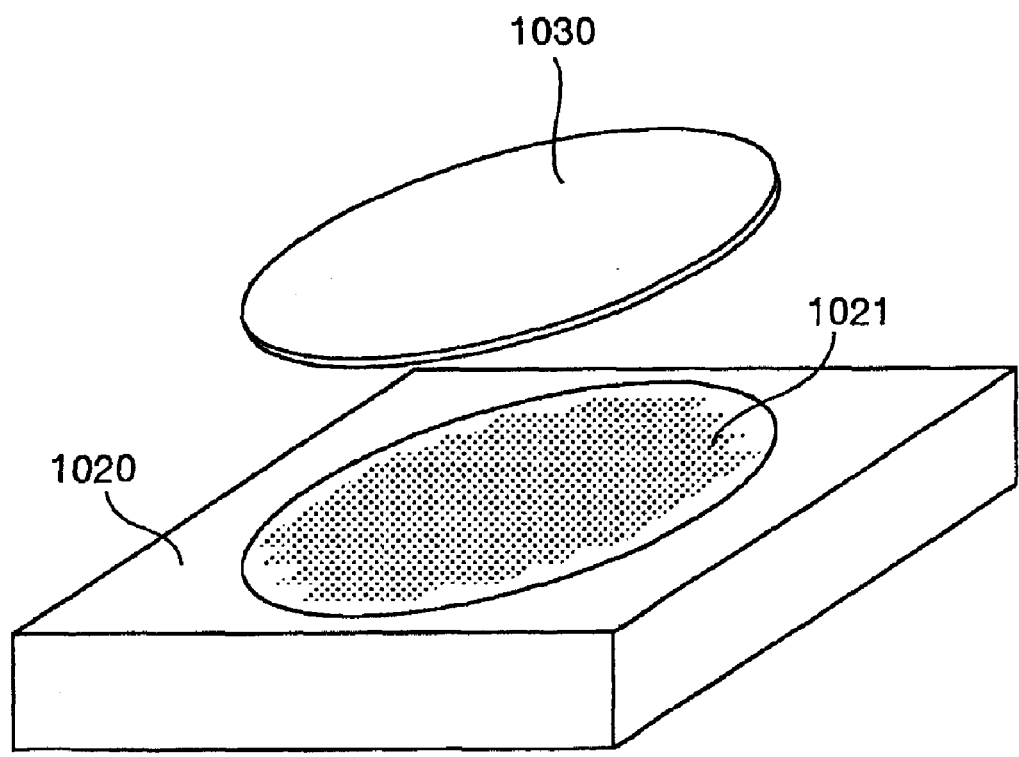

Referring to FIGS. 36A, 36B, there are shown an explanatory diagram of a part of the manufacturing process in FIG. 34 and also a perspective view directed thereto showing a condition in which a silicon wiring substrate 1003 with an insulating layer is arranged over the stress compliant formation bottom tool 1020. The reference numeral 1030 designates a silicon wiring substrate with an insulating layer.

In this diagram, the silicon wiring substrate 1030 with the insulating layer is absorbed by using an absorption jig (not shown) so as to be moved toward the stress compliant formation bottom tool 1020. Afterward, a registration is performed for both and the silicon wiring substrate 1030 is landed and bonded to the stress compliant layer formation bottom tool 1020.

Figure 37A:
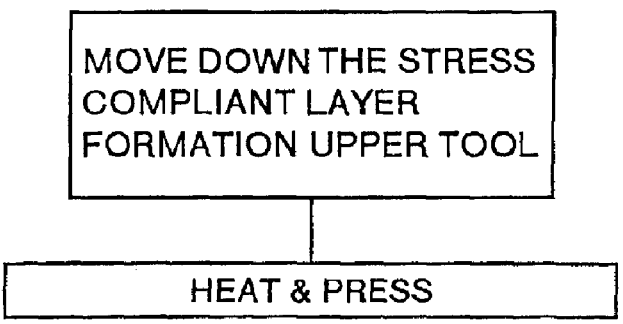
FIGS. 37A, 37B are diagrams showing a part of a manufacturing process of a semiconductor device or a semiconductor module.
Figure 37B:
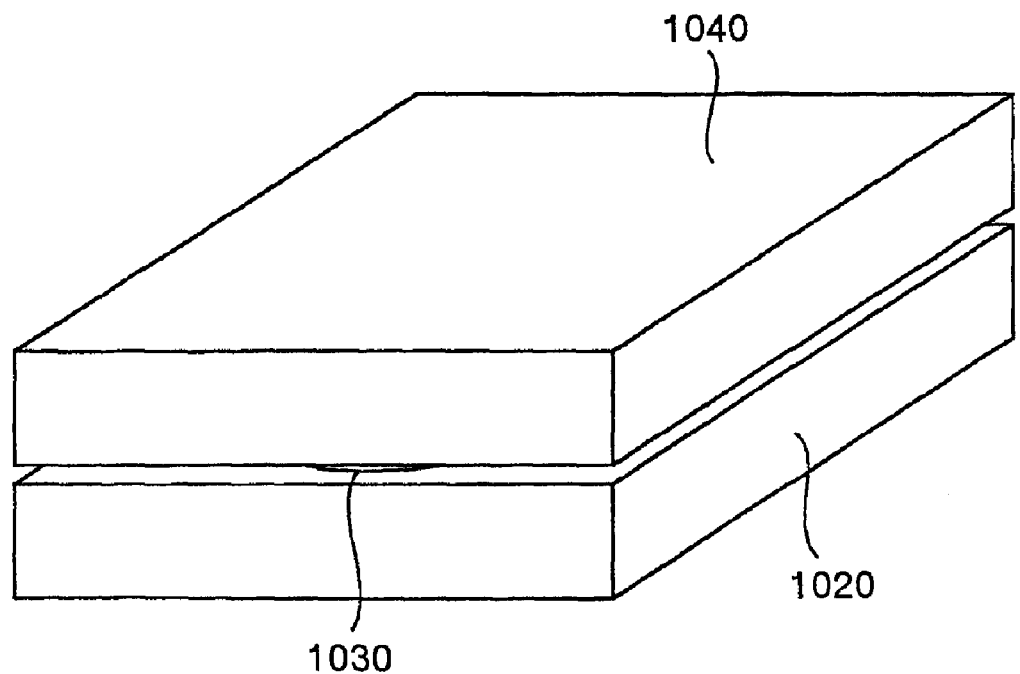

Referring to FIGS. 37A, 37B, there are shown an explanatory diagram of a part of the manufacturing process in FIG. 34 and also a perspective view directed thereto illustrating a condition in which the silicon wiring substrate 1030 is pressed by a stress compliant layer formation top force. The reference numeral 1040 designates the stress compliant layer formation top force.

In this diagram, the silicon wiring substrate 1030 is arranged on the stress compliant layer formation bottom tool 1020 and then the stress compliant layer formation upper force 1040 is landed on the stress compliant layer formation bottom tool 1020 (mold closure), thereby pressing and heating the silicon wiring substrate 1030 to harden the low elastic modulus resin 1021 (FIG. 35, FIG. 36). While this heating is performed by heaters (not shown) arranged on the bottom tool 1020 and the top force 1040, apparently there is no problem in using a heating method such that the bottom tool 1020 and the top force 1040 are constantly heated at a given temperature or that they are heated after the mold closure).

As a resin for a formation of the stress compliant layer 1004 in FIG. 33, it is preferable to use a resin having a low elastic modulus of approx. 0.1 to 10 GPa made by modifying the polyimide resin with a silicon resin. It is, however, an example and, therefore, any of other resins are applicable only if it has a high heat resistance and a low elastic modulus and the resin for a formation of the stress compliant layer 1004 is not limited.

Figure 38A:
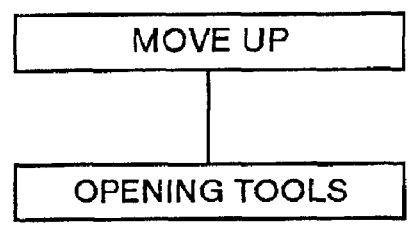
FIGS. 38A, 38B are diagrams showing a part of a manufacturing process of a semiconductor device or a semiconductor module.
Figure 38B:
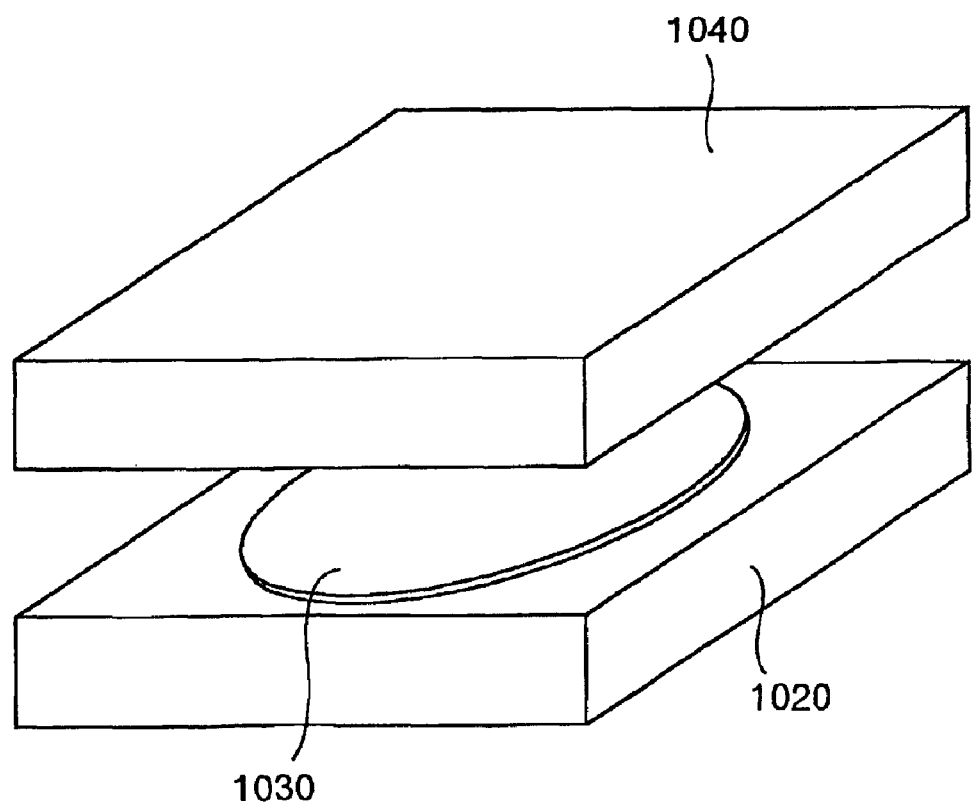

Referring to FIGS. 38A, 38B, there are shown explanatory diagrams of a part of the manufacturing process in FIG. 34.

In this diagram, after the low elastic modulus resin 1021 is hardened by the pressurizing and heating for a predetermined period of time, the stress compliant layer formation top force 1040 is moved upward for mold opening.

Referring to FIGS. 39A, 39B, 39C, 39D, there are shown an explanatory diagram of a part of the manufacturing process and also a perspective view directed thereto illustrating a process of releasing the hardened low elastic modulus resin 1021 from the stress compliant layer formation bottom tool 1020. In this diagram, there are shown ejection pins 1050, fixed portions 1051 and 1052, and a stress compliant layer forming portion 1005.

Figure 39A:
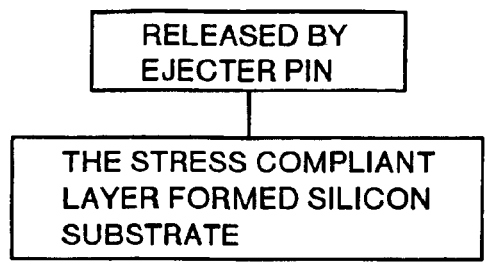
FIGS. 39A, 39B, 39C, 39D are diagrams showing a part of a manufacturing process of a semiconductor device or a semiconductor module.
Figure 39B:
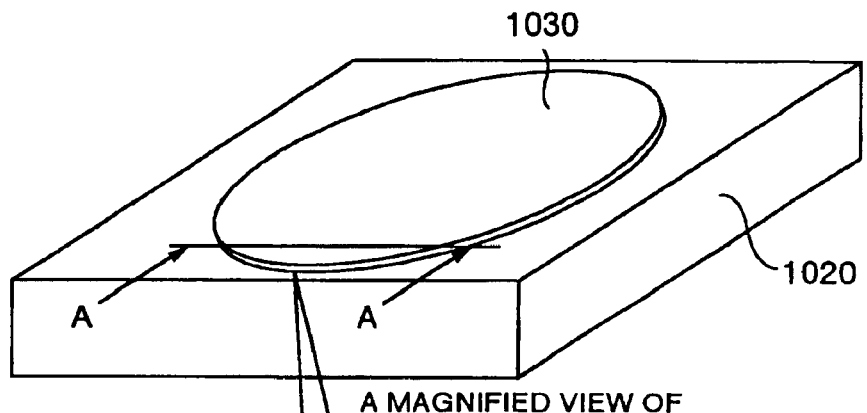

Referring to FIG. 39B, there is shown a condition after the mold opening shown in FIG. 38, the low elastic modulus resin 1021 is hardened on a surface on an opposite side of the shown surface of the silicon wiring substrate 1030, thereby forming the stress compliant layer 1004. The silicon wiring substrate 1030 on which the stress compliant layer 1004 is formed in this manner is released from the stress compliant layer formation bottom tool 1020. The stress compliant layer formation bottom tool 1020 has the ejection pins 1050 as shown in FIG. 39C, by which the silicon wiring substrate 1030 can be released from the stress compliant layer formation bottom tool 1020.

In other words, the stress compliant layer formation bottom tool 1020 is provided in the fixed portion 1051 with movable ejection pins 1050 in a vertical direction (up and down) on a surface of the stress compliant layer formation bottom tool 1020 relative to the fixed portion 1051, and the ejection pins 1050 are arranged inside each stress compliant layer formation cavity 1022 (FIG. 35), in other words, the stress compliant layer formation cavity 1022 is formed in the fixed portion 1051 and the ejection pin 1050 is located in a position enclosed by the stress compliant layer formation cavity 1022.

Figure 39C:
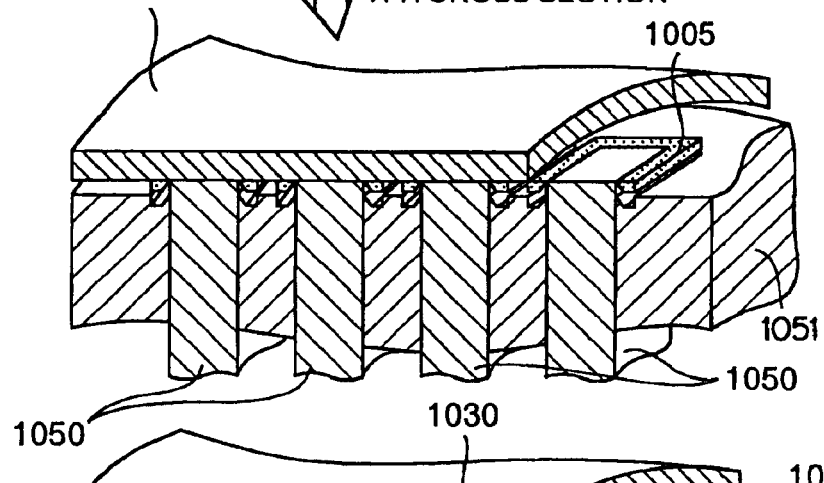

While the upper surface of the ejection pin 1050 is on the same level as the upper surface of the fixed portion 1051 in the processes shown in FIG. 35 to FIG. 38 for forming the stress compliant layer 1004, the ejection pins 1050 are pushed up to the fixed portion 1051 as shown in FIG. 39C at releasing the silicon wiring substrate 1030 on which the stress compliant layer 1004 is formed from the stress compliant layer formation bottom tool 1020. This causes the silicon wiring substrate 1030 to be pushed up by the ejection pins 1050, by which the stress compliant layers 1004 are released from the stress compliant layer formation cavities 1022. It completes the mold release, thereby obtaining the silicon wiring substrate 1030 on which a plurality of stress compliant layers 1004 are formed.

Figure 39D:
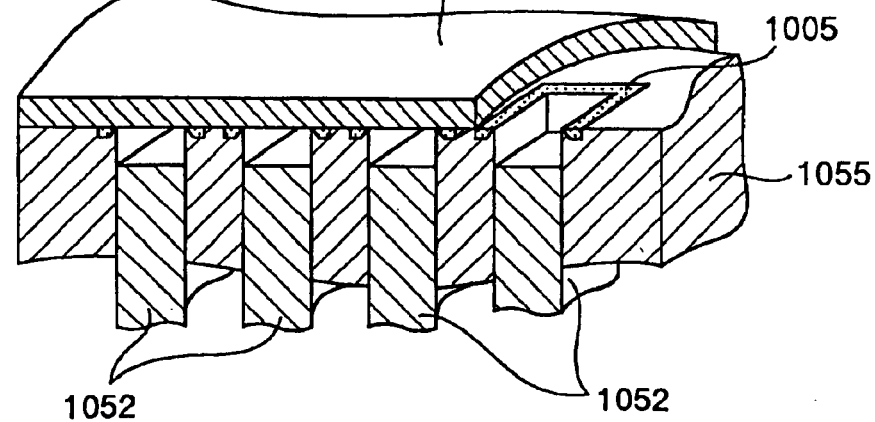

Referring to FIG. 39D, there is shown a process of a mold release using a stress compliant layer formation bottom tool 1020 having another structure, wherein an ejecting portion 1055 is a part equivalent to the fixed portion 1051 in FIG. 39C in which the stress compliant layer formation cavity 1022 is formed and a fixed portion 1052 is a part equivalent to the ejecting portion 1050 in FIG. 39C inside the stress compliant layer formation cavity 1022 and therefore the stress compliant layers can be released by pushing up the ejecting portion 1055 to the fixed portion 1052. In this case, after pushing up the ejecting portion 1055, the silicon wiring substrate 1030 is peeled off the ejecting portion 1055.

Referring to FIG. 40B, there is shown a perspective view of the entire silicon wiring substrate 1030 having the stress compliant layers 1004 obtained as set forth in the above, and referring to FIG. 40C, there is shown an enlarged partial cross section taken on a division line A—A of FIG. 40B.

As shown in FIGS. 40B and 40C, a plurality of frame-shaped stress compliant layers 1004 are formed on the silicon wiring substrate 1030. A preferable thickness of the stress compliant layer 1004 in this method is considered to be 0.1 to 0.8 mm.

If components mounted on the wiring substrate 1003 are semiconductor chips 1001, the minimum thickness of the stress compliant layer 1004 is equal to a thickness of the semiconductor chip 1001 plus that of a projecting electrode 1002. For example, if the thickness of the semiconductor chip 1001 is 0.3 mm and that of the protruding electrode 1002 is 0.05 mm, the minimum thickness of the stress compliant layer 1004 is 0.35 mm. If a plurality of components are mounted on this wiring substrate 3, naturally the thickness of the highest component at mounting is considered to be the minimum thickness of the stress compliant layer 1004. In other words, the thickness of the thickest component determines the thickness of the stress compliant layer 1004 independently of an external size of the wiring substrate 1003 only from a viewpoint of a thickness of the mounted components. Generally the semiconductor chip having a size of 0.1 to 0.3 mm is used as the semiconductor chip 1001 mounted on the wiring substrate 1003, and therefore the minimum thickness 0.15 mm of the stress compliant layer 1004 is obtained by adding a thickness of the projecting electrode 1002 to the size.

On the other hand, from a viewpoint of a material composing the stress compliant layer 1004, a low elastic modulus material is effective as a result of various experiments and a material having an elastic modulus of 0.1 to 10 GPa at a room temperature is capable of constituting a reliable semiconductor device and a semiconductor module. If the stress compliant layer 1004 is made of a material having an elastic modulus lower than 0.1 GPa, it becomes hard to endure a weight of the MCM itself, thereby easily causing such a problem that the characteristics are unstable in use. If the stress compliant layer 1004 is made of a material having an elastic modulus higher than 10 GPa, the wiring substrate 1003 is warped by an internal stress of the material, by which there is a possibility of an occurrence of out-of-focusing in an exposure process at a wiring formation or of a crack of the wiring substrate.

Subsequently, a description is given below about a manufacturing process of forming electrical wiring on the silicon wiring substrate 1030 obtained as described above by using FIG. 41 to FIG. 44. FIG. 41 to FIG. 43 are shown for a portion B in FIG. 40C.

Referring to FIGS. 41A, 41B, 41C, 41D, 41E, there are shown a process diagrams of a first process covering a formation of a metal layer A to a reverse pattern of the electrical wiring on the silicon wiring substrate 1030 shown in FIG. 40.

[Formation of metal layer A] (FIG. 41B): First, a metal layer A 1060 is formed for an arrangement of the electrical wiring on the entire silicon wiring substrate 1030 including a surface of the stress compliant layer 1004.

[Formation of metal layer B] (FIG. 41C): Next, a metal layer B 1061 is formed on the entire metal layer A 1060. The metal layer B 1061 works as a power supply layer at electroplating in the post-process.

As a combination of the metal layer A 1060 and the metal layer B 1061, chrome is used for the metal layer A 1060 and copper is used for the metal layer B 1061 for the formation. A sputtering technology is used for the formation, using chrome having a 75 nm thickness as the metal layer A 1060 and copper having a 0.5 μm thickness as the metal layer B 1061. A function of the chrome is to secure bonding of the materials located in the top and bottom portions of the chrome and its film thickness can be the minimum capable of maintaining the bonding. A required thickness depends upon conditions of the sputtering etching or sputtering and a film quality of the chrome.

In this embodiment, there is no problem when using titanium, titanium/platinum, or tungsten instead of the chrome. Additionally, as a formation method, it is possible to use deposition, copper electroless plating, or CVD. In this case, a preferable thickness of the metal layer B 1061 is the minimum one which does not cause a film thickness distribution after copper electroplating or a nickel electroplating to be performed in the post-process and a film thickness not causing the film thickness distribution is determined with taking into consideration a film wastage amount in acid washing performed as a plating pre-process. If the film of the copper is thicker than is necessary, for example, if the film thickness of the copper exceeds 1 μm, there is a problem of a reduction of the production efficiency due to a long sputtering time. Furthermore, it takes a long time for an etching removal of the metal layer A 1060 and the metal layer B 1061 to be performed in a later process, by which it may cause a reduction of the production efficiency.

[Resist coating] (FIG. 41D): Next, photosensitive resist 1062 is applied to an entire surface of the metal layer B 1061 under predetermined conditions by a spin coat method in order to form the electrical wiring.

[Wiring pattern formation] (FIG. 41E): Subsequently, the photosensitive resist 1062 is removed only in a portion where the electrical wiring is formed by using a photolithography technology (exposure, development) to form a reverse pattern 1063 of the electrical wiring with the metal layer B 1061 exposed.

The thickness of the stress compliant layer 1004 is set according to a height of each component including the semiconductor chips 1001 (FIG. 1) mounted on the silicon wiring substrate 1030, in other words, so that no component protrudes upwardly exceeding the stress compliant layer 1004. In this embodiment, the thickness of the stress compliant layer 1004 is set to approx. 0.5 mm. Regarding an exposing method for sensitization or exposure of the photosensitive resist 1062, there is a step due to a formation of the stress compliant layer 1004 and there is a need for forming the electrical wiring also in a slant portion 1007 of the step, and therefore the reverse pattern 1063 is formed by direct drawing with a laser light or using an exposing device capable of moving a focal length. If the step is small, apparently it can be formed by an exposing method in a contact method.

Figure 41A:
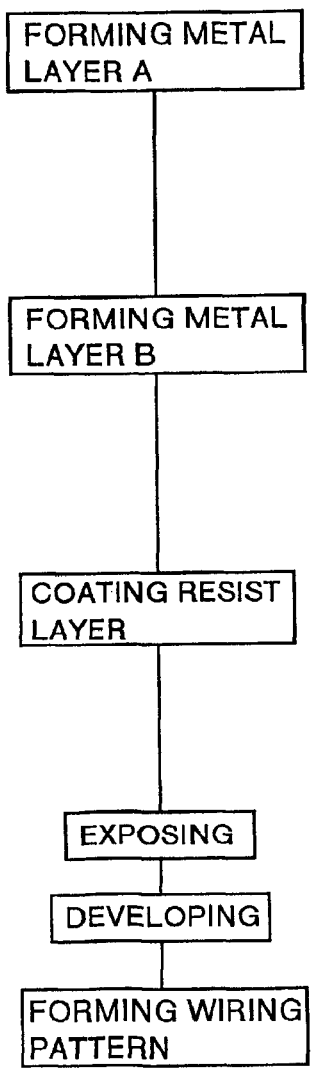
FIGS. 41A, 41B, 41C, 41D, 41E are process drawings showing a first process for forming electric wiring on the silicon wiring substrate.
Figure 41B:
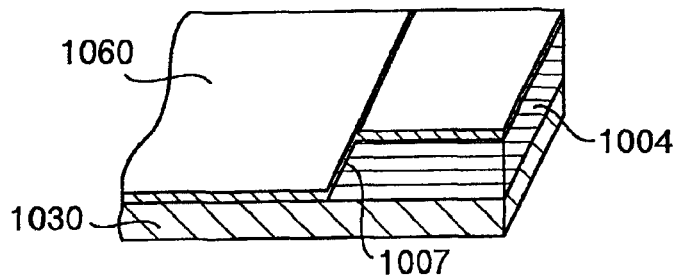
Figure 41C:
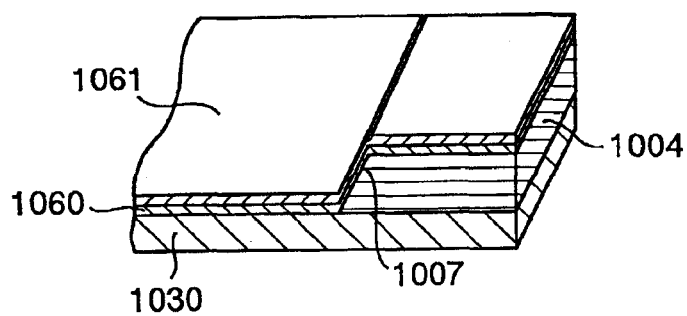
Figure 41D:
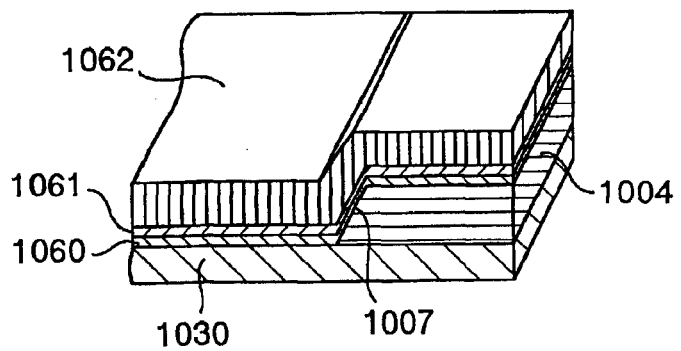
Figure 41E:
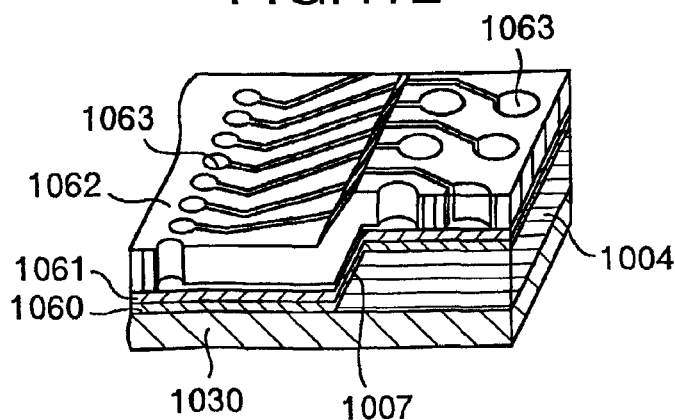
Figure 43A:
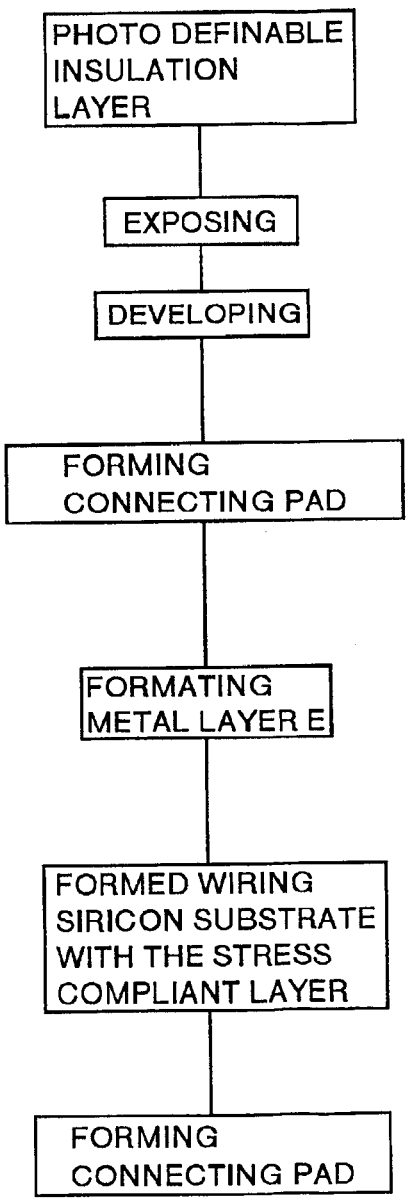
FIGS. 43A, 43B, 43C, 43D, 43E are process drawings showing a third process following the second process shown in FIG. 42.
Figure 43B:
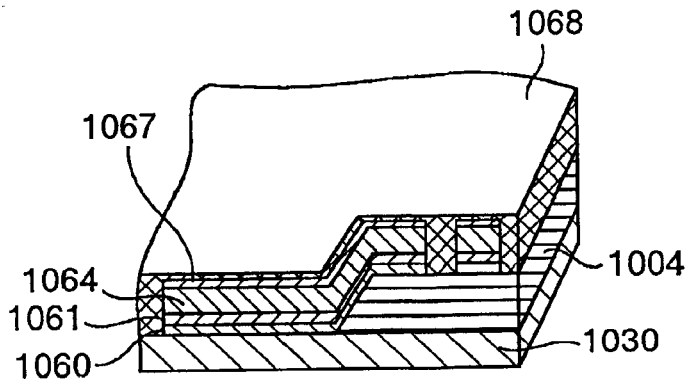
Figure 43C:
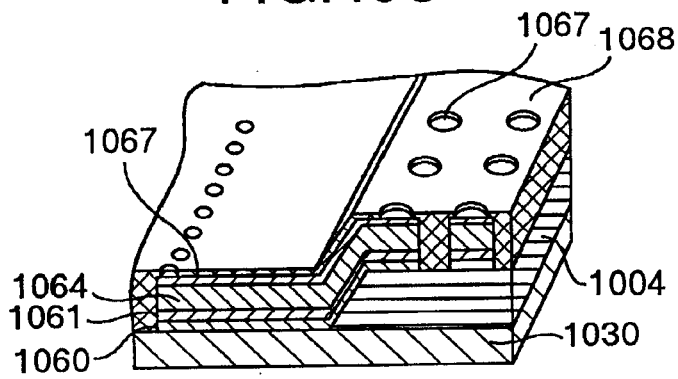
Figure 43D:
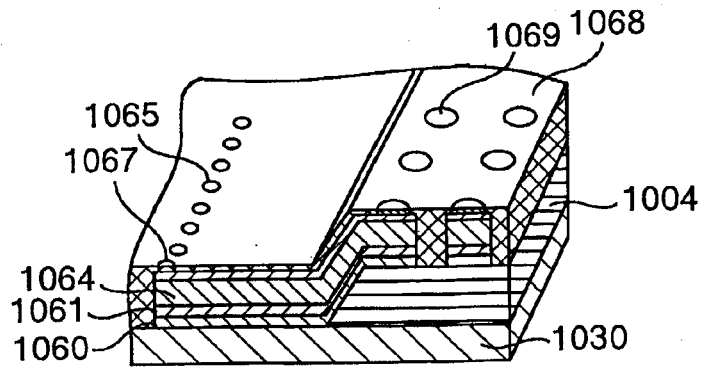
Figure 43E:
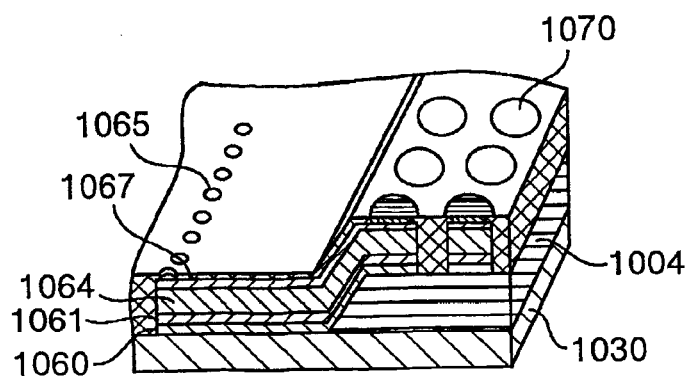

Referring to FIGS. 42A, 42B, 42C, 42D, 42E, there are shown process diagrams of a second process covering a formation of a metal layer C of a film thickness in a condition shown in FIG. 41E to etching of the above metal layer A and the metal layer B following the first process shown in FIG. 41.

[Formation of thick film metal layer C] (FIG. 42B): Electroplating is performed by using the metal layer 1060, the metal layer B 1061, and the reverse pattern 1063 of the electrical wiring to form semiconductor chip mounting pads 1065 and external terminals 1066 with a metal layer C 1064 in the reverse pattern 1063. The metal layer C 1064 is formed with copper electroplating by cleaning and rinsing with a surface active agent by using sulfuric acid and copper sulfate plating solution and cleaning and rinsing with dilute sulfuric acid and then connecting the metal layer A 1060 and the metal layer B 1061 to a cathode and a copper plate to an anode including phosphorus.

[Formation of metal layer D] (FIG. 42C): Furthermore, to prevent a solder diffusion at a joint in the semiconductor chip mounting pads 1065 and the external terminals 1066, a metal layer D 1067 is formed on the thick film metal layer D 1064. This metal layer D 1067 is formed with nickel electroplating by connecting the metal layer A 1060 and the metal layer B 1061 to a cathode and connecting a nickel plate to an anode. In some cases, a nickel electroplating film having a favorable film quality may be achieved by cleaning and rinsing with a surface active agent and cleaning and rinsing with dilute sulfuric acid before the nickel electroplating.

While there has been shown a method of forming a conductor by using the copper or nickel electroplating, it is also possible to use electroless plating. In addition, the electrical wiring can include gold or silver besides copper, and the solder diffusion preventive film can be a nickel alloy.

[Resist removal] (FIG. 42D): The reverse pattern 1063 of the electrical wiring made of photosensitive resist and metal layer A 1060 and the metal layer B 1061 used for supplying power for the electroplating are removed by an etching process. The photosensitive resist is removed by using a stripping agent exclusively used for resist.

[Etching of metal layers A and B] (FIG. 42E): Subsequently, the metal layer A 1060 and metal layer B 1061 are removed by etching. This generates the semiconductor chip mounting pads 1065, the external terminals 1066, and electrical wiring 1006 connecting these. If the metal layer B is made of copper, ferric chloride, alkaline etching solution or the like are used for the etching, while there is used an etching solution including a sulfuric acid/hydrogen peroxide solution as the main component in this embodiment. Unless the etching time is 10 sec or longer, it is hard to control the process disadvantageously from a viewpoint of a practical use. On the other hand, if the etching time is too long, for example, if etching is performed for 5 min or longer, a problem may occur such as a large side etched or a long tact. Therefore, it is preferable to determine the etching solution and the etching conditions appropriately by experiments. Next, if the metal layer A 1060 is made of chrome, an etching solution including potassium permanganate and metasilicate as main components is used for the etching in this embodiment.

Referring to FIG. 43, there is shown a process diagram of a third process covering a protective film formation of the electrical wiring in the condition shown in FIG. 42E to a solder ball joint process for an external connection following the second process shown in FIG. 42.

[Insulating photosensitive resin] (FIG. 43B): A protective film 1068 is formed on the entire surface of the silicon wiring substrate 1030 formed as shown in FIG. 42E. In this embodiment, an insulating photosensitive resin is used for a protective film 1068 and it is applied to the entire surface of the silicon wiring substrate 1030 by the spin coat method.

[Formation of connection terminal portion] (FIG. 43C): Subsequently, the photolithography technology is used (exposure, development) to form terminals 1065 for jointing the semiconductor chips 1001 and terminals 1066 for external connections. Regarding a protective film 1068 on the surface, not only organic materials, but inorganic materials can be used without any problem.

[Completion of silicon wiring substrate with stress compliant layer] (FIG. 43D): After that, a metal layer E 1069 is formed on the surfaces of the terminal portions 1064 and 1065 and it is considered to be surfaces of the terminal portions 1065 and 1066. The metal layer E 1069 is formed with gold electroless plating using gold causing a favorable wetting property between a solder material to be the external terminals and nickel. In case of a favorable wetting property between the solder and the nickel electroplating, the metal layer E 1069 can be omitted without any problem.

[Formation of external terminal portion] (FIG. 43E): Subsequently, solder balls 1070 are mounted with flux on the terminal portions 1065 and 1066 and then the solder balls 1070 are connected by heating to form projecting electrodes 1002 and external connection terminals 1005 (see FIG. 33).

Regarding a method of forming the projecting electrodes 1002 and the external connection terminals 1005, there is a method in addition to using the solder balls 1070 such that a solder paste is printed on the bump pads 1065 and 1066 or on the metal layer E 1069 on these by using a printing machine and then it is submitted to a reflow process to form the projecting electrodes 1002 and the external connection terminals 1005. In either method, the solder material can be selected out of various ones and, therefore, it is possible to use many of the solder materials on the market at present. In addition, there is a method of forming the solder bumps 1002 and the external connection terminals 1005 by using a plating technology though the solder material is limited. Furthermore, it is also possible to use bumps comprising balls with gold or copper as a core and bumps formed by a resin mixed with a conductive material. Regarding a material quality of the solder balls 1070, Sn and Cu are the main components and additives Bi and Ag are used as the third components.

As set forth hereinabove, the silicon wiring substrate 3 with the plurality of stress compliant layers 4 can be formed at a time through the first to third processes.

Figure 44A:
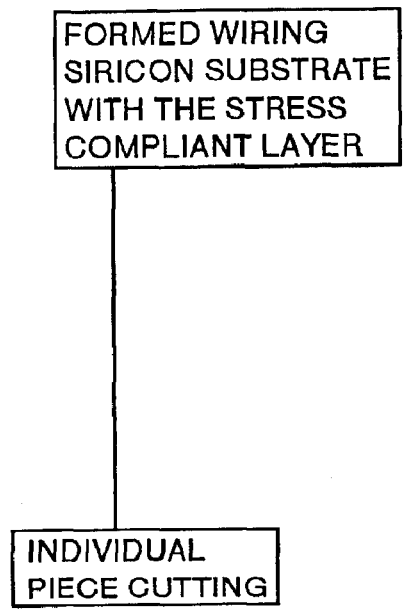
FIGS. 44A, 44B, 44C are perspective views showing a silicon wiring substrate with a stress compliant layer obtained by the third process shown in FIG. 43 and a silicon wiring substrate obtained by cutting it in units of a stress compliant layer.
Figure 44B:
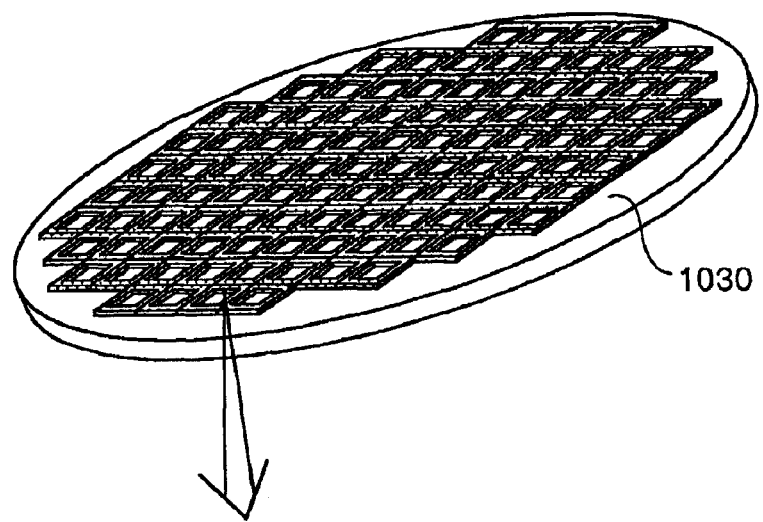
Figure 44C:
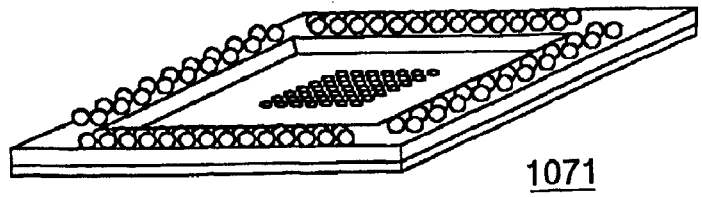

Referring to FIG. 44B, there is shown a perspective view of the silicon wiring substrate 1030 on which the plurality of stress compliant layers 1004 are formed obtained as described above. By separating the stress compliant layers 1004 from each other along the boundaries thereof, for example, by using a dicing technology, a silicon wiring substrate 1071 with an individual stress compliant layer is obtained as a complete mounting substrate 1071 as shown in FIG. 44C. A semiconductor device or a semiconductor module is completed by mounting and jointing a semiconductor chip 1001 in a predetermined position of the mounting substrate 1071.

By using this manufacturing method, the electrical wiring 1006 can be formed on the silicon wiring substrate 1003 at the minimum wire width/the minimum wire pitch 10 $\mu$m/10 $\mu$m. This enables one or two wiring layers of the substrate though conventionally a multi-layer wiring substrate is required, thereby facilitating the thickness reduction and downsizing of the semiconductor device or the semiconductor module.

Figure 45A:
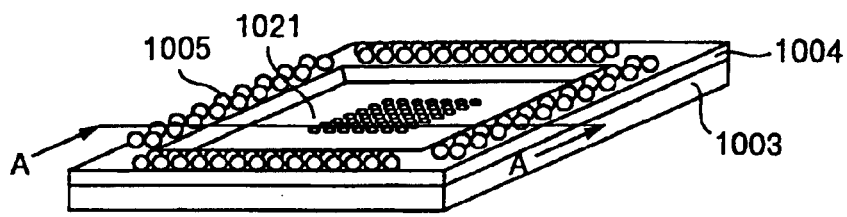
FIGS. 45A, 45B are a perspective view and a cross section showing a second embodiment of a semiconductor device and a semiconductor module according to the present invention.
Figure 45B:
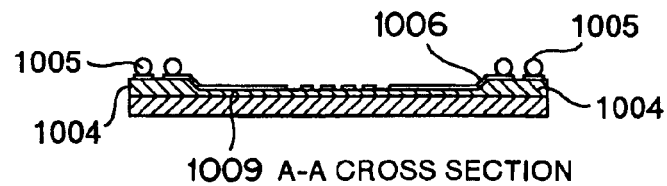

Referring to FIG. 45A, there is shown a perspective view schematically illustrating the entire configuration of the second embodiment of the semiconductor device and the semiconductor module according to the present invention. Referring to FIG. 45B, there is shown a cross section taken on division line A—A of FIG. 45A, in which reference numeral 1009 designates a low elastic modulus resin layer and elements corresponding to those in the above drawings are designated by the same reference numerals to omit duplicated descriptions.

In FIGS. 45A and 45B, this embodiment has a structure in which a low elastic modulus resin layer 1009 is formed on the entire surface of the inside area of the stress compliant layer 1004 on the silicon wiring substrate 1003. Electrical wiring 1006 is formed from an upper surface of the low elastic modulus resin layer 1009 to an upper surface of the stress compliant layer 1004.

Instead, the low elastic modulus resin layer 1009 can be formed only in an area where the projecting electrodes 1002 are arranged inside the stress compliant layer 1004 on the silicon wiring substrate 1003. In the second embodiment, in other words, the low elastic modulus resin layer 1009 is formed so as to include at least the area where the projecting electrodes 1002 are arranged inside the stress compliant layer 1004 on the silicon wiring substrate 1003.

Figure 46A:
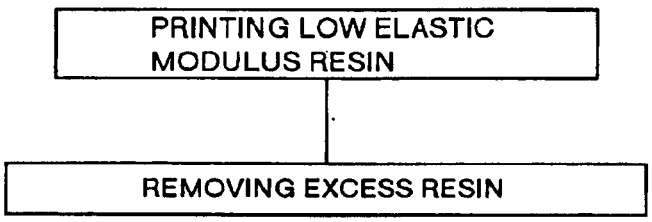
FIGS. 46A, 46B, 46C are perspective views showing a structure of the bottom tool for a stress compliant layer formation used for manufacturing the semiconductor device and the semiconductor module shown in FIG. 45.

The substrate in this embodiment can be manufactured in the same method as for the manufacturing method of the first embodiment. Note that, however, a structure of a mold to be used is different to some extent. It is described below by using FIG. 46.

Figure 46B:
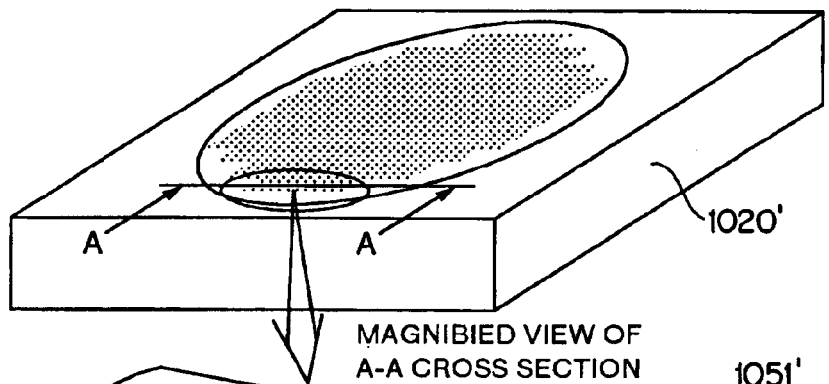
Figure 46C:
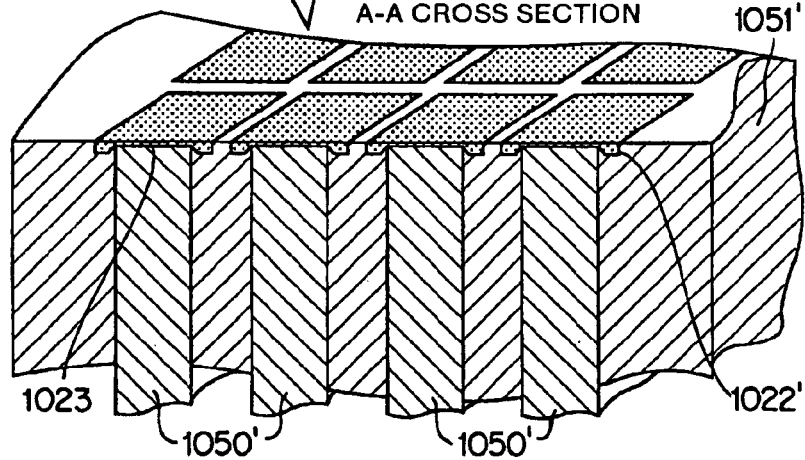

Referring to FIG. 46B, there is shown a perspective view schematically illustrating the entire stress compliant layer formation bottom tool 1020'. Referring to FIG. 46C, there is shown an enlarged partial cross section taken on division line A—A of FIG. 46B and a diagram corresponding to FIG. 35 in the first embodiment. In this diagram, a reference numeral 1023 designates a resin layer forming portion and elements corresponding to those in FIG. 35 and FIG. 39C are designated by the same reference numerals.

In FIGS. 46B, 46C, a plurality of frame-shaped stress compliant layer formation cavities 1022' are formed in a fixed portion 1051' of the stress compliant layer formation bottom tool 1020' in the same manner as for FIG. 35C and further a resin layer forming portion 1023 is formed over the area enclosed by the stress compliant layer formation cavities 1022'.

Regarding a method of forming the resin layer forming portion 1023, at a formation of a low elastic modulus resin layer 1009 or a stress compliant layer 1004, ejection pins 1050 are positioned to the fixed portion 1051' so that the upper surface of the ejection pins 1050' are depressed by a given distance from a surface including the upper surface of the fixed portion 1051' (in other words, by a distance almost equivalent to a thickness of the low elastic modulus resin layer in FIG. 45B).

By coating the stress compliant layer formation bottom tool 1020' with the low elastic modulus resin and removing excess resin with a squeegee as described above by using FIG. 34, the stress compliant layer formation cavities 1022' and the resin layer forming portion 1023 are filled with the low elastic modulus resin 1021 as shown in FIG. 46B and semiconductor devices and semiconductor modules each having a low elastic modulus resin layer 1009 as shown in FIG. 45 are obtained by the manufacturing process as shown in FIG. 34.

Furthermore, the stress compliant layer formation bottom tool 1020' can be configured such that the stress compliant layers can be released from the mold as shown in FIG. 39D.

According to this embodiment, the low elastic modulus resin layer is formed including the stress compliant layer 1004 on the entire surface of the silicon wiring substrate 1003, by which the resin layer has an effect of reducing a stress caused by a change of an environment for use. In this manner, the low elastic modulus resin layer 1009 on the entire surface absorbs a stress which may be caused by a difference in a linear expansion coefficient between the mounted components of the semiconductor chip 1001 and the wiring substrate 1003 and, therefore, organic or inorganic materials can be used for the base of the substrate as well as silicon materials, thus generating an effect of lowering the cost of the substrate. When there is provided a low elastic modulus resin layer 1009 only in an area for mounting a semiconductor chip, namely, an area in which the projecting electrodes 1002 are arranged, the same effect as for the above is achieved, too. In this case, in the stress compliant formation bottom tool 1020' shown in FIG. 46A, a depression is arranged in a part of the upper surface of the projecting pin 1050' as the resin layer forming portion 1023.

Figure 47A:
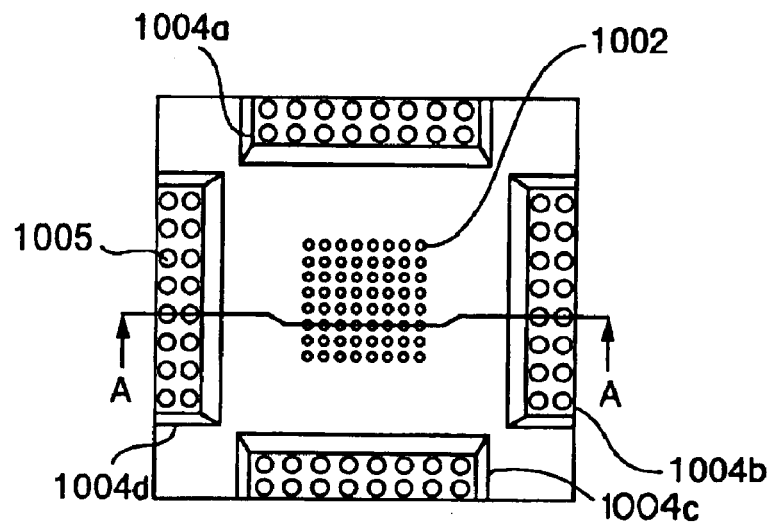
FIGS. 47A, 47B are a perspective view and a cross section showing a third embodiment of a semiconductor device and a semiconductor module according to the present invention.
Figure 47B:

Referring to FIG. 47A, there is shown a plan view illustrating the entire configuration of a third embodiment of a semiconductor device and a semiconductor module according to the present invention. Referring to FIG. 47B, there is shown a cross section taken on division line A—A of FIG. 47A. In these diagrams, reference numerals 1004a to 1004d designate stress compliant layers and elements corresponding to those in the above drawings are designated by the same reference numerals to omit duplicated descriptions.

While a single continuous stress compliant layer 1004 is arranged over the peripheral portion of the wiring substrate 1003 in the above embodiments, a plurality of stress compliant layers 1004a to 1004d are arranged over four separate peripheral portions of the wiring substrate 1003 in the third embodiment. In this embodiment, the stress compliant layers have the same length, respectively, and each is arranged on a different side of the rectangle wiring substrate 1003. It is also possible to arrange stress compliant layers having different lengths according to the length of the side or to arrange a different number of two or more stress compliant layers according to the length of the side. Therefore, if the wiring substrate 1003 is rectangular, the number of stress compliant layers or the length thereof in each side can be set according to the length of the side.

Also in the third embodiment, a low elastic modulus resin layer 1009 (FIG. 45) can be arranged in an area other than the stress compliant layer 1004a to 1004d (at least in an area enclosed by the stress compliant layers 1004a to 1004d ) on the wiring substrate 1003 in the same manner as for the second embodiment shown in FIG. 45.

Figure 48:
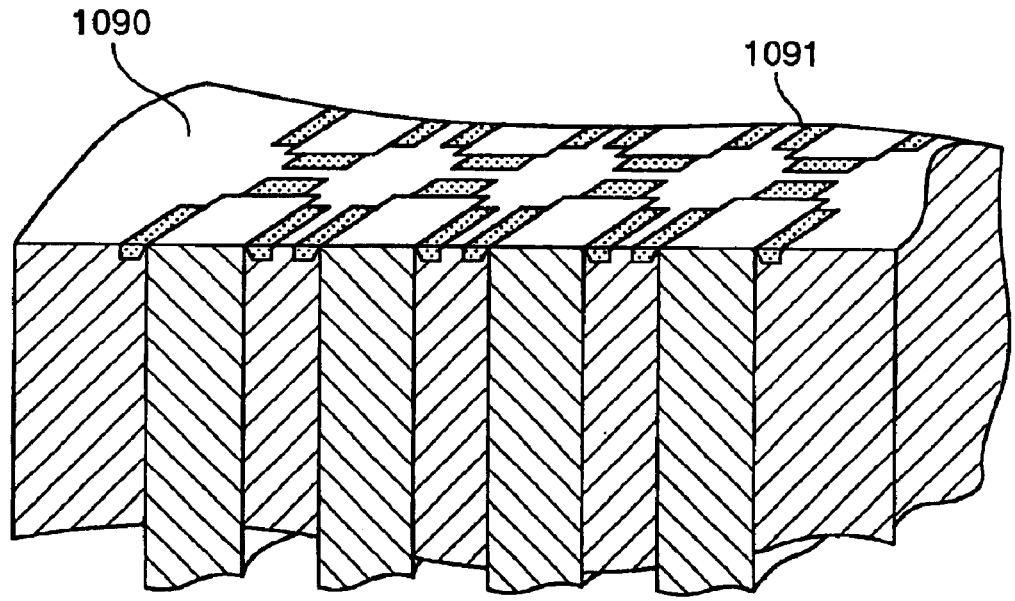
FIG. 48 is a perspective view showing a structure of the bottom tool for a stress compliant layer formation used for manufacturing the semiconductor device and the semiconductor module shown in FIG. 47.

Referring to FIG. 48, there is shown an enlarged partial cross section illustrating a stress compliant layer formation bottom tool 1090 used for manufacturing the embodiment of the semiconductor device and the semiconductor module shown in FIG. 47, in which the elements corresponding to those in the above drawings are designated by the same reference numerals.

In FIG. 48, a plurality of stress compliant layer formation cavities 1091 are arranged in closed paths in an arrangement corresponding to that of the stress compliant layers 1004a to 1004d shown in FIG. 47A in the fixed portion of the stress compliant layer formation bottom tool 1090 and other components are the same as those for the stress compliant formation bottom tool 1020 in the first embodiment shown in FIG. 35, and, therefore, the semiconductor device and the semiconductor module shown in FIG. 47 can be obtained by the manufacturing process shown in FIG. 34.

Furthermore, the stress compliant layer formation bottom tool 1090 can be configured such that the mold release is enabled as shown in FIG. 39D.

In addition in FIG. 47, as described above, if a low elastic modulus resin layer 1009 (FIG. 45) is arranged in an area other than the stress compliant layers 1004a to 1004d (in other words, at least an area enclosed by the stress compliant layers 1004a to 1004d) on the wiring substrate 1003, naturally a resin layer forming portion 1023 as shown in FIG. 46B is formed in the stress compliant layer formation bottom tool 1020" shown in FIG. 48 or a depression is arranged in a part of the upper surface of the ejection pin such as 1050 described above.

In the third embodiment having the above configuration, a plurality of stress compliant layers are arranged in the peripheral portion of the wiring substrate 1003 and, therefore, the stress compliant layer in the above embodiments is arranged in a divided configuration. As a result each stress compliant layer works independently, that is, each stress compliant layer is not restrained by other stress compliant layers in acting, thereby further improving the effect of a stress reduction.

In addition, also in the second and third embodiments, the mold is used to form the stress compliant layers and the effect on the stress compliant layers when using the mold is naturally the same as for the first embodiment.

Figure 49:
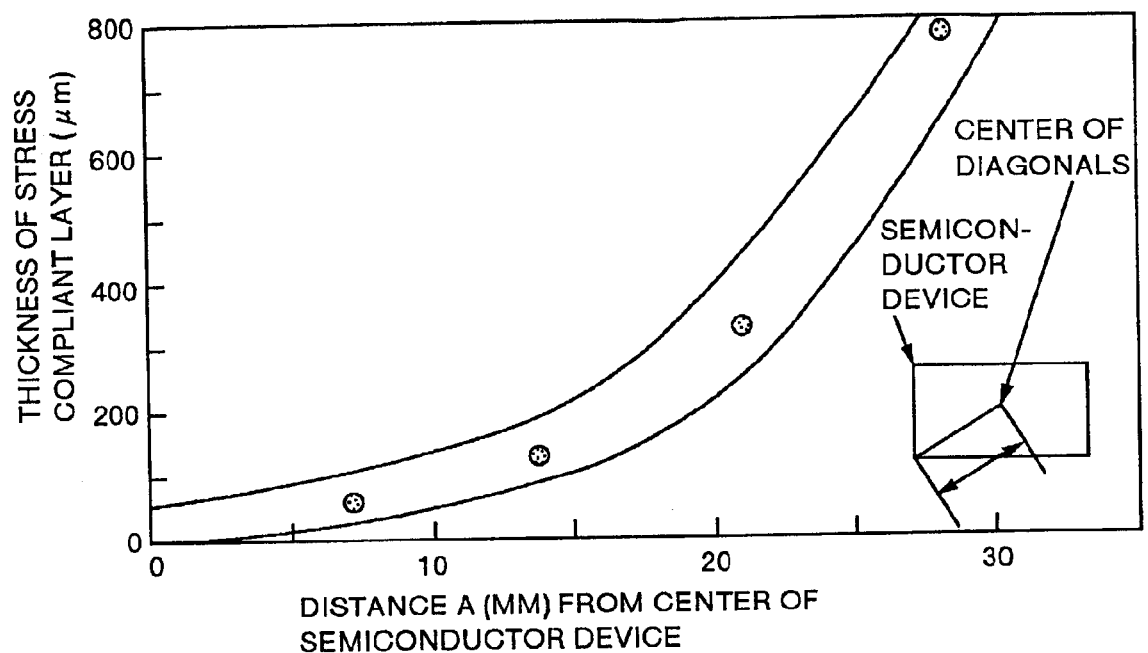
FIG. 49 is a diagram showing a thickness of a stress compliant layer required for securing connected portions when mounting a mother board for a semiconductor device or a semiconductor module where semiconductor chips are mounted on a wiring substrate.

Referring to FIG. 49, there is shown a diagram showing the thickness of the stress compliant layer required for securing a reliability of the connected portions at mounting a semiconductor device and a semiconductor module on a mother board regarding the semiconductor device and the semiconductor module according to each of the above embodiments in which a semiconductor chip 1001 is mounted on the wiring substrate 1003, where an abscissa axis indicates a distance from a central portion of the semiconductor device or the semiconductor module. Even if the stress compliant layer is thinner in the same semiconductor device or semiconductor module, the connection reliability can be secured when using a material having a Low elastic modulus, and therefore there is also shown an allowable range of the thickness considering the elastic modulus in FIG. 49.

As apparent from FIG. 49, the longer the distance from the central portion of the semiconductor device or the semiconductor module, the thicker the stress compliant layer need be to secure the connection reliability. For example, if the distance from the central portion of the semiconductor device or the semiconductor module is approx. 28 mm, the thickness of the stress compliant layer need be approx. 800 $\mu$m. If the thickness is smaller than this, the stress cannot be relaxed. If it is greater than this, the wiring substrate 1003 is warped, by which it may cause a damage of the base, a crack of the resin layer, or peeling off.

On the other hand, in case of a short distance from the central portion of the semiconductor device or the semiconductor module, for example, as small as around 2 mm, a heat stress generated between the semiconductor device or the semiconductor module and the mother board on which they are mounted can be logically relaxed by an insulating layer (not shown) of the wiring substrate 1003 even if there is no stress compliant layer. When the semiconductor device or the semiconductor module is mounted on the mother board, however, naturally there is another need for means of securing a height preventing the plurality of components mounted on the wiring substrate 3 from being in contact with the mother board. Therefore, if the distance from the central portion of the semiconductor device or the semiconductor module is 28 mm max., the stress compliant layer requires a thickness of approx. 800 $\mu$m max. from a viewpoint of the stress relaxation. In addition, the stress compliant layer has a trapezoidal shape and its cross section is trapezoidal, having a slant portion 1007 inclined to the wiring substrate 3, and a breakage of the electrical wire 1006 can be suppressed by optimizing the gradient of the inclination. An average gradient is preferably approx. 5 to 45% (tan θ=0.05 to 0.45, where θ is an angle of the inclination). If the gradient of the inclination is lower than 5%, the slant portion 1007 is too long to obtain a stress compliant layer having a desired film thickness. For example, if the average gradient is 3%, a horizontal distance need be longer than 3 mm to obtain a thickness of 100 $\mu$m and almost 7 mm is required including the edge portions on both sides, thereby disabling a desired film thickness to be obtained. On the other hand, if the gradient of the inclination is greater than 45%, it has no problem in a respect of the horizontal distance, but it has a sharp angle contrarily, thereby causing a high risk of disabling a sufficient exposure at a wiring formation. Particularly, there is no process margin in a formation of the plating resist or exposure and development processes, thereby requiring special skills or technologies. Furthermore, for a greater gradient of inclination, what is called a stress concentration effect acts and a stress is concentrated on the edge portion, thereby causing a tendency for the electrical wires 1006 to be broken in the edge portion and thus requiring a special design for the wiring structure in some cases.

As set forth in the above, it is necessary to increase the thickness of the stress compliant layer as the module size increases and the gradient of the slant portion 1007 of the stress compliant layer need be regulated to some extent.

As a method of forming the stress compliant layer, there can be a method of a formation by printing with a mask, a method of a formation by direct drawing with a dispenser, a method of a formation by a photolithography technology, and a method of a formation with a mold.

Since a formation of a thick stress compliant layer is required in this embodiment, only 50 to 80 $\mu$m or so can be laid in a single time even in thick printing in the printing method with a mask, and therefore it is hard to secure a thickness equal to or greater than 0.1 mm in a single-time printing and thus a predetermined thickness must be secured by repeating the printing several times. Therefore, the precision unevenness of a printing position or a shape of the slant portion 1007 of the stress compliant layer is uncertain, by which this method may easily cause a defect in forming the electrical wires 1006. Furthermore, the stress compliant layer after the printing is hardened every time and thus it is repeated, by which an operating time in the forming process is extended and then it may increase the cost.

In a formation using the direct drawing method, there is a risk of causing a problem of a long drawing time or of a difficulty in achieving an identical shape of the stress compliant layers. In a formation using the photolithography method, it is hard to make an exposure for a predetermined thickness at a time due to an exposure light source or the thick components to be exposed. Furthermore, it will be hard to form the slant portion 1007 at a given gradient.

On the other hand, in the method using the mold, the stress compliant formation cavities 1022 are formed by the cavity fabrication with a given thickness and a gradient of the inclination regulated, thereby causing an effect of achieving an identical shape. In addition, thick stress compliant layers can be formed in a single-time formation process, by which there is an effect of a cost reduction. Furthermore, the stress compliant layers are formed by using cavities, by which there is an effect that the configuration can be freely designed in respects of a thickness of the stress compliant layer or a gradient of the slant portion 1007.

Additionally, there is also an effect that smoothing fabricated surface of the cavity facilitates smoothing the surface of the stress compliant layer. This enables a reduction of defects which may occur at the electrical wiring formation in which the electrical wires 1006 are formed on the surface of the stress compliant layer. Therefore, it has an effect that a very reliable wiring substrate 1003 can be manufactured.

While the above embodiments have been set forth hereinabove by giving an example of a single semiconductor chip arranged on the wiring substrate 1003, apparently the same effects are achieved when a plurality of semiconductor chips are arranged on the substrate.

According to the present invention, it is possible to achieve a semiconductor module superior in the connection reliability with external substrate and having a high production efficiency.

What is claimed is:

1. A semiconductor module, comprising:
a wiring substrate on which wiring is formed;
a semiconductor device being both mounted on a principle side of said wiring substrate and electrically connected to said wiring via at least one bump, the entire said principle side of said wiring substrate being a common planar surface;
an external connection terminal electrically connected to said wiring, said external connection terminal arranged on a same side of said wiring substrate to which said semiconductor device is mounted; and
an insulating resin layer, said insulating resin layer having a thickness greater than said semiconductor device, provided between said wiring substrate and said external connection terminal and functioning to relax stress between said semiconductor module and a board to which the semiconductor module is mounted.

2. A semiconductor module according to claim 1, wherein a plurality of insulating resin layers are used instead of said insulating resin layer and arranged as if they enclose said semiconductor device.

3. A semiconductor module according to claim 1, wherein said wiring substrate is a silicon substrate or a glass substrate.

4. A semiconductor module according to claim 1, wherein said insulating resin layer is made of insulating material having an elastic modulus from within the range of approx. 0.1 Gpa to approx. 10 Gpa.

5. A semiconductor module according to claim 1, wherein a film thickness of said insulating resin layer is approx. 10 $\mu$m to approx. 350 $\mu$m.

6. A semiconductor module according to claim 1, wherein said semiconductor device is one of a semiconductor chip, a chip scale package (CSP), a ball grid array (BGA), and a wafer-level CSP.

7. A semiconductor module according to claim 1, wherein a sum of a thickness of said insulating resin layer and a height of said external connection terminal is greater than a distance from the mounted surface of said semiconductor device to a rear surface thereof.

8. A semiconductor module according to claim 1, wherein a sum of a thickness of said insulating resin layer and a height of said external connection terminal is substantially equal to a distance from the mounted surface of said semiconductor device to the rear surface thereof.

9. A semiconductor module according to claim 1, further comprising a metal member connecting said semiconductor device to a circuit board.

10. A semiconductor module, comprising:
a wiring substrate on which wiring is formed;
a semiconductor device being both mounted on a principle side of said wiring substrate and electrically connected to said wiring via at least one bump, the entire said principle side of said wiring substrate being a common planar surface;
an external connection terminal electrically connected to said wiring, said external connection terminal arranged on a same side of said wiring substrate to which said semiconductor device is mounted; and
an insulating resin layer formed on the same side of said wiring substrate to which said semiconductor device is mounted,
wherein said insulating resin layer has an inclined portion and a flat portion on which said external connection terminal is arranged, said insulating resin layer functioning to relax stress between said semiconductor module and a board to which said semiconductor module is mounted, and
wherein a part of said wiring electrically connected between a terminal on said semiconductor device and said external connection terminal is formed on said inclined portion of said insulating resin layer.

11. A semiconductor module according to claim 1 or claim 10, wherein said insulating resin layer has a shape defined by a printed pattern.

12. A semiconductor module according to claim 1 or claim 10, wherein said insulating resin layer substantially encloses said semiconductor device.

13. A semiconductor module according to claim 12, wherein said insulating resin layer is frame-shaped.

14. A semiconductor module according to claim 12, wherein an inclination of an inner circumferential side is relatively gradual to that of an outer circumferential side of said insulating resin layer.

15. A semiconductor module, comprising:
a wiring substrate on which wiring is formed;
a semiconductor device being both mounted on a principle side of said wiring substrate and electrically connected to said wiring via at least one bump, the entire said principle side of said wiring substrate being a common planar surface;
an insulating resin layer having a function of relaxing stress between said semiconductor module and a board to which said semiconductor module is mounted; and
an external connection terminal on said insulating resin layer and electrically connected to said wiring,
wherein said insulating resin layer is one of a plurality of said insulating resin layers that are collectively formed, with shapes defined by printed patterns of insulating material, on a same side of said wiring substrate to which said semiconductor device is mounted, said wiring substrate representing one component wiring substrate formed on a wafer board comprising a plurality of said wiring substrates.

16. A semiconductor module, comprising:
a wiring substrate on which wiring is formed;
a semiconductor device being both mounted on and electrically connected to said wiring on a principle side of said wiring substrate via at least one bump of said semiconductor device, the entire said principle side of said wiring substrate being a common planar surface;
an external connection terminal electrically connected to said wiring, said external connection terminal arranged on a same side of said wiring substrate to which said semiconductor device is mounted; and
an insulating resin layer formed on the same side of said wiring substrate on which said semiconductor device is mounted,
wherein said insulating resin layer has a function of relaxing stress between said semiconductor module and a board to which said semiconductor module is mounted, and
wherein said wiring substrate is a silicon substrate.

17. A semiconductor module, comprising:
a wiring substrate on which wiring is formed;
a semiconductor device being both mounted and electrically connected to the wiring on a principle side of said wiring substrate via at least one bump of said semiconductor device, the entire said principle side of said wiring substrate being a common planar surface;

an external connection terminal electrically connected to said wiring, said external connection terminal arranged on a same side of said wiring substrate to which said semiconductor device is mounted; and wherein said semiconductor device has an insulating resin layer having a function of relaxing stress between said semiconductor device and said wiring substrate to which said semiconductor device is mounted, said semiconductor device being mounted on said wiring substrate without using an underfill.

18. A semiconductor module according to claim 17, wherein said insulating resin layer is made of an insulating material having an elastic modulus from within the range of approx. 0.1 Gpa to approx. 10 Gpa.

19. A semiconductor module according to claim 17, wherein a film thickness of said insulating resin layer is approx. 10 μm to approx. 350 μm.

20. A semiconductor module according to claim 17, wherein said insulating resin layer has a shape defined by a printed pattern.

21. A semiconductor module according to claim 17, wherein said external connection terminal is formed on a second insulating resin layer, which is formed on said semiconductor device mounted side of said wiring substrate, having an inclined portion at a given inclination to the mounting surface and a substantially plane flat portion on which said external connection terminal is arranged.

22. A semiconductor module, comprising:

a wiring substrate on which wiring is formed;

a semiconductor device being both mounted and electrically connected to the wiring on a principle side of said wiring substrate via at least one bump of said semiconductor device, the entire said principle side of said wiring substrate being a common planar surface;

an external connection terminal electrically connected to said wiring, said external connection terminal arranged on a same side of said wiring substrate to which said semiconductor device is mounted;

a first insulating resin layer formed on the same side of said wiring substrate to which said semiconductor device is mounted, said first insulating resin layer having a function of relaxing stress between said semiconductor module and a board to which said semiconductor module is mounted; and wherein said semiconductor device has a second insulating resin layer having a function of relaxing the stress between said semiconductor device and said wiring substrate to which said semiconductor device is mounted, said semiconductor device being mounted on said wiring substrate without using an underfill.

23. A mounting structure comprising a semiconductor module, a heat conductive material and an external substrate to which said semiconductor module is mounted, wherein said semiconductor module includes:

a wiring substrate on which wiring is formed;

a semiconductor device mounted on a principle side of said wiring substrate and electrically connected to said wiring, said principle side having a planar surface over its entirety;

an external connection terminal electrically connected to said wiring, said external connection terminal arranged on a same side of said wiring substrate to which said semiconductor device is mounted; and an insulating resin layer, said insulating resin layer having a thickness greater than said semiconductor device, provided between said wiring substrate and said external connection terminal and functioning to relax stress between said semiconductor module and said external substrate to which the semiconductor module is mounted, and wherein said heat conductive material layer is formed on said external substrate to which said semiconductor module is mounted and said semiconductor device of said semiconductor module is connected to said heat conductive material layer.

24. A semiconductor module comprising;

a wiring substrate on which wiring is formed;

a semiconductor device mounted on a principle side of said wiring substrate and electrically connected to said wiring, the entire said principle side of said wiring substrate being a common planar surface;

an external connection terminal electrically connected to said wiring, said external connection terminal arranged on a same side of said wiring substrate to which said semiconductor device is mounted; and an insulating resin layer, said insulating resin layer having a thickness greater than said semiconductor device, provided between said wiring substrate and said external connection terminal and functioning to relax stress between said semiconductor module and a board to which the semiconductor module is mounted, wherein said semiconductor device is connected to said wiring substrate by die-attaching and said semiconductor device is electrically connected to the wiring formed on said wiring substrate by wire bonding.

25. A semiconductor module, comprises:

a wiring substrate on which wiring is formed;

a semiconductor device being both mounted on a principle side of said wiring substrate and electrically connected to the wiring formed on said wiring substrate via at least one bump of said semiconductor device, the entire said principle side of said wiring substrate being a common planar surface;

an insulating material covering said semiconductor device; and a wiring with an external electrode connected thereto for enabling electrical connection of the module to an outer circuit, wherein said wiring and said external electrode connected thereto are disposed on said insulating material.

26. A semiconductor module according to claim 25, wherein there is provided an intermediate plate in said insulating material between said semiconductor device and said external terminal.

27. A semiconductor module, comprising:

a wiring substrate on which wiring is formed;

a semiconductor device being both mounted on a principle side of said wiring substrate and electrically connected to said wiring via at least one bump of said semiconductor device, the entire said principle side of said wiring substrate being a common planar surface;

an insulating resin layer having a function of relaxing stress between said semiconductor module and a board to which said semiconductor module is mounted; and an external connection terminal on said insulating resin layer and electrically connected via said wiring to a terminal of said semiconductor device, wherein said insulating resin layer is one of a plurality of such insulating resin layers that are collectively molded on a wafer board comprising a plurality of said substrates, each said insulating resin layer has a thickness greater than said semiconductor device between said wiring substrate and said external connection terminal.

28. A semiconductor module according to claim 27, wherein each said insulating resin layer is formed on an outer peripheral portion of a separate said wiring substrate.

* * * * *